US012628493B2

(12) United States Patent
Kim et al.

(10) Patent No.: US 12,628,493 B2
(45) Date of Patent: May 12, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Seulong Kim, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1015 days.

(21) Appl. No.: 17/677,311

(22) Filed: Feb. 22, 2022

(65) Prior Publication Data

US 2022/0278294 A1 Sep. 1, 2022

(30) Foreign Application Priority Data

Feb. 23, 2021 (KR) ........................ 10-2021-0024363

(51) Int. Cl.
*H01L 51/50* (2006.01)
*H10K 50/11* (2023.01)
(Continued)

(52) U.S. Cl.
CPC ........... *H10K 50/11* (2023.02); *H10K 50/156* (2023.02); *H10K 50/165* (2023.02); *H10K 50/166* (2023.02); *H10K 59/12* (2023.02); *H10K 59/35* (2023.02); *H10K 59/8052* (2023.02); *H10K 85/654* (2023.02); *H10K 85/6572* (2023.02); *H10K 59/122* (2023.02); *H10K 2101/20* (2023.02); *H10K 2101/40* (2023.02)

(58) Field of Classification Search
None
See application file for complete search history.

(56) References Cited

U.S. PATENT DOCUMENTS 8,969,853 B2 3/2015 Dussert-Vidalet et al.
9,793,495 B2 10/2017 Kim et al.
(Continued)

FOREIGN PATENT DOCUMENTS

CN 103579522 A 2/2014
CN 104871332 A 8/2015
(Continued)

*Primary Examiner* — Gregory D Clark
(74) *Attorney, Agent, or Firm* — Lerner David LLP

(57) ABSTRACT

Provided are a light-emitting device and an electron apparatus including the same. The light-emitting device includes a first electrode, a second electrode facing the first electrode, and an interlayer disposed between the first electrode and the second electrode. The interlayer includes an emission layer and an electron transport region, the emission layer includes a host and a dopant, the electron transport region is disposed between the emission layer and the second electrode and includes a first electron transport layer and a second electron transport layer, the first electron transport layer includes a first electron-transporting material, a lowest excitation triplet ($T_1$) energy level of the first electron-transporting material is greater than a $T_1$ energy level of the dopant in the emission layer, and the second electron transport layer includes a second electron-transporting material and a metal dopant.

18 Claims, 5 Drawing Sheets

(51) Int. Cl.

| | |
|---|---|
| ***H10K 50/15*** | (2023.01) |
| ***H10K 50/16*** | (2023.01) |
| ***H10K 50/165*** | (2023.01) |
| ***H10K 59/12*** | (2023.01) |
| ***H10K 59/35*** | (2023.01) |
| ***H10K 59/80*** | (2023.01) |
| ***H10K 85/60*** | (2023.01) |
| *H10K 59/122* | (2023.01) |
| *H10K 101/20* | (2023.01) |
| *H10K 101/40* | (2023.01) |

(56) References Cited

U.S. PATENT DOCUMENTS

| | | | | |
|---|---|---|---|---|
| 2006/0124924 | A1* | 6/2006 | Suh | H10K 10/466 257/40 |
| 2010/0001301 | A1* | 1/2010 | Karg | H10K 50/86 257/40 |
| 2014/0027732 | A1 | 1/2014 | Pyo et al. | |
| 2016/0049593 | A1 | 2/2016 | Kim et al. | |
| 2016/0149157 | A1 | 5/2016 | Cho et al. | |
| 2016/0197289 | A1* | 7/2016 | Sado | C07D 401/14 257/40 |
| 2017/0033301 | A1 | 2/2017 | Han et al. | |
| 2017/0154931 | A1 | 6/2017 | Yoo et al. | |
| 2017/0186952 | A1 | 6/2017 | Han et al. | |
| 2018/0114940 | A1 | 4/2018 | Pavicic et al. | |
| 2018/0190922 | A1 | 7/2018 | Gölfert et al. | |
| 2020/0235343 | A1 | 7/2020 | Shin et al. | |

FOREIGN PATENT DOCUMENTS

| | | | |
|---|---|---|---|
| CN | 106816538 | A | 6/2017 |
| CN | 107851733 | A | 3/2018 |
| CN | 107978685 | A | 5/2018 |
| CN | 111477765 | A | 7/2020 |
| KR | 10-2011-0009080 | | 1/2011 |
| KR | 10-2014-0013513 | | 2/2014 |
| KR | 10-2016-0020655 | | 2/2016 |
| KR | 10-2016-0062307 | | 6/2016 |
| KR | 10-2018-0019225 | | 2/2018 |
| KR | 10-2018-0044823 | | 5/2018 |
| KR | 10-2018-0075128 | | 7/2018 |
| KR | 10-2020-0091979 | | 8/2020 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2021-0024363 under 35 U.S.C. § 119, filed on Feb. 23, 2021 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Organic light-emitting devices (OLEDs) are self-emissive devices that, as compared with devices of the related art, have wide viewing angles, high contrast ratios, short response times, and excellent characteristics in terms of luminance, driving voltage, response speed, and production of full-color images.

Organic light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Provided are a light-emitting device with low driving voltage and improved efficiency and lifespan characteristics and an electronic apparatus including the same.

Additional aspects will be set forth in part in the description, which follows and, in part, will be apparent from the description, or may be learned by practice of the embodiments of the disclosure.

A light-emitting device according to an embodiment may include a first electrode, a second electrode facing the first electrode, and an interlayer disposed between the first electrode and the second electrode. The interlayer may include an emission layer and an electron transport region, the emission layer may include a host and a dopant, the electron transport region may be disposed between the emission layer and the second electrode and may include a first electron transport layer and a second electron transport layer, the first electron transport layer may include a first electron-transporting material, a lowest excitation triplet ($T_1$) energy level of the first electron-transporting material may be greater than a $T_1$ energy level of the dopant of the emission layer, the second electron transport layer may include a second electron-transporting material and a metal dopant, an amount of the metal dopant in the second electron transport layer may be equal to or less than about 5 wt %, and an amount of silver (Ag) in the second electrode may be equal to or greater than about 90 wt %.

In an embodiment, the first electron transport layer may directly contact the emission layer.

In an embodiment, the second electron transport layer may directly contact the second electrode.

In an embodiment, the electron transport region may further include a hole blocking layer, an electron control layer, an electron injection layer, or any combination thereof.

In an embodiment, the dopant in the emission layer may include a phosphorescent dopant, a fluorescent dopant, a delayed fluorescence dopant, or any combination thereof.

In an embodiment, the light-emitting device may further include a hole transport region disposed between the first electrode and the emission layer, and the hole transport region may include a hole injection layer, a hole transport layer, an electron blocking layer, or any combination thereof.

In an embodiment, the first electron-transporting material may include a metal-free compound including at least one π electron-deficient nitrogen-containing ring.

In an embodiment, the first electron transport layer may not include a metal.

In an embodiment, the second electron-transporting material may include a phenanthroline-based compound, a phosphine oxide-based compound, or any combination thereof.

In an embodiment, the metal dopant may include an alkali metal, an alkaline earth metal, a rare earth metal, or any combination thereof.

In an embodiment, the second electrode may further include magnesium (Mg), and an amount of the magnesium may be equal to or less than about 10 wt %.

In an embodiment, the light-emitting device may further include a first capping layer disposed outside the first electrode, a second capping layer disposed outside the second electrode, or the first capping layer and the second capping layer.

In an embodiment, the light-emitting device may further include a first pixel, a second pixel, and a third pixel. The emission layer may include a first emission layer of the first pixel, a second emission layer of the second pixel, and a third emission layer of the third pixel. The first emission layer may include a first host and a first dopant, the second emission layer may include a second host and a second dopant, and the third emission layer may include a third host and a third dopant. The first dopant, the second dopant, and the third dopant may satisfy at least one of Inequalities 2-1 to 2-3:

$$T_1(ET1)>T_1(D1) \quad \text{[Inequality 2-1]}$$

$$T_1(ET1)>T_1(D2) \quad \text{[Inequality 2-2]}$$

$$T_1(ET1)>T_1(D3) \quad \text{[Inequality 2-3]}$$

In Inequalities 2-1 to 2-3, $T_1$(ET1) may be a $T_1$ energy level of the first electron-transporting material, $T_1$(D1) may be a $T_1$ energy level of the first dopant, $T_1$(D2) may be a $T_1$ energy level of the second dopant, and $T_1$(D3) may be a $T_1$ energy level of the third dopant.

In an embodiment, the first emission layer may emit red light having a maximum emission wavelength in a range of about 580 nm to about 750 nm, the second emission layer may emit green light having a maximum emission wavelength in a range of about 490 nm to about 580 nm, and the third emission layer may emit blue light having a maximum emission wavelength in a range of about 410 nm to about 490 nm.

In an embodiment, a thickness of the first emission layer, a thickness of the second emission layer, and a thickness of the third emission layer may be different from one another.

In an embodiment, the light-emitting device may further include a hole transport region disposed between the first electrode and the emission layer. The hole transport region may include a first hole transport layer of the first pixel, a second hole transport layer of the second pixel, and a third hole transport layer of the third pixel. A thickness of the first hole transport layer, a thickness of the second hole transport layer, and a thickness of the third hole transport layer may be different from one another.

According to another aspect, provided is an electronic apparatus which may include the light-emitting device.

In an embodiment, the electronic apparatus may further include a thin-film transistor. The thin-film transistor may include a source electrode and a drain electrode, and the first electrode of the light-emitting device may be electrically connected to the source electrode or the drain electrode.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
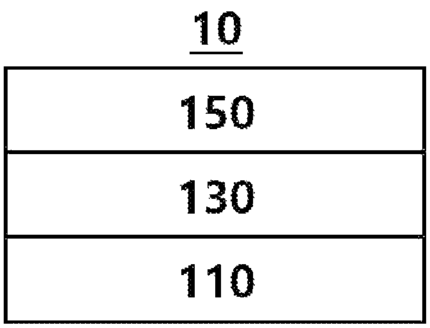
FIG. 1 is a schematic cross-sectional view of a structure of a light-emitting device according to an embodiment.
Figure 2:
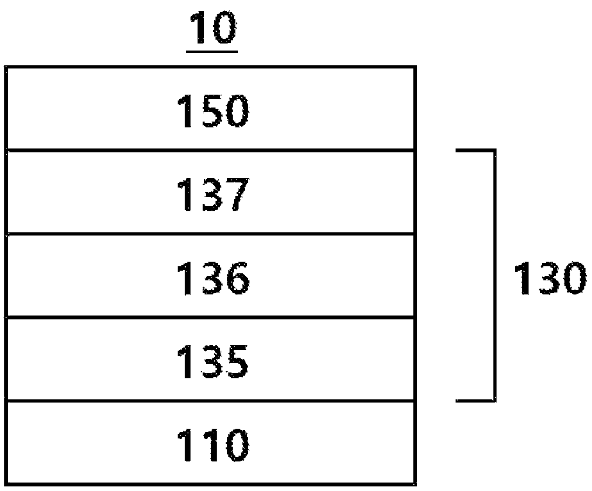
FIG. 2 is a schematic cross-sectional view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an embodiment may be implemented in another manner, a process order may be performed differently from the described order. For example, two consecutively described processes may be performed substantially at the same time or performed in an order opposite to the described order.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

The term "interlayer" as used herein may refer to a single layer and/or all layers between a first electrode and a second electrode of a light-emitting device.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A light-emitting device according to an aspect may include a first electrode, a second electrode facing the first electrode, and an interlayer disposed between the first electrode and the second electrode, wherein the interlayer may include an emission layer and an electron transport region.

The emission layer may include a host and a dopant.

The electron transport region may be disposed between the emission layer and the second electrode and may include a first electron transport layer and a second electron transport layer.

The first electron transport layer may include a first electron-transporting material, and a lowest excitation triplet ($T_1$) energy level of the first electron-transporting material may be greater than a $T_1$ energy level of the dopant of the emission layer.

The second electron transport layer may include a second electron-transporting material and a metal dopant, and an amount of the metal dopant in the second electron transport layer may be equal to or less than about 5 wt %.

In an embodiment, an amount of the metal dopant in the second electron transport layer may be in a range of about 0 wt % to about 5 wt %.

An amount of silver (Ag) in the second electrode may be equal to or greater than about 90 wt %.

In an embodiment, an amount of silver (Ag) in the second electrode may be in a range of about 90 wt % to about 100 wt %.

In the specification, the term "$T_1$ energy" of a compound refers to a lowest excitation triplet energy of the compound. In an embodiment, $T_1$ energy may be calculated through a simulation result by using a density-functional theory (DFT) method of a Gaussian program (structure optimization using B3LYP, 6-31G*).

Because the light-emitting device includes the first electron transport layer and the second electron transport layer, a driving voltage may decrease, and efficiency and lifespan characteristics may be improved.

In an embodiment, because the first electron transport layer includes the first electron-transporting material having a greater $T_1$ energy level than that of the dopant in the emission layer, excitons in the emission layer may be efficiently confined, and thus efficiency of the light-emitting device may be improved. In an embodiment, because the second electron transport layer includes the second electron-transporting material and the metal dopant, electron injection and/or transport from the second electrode may smoothly occur.

In an embodiment, the first electron transport layer may directly contact the emission layer.

The first electron transport layer is located between the emission layer and the second electron transport layer and thus may be a buffer layer between the emission layer and the metal dopant-doped second electron transport layer, and thus reduction in efficiency or deterioration of the light-emitting device due to metal migration may be prevented.

In an embodiment, the second electron transport layer may directly contact the second electrode.

Because the second electron transport layer is located between the first electron transport layer and the second electrode, deterioration of stability due to an agglomeration phenomenon may be prevented.

In an embodiment, the electron transport region may further include a hole blocking layer, an electron control layer, an electron injection layer, or any combination thereof.

In an embodiment, the electron transport region may consist of the first electron transport layer and the second electron transport layer, and the first electron transport layer may directly contact the second electron transport layer.

In an embodiment, the light-emitting device may include a structure in which the first electron transport layer, the second electron transport layer, and the second electrode are sequentially stacked on the emission layer.

In an embodiment, the dopant in the emission layer may include a phosphorescent dopant, a fluorescent dopant, a delayed fluorescence dopant, and any combination thereof.

In an embodiment, the light-emitting device may further include a hole transport region disposed between the first electrode and the emission layer, and the hole transport region may include a hole injection layer, a hole transport layer, an electron blocking layer, or any combination thereof.

In an embodiment, the first electron-transporting material may include a metal-free compound including at least one π electron-deficient nitrogen-containing ring.

In an embodiment, the first electron-transporting material may include an electron-transporting compound. In an embodiment, the first electron-transporting material may include a compound represented by Formula 601, which will be described below. In an embodiment, the first electron-transporting material may include a compound represented by Formula 601-1, which will be described below. In an embodiment, the first electron-transporting material may include at least one of Compounds ET1 to ET47, which will be described below.

In an embodiment, the first electron transport layer may not include a metal.

In an embodiment, the second electron-transporting material may include a phenanthroline-based compound, a phosphine oxide-based compound, or any combination thereof.

In an embodiment, the second electron-transporting material may include a compound represented by Formula 1, a compound represented by Formula 2, or any combination thereof:

[Formula 1]

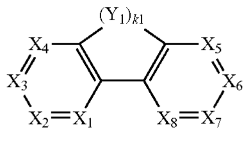

-continued

[Formula 2]

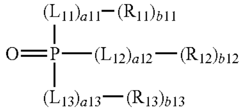

In Formulae 1 and 2, $Y_1$ may be *—O—*', *—S—*', *—N[$(L_9)_{a9}$-$(R_9)_{b9}$]—*', *—C[$(L_9)_{a9}$-$(R_9)_{b9}$][$(L_{10})_{a10}$-$(R_{10})_{b10}$]—*', *—C[$(L_9)_{a9}$-$(R_9)_{b9}$]=C[$(L_{10})_{a10}$-$(R_{10})_{b10}$]—*', *—C[$(L_9)_{a9}$-$(R_9)_{b9}$]=N—*', or *—N=C[$(L_{10})_{a10}$-$(R_{10})_{b10}$]—*', k1 may be 0, 1, or 2, when k1 is 0, $Y_1$ may not be present, $X_1$ may be N or C[$(L_1)_{a1}$-$(R_1)_{b1}$], $X_2$ may be N or C[$(L_2)_{a2}$-$(R_2)_{b2}$], $X_3$ may be N or C[$(L_3)_{a3}$-$(R_3)_{b3}$], $X_4$ may be N or C[$(L_4)_{a4}$-$(R_4)_{b4}$], $X_5$ may be N or C[$(L_5)_{a5}$-$(R_5)_{b5}$], $X_6$ may be N or C[$(L_6)_{a6}$-$(R_6)_{b6}$], $X_7$ may be N or C[$(L_7)_{a7}$-$(R_7)_{b7}$], $X_8$ may be N or C[$(L_8)_{a8}$-$(R_8)_{b8}$], $L_1$ to $L_{13}$ may each independently be a single bond, a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_2$-$C_{20}$ alkynylene group unsubstituted or substituted with at least one $R_{10a}$, a $C_3$-$C_{10}$ cycloalkylene group unsubstituted or substituted with at least one $R_{10a}$, a $C_1$-$C_{10}$ heterocycloalkylene group unsubstituted or substituted with at least one $R_{10a}$, a $C_3$-$C_{10}$ cycloalkenylene group unsubstituted or substituted with at least one $R_{10a}$, a $C_1$-$C_{10}$ heterocycloalkenylene group unsubstituted or substituted with at least one $R_{10a}$, a $C_6$-$C_{60}$ arylene group unsubstituted or substituted with at least one $R_{10a}$, a $C_1$-$C_{60}$ heteroarylene group unsubstituted or substituted with at least one $R_{10a}$, a divalent non-aromatic condensed polycyclic group unsubstituted or substituted with at least one $R_{10a}$, or a divalent non-aromatic condensed heteropolycyclic group unsubstituted or substituted with at least one $R_{10a}$, a1 to a13 may each independently be 0, 1, 2, 3, 4, or 5, $R_1$ to $R_{13}$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), b1 to b13 may each independently be 1, 2, 3, 4, 5, 6, 7, or 8, and *' each indicate a binding site to a neighboring atom, and $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formulae 1 and 2, at least one of $X_1$ to $X_8$ may be N, or at least one of $L_1$ to $L_{13}$ and $R_1$ to $R_{13}$ may include a π electron-deficient nitrogen-containing ring.

In an embodiment, in Formulae 1 and 2, $L_1$ to $L_{13}$ may each independently be: a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-fluorene-benzofluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, a ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzoisothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a benzocarbazolylene group, a dibenzocarbazolylene group, a thiadiazolylene group, an imidazopyridinylene group, or an imidazopyrimidinylene group; or a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-fluorene-benzofluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, a benzoisothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a benzocarbazolylene group, a dibenzocarbazolylene group, a thiadiazolylene group, an imidazopyridinylene group, or an imidazopyrimidinylene group, each substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzomidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolylene group, a benzocarbazolyl group, a dibenzocarbazolyl group, a thiadiazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof, wherein $Q_{31}$ to $Q_{33}$ may each independently be a $C_1$-$C_{10}$ alkyl group, a $C_1$-$C_{10}$ alkoxy group, a phenyl group, a phenyl group substituted with a $C_1$-$C_{10}$ alkyl group, a biphenyl group, a terphenyl group, a naphthyl group, a pyridinyl group, a pyrimidyl group, a triazinyl group, a quinolinyl group, or an isoquinolinyl group.

In an embodiment, $L_1$ to $L_{13}$ may each independently be a group represented by any one of Formulae 3-1 to 3-26:

3-1

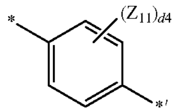

3-2

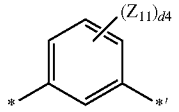

3-3

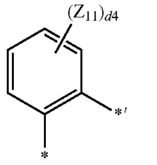

3-4

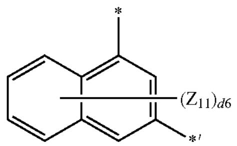

3-5

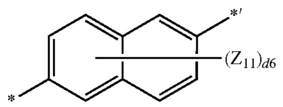

3-6

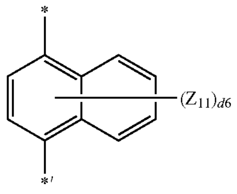

-continued
3-7
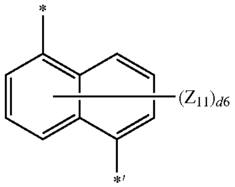
3-8
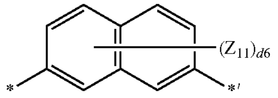
3-9
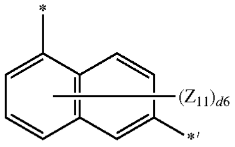
3-10
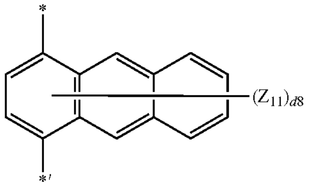
3-11
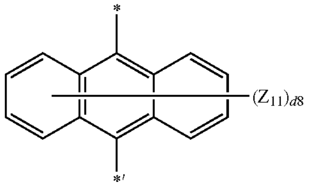
3-12
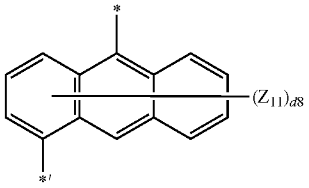
3-13
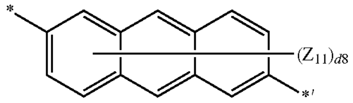
3-14
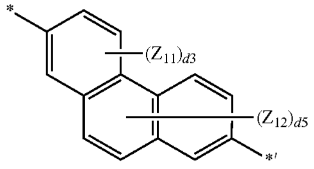
3-15
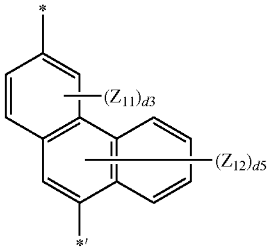
-continued
3-16
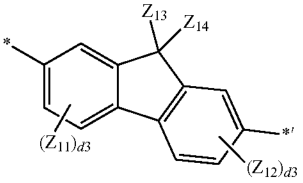
3-17
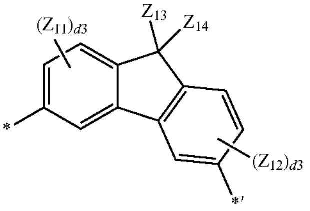
3-18
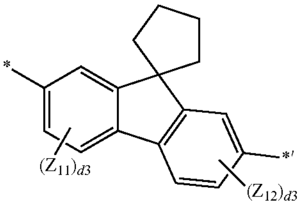
3-19
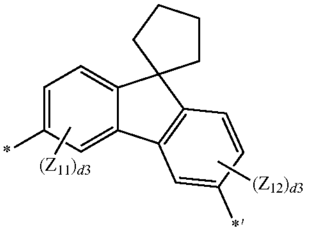
3-20
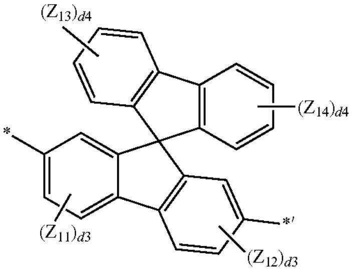
3-21
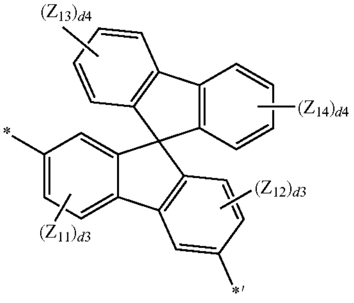

-continued 3-22

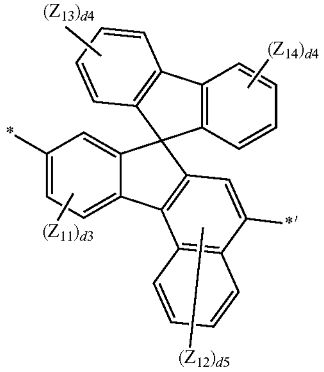

3-23

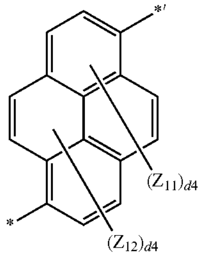

3-24

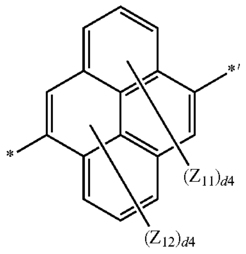

3-25

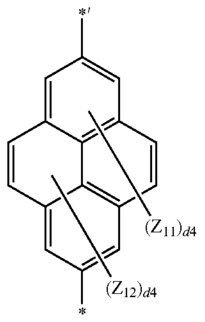

3-26

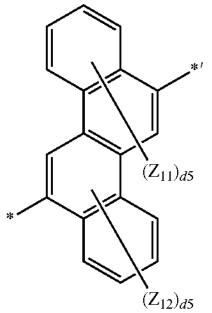

In Formulae 3-1 to 3-26, $Z_{11}$ to $Z_{14}$ may each independently be hydrogen, deuterium, —F, —Cl, —Br, —I, a hydroxyl group, a cyano group, a nitro group, an amino group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a dibenzofuranyl group, a dibenzothiophenyl group, a triazinyl group, a benzimidazolyl group, a phenanthrolinyl group, or —Si($Q_{31}$)($Q_{32}$)($Q_{33}$), $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, d3 may be an integer from 0 to 3, d4 may be an integer from 0 to 4, d5 may be an integer from 0 to 5, d6 may be an integer from 0 to 6, d8 may be an integer from 0 to 8, and and *' each indicate a binding site to a neighboring atom.

In an embodiment, in Formulae 1 and 2, a1 to a13 may each independently be 0, 1, or 2.

In an embodiment, a1 to a13 may each independently be 0 or 1.

In an embodiment, in Formulae 1 and 2, $R_1$ to $R_{13}$ may each independently be:

hydrogen, deuterium, —F —Cl, —Br, —I, a hydroxyl group, or a cyano group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each substituted with deuterium, —F, —Cl, —Br, —I, a hydroxyl group, a cyano group, a nitro group, an amidino group, a hydrazino group, a hydrazono group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a pentalenyl group, an indenyl group, a naphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a pyrrolyl group, a furanyl group, a thiophenyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a benzomidazolyl group, a benzofuranyl group, a benzothiophenyl group, a benzothiazolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a pentalenyl group, an indenyl group, a naphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a pyrrolyl group, a furanyl group, a thiophenyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a benzomidazolyl group, a benzofuranyl group, a benzothiophenyl group, a benzothiazolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a pentalenyl group, an indenyl group, a naphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a pyrrolyl group, a furanyl group, a thiophenyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a benzomidazolyl group, a benzofuranyl group, a benzothiophenyl group, a benzothiazolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, wherein $Q_{31}$ to $Q_{33}$ may each independently be hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, a biphenyl group, or a terphenyl group.

In an embodiment, $R_1$ to $R_{13}$ may each independently be: hydrogen, deuterium, —F —Cl, —Br, —I, a hydroxyl group, or a cyano group; a $C_1$-$C_{20}$ alkyl group or a $C_1$-$C_{20}$ alkoxy group, each substituted with deuterium, —F, —Cl, —Br, —I, a cyano group, a phenyl group, a biphenyl group, or any combination thereof; or a group represented by any one selected from Formulae 5-1 to 5-26 and Formulae 6-1 to 6-55:

5-1

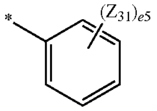

5-2

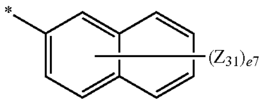

5-3

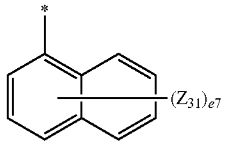

5-4

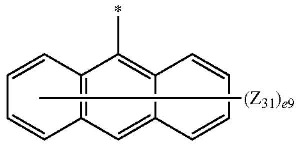

5-5

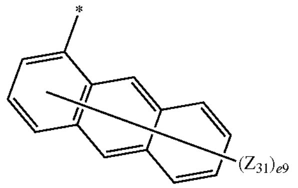

5-6

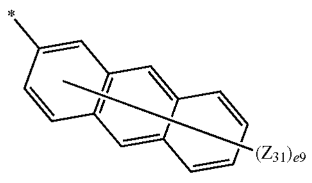

-continued
5-7
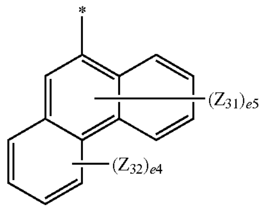
5-8
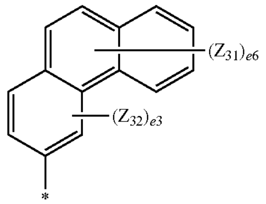
5-9
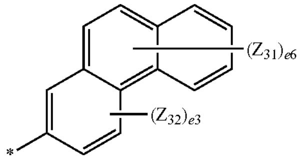
5-10
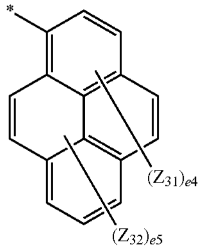
5-11
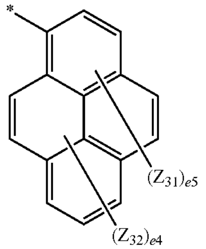
5-12
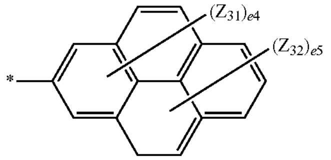
5-13
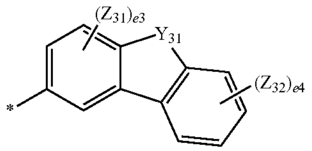
5-14
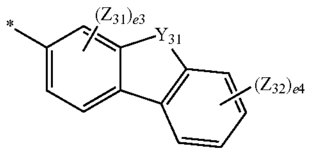
-continued
5-15
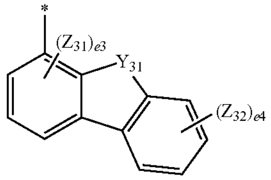
5-16
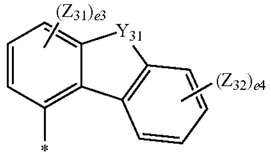
5-17
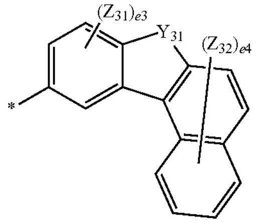
5-18
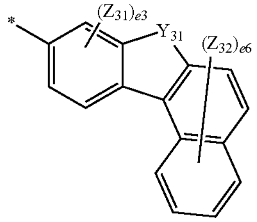
5-19
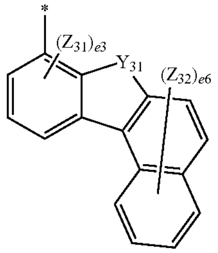
5-20
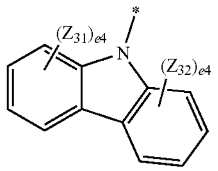
5-21
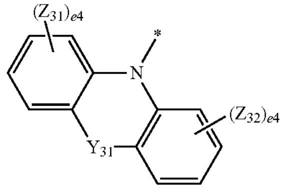

-continued
5-22
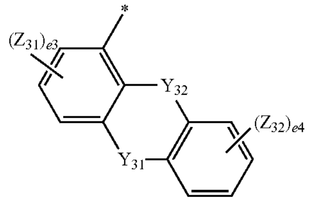
5-23
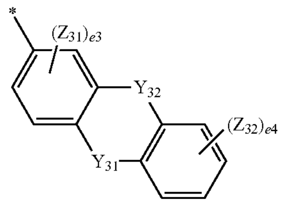
5-24
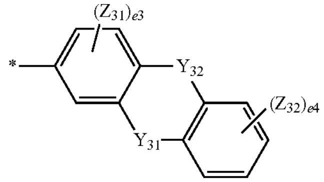
5-25
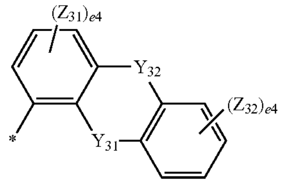
5-26
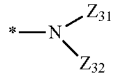
6-1
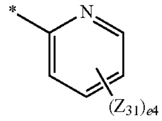
6-2
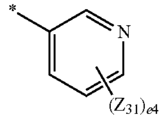
6-3
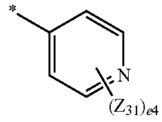
6-4
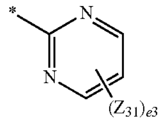
6-5
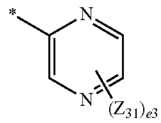
-continued
6-6
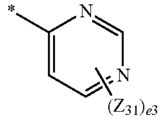
6-7
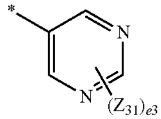
6-8
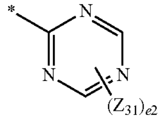
6-9
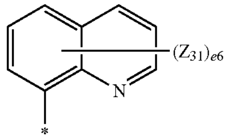
6-10
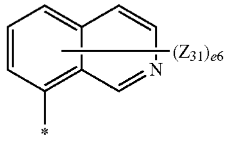
6-11
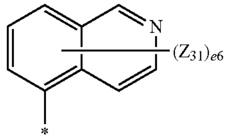
6-12
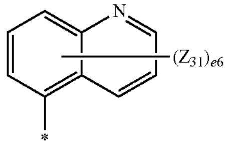
6-13
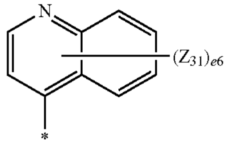
6-14
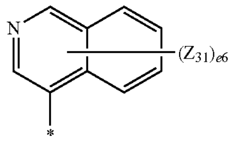
6-15
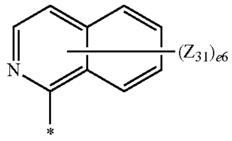
6-16
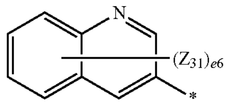

-continued
6-17
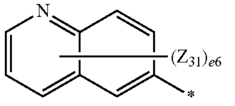
6-18
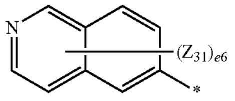
6-19
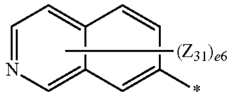
6-20
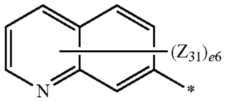
6-21
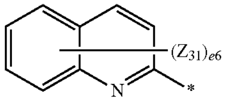
6-22
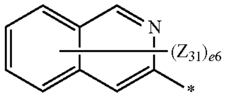
6-23
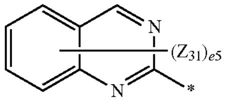
6-24
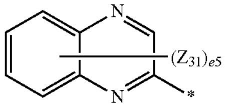
6-25
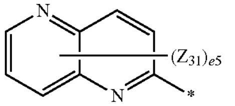
6-26
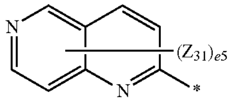
6-27
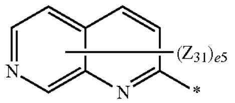
6-28
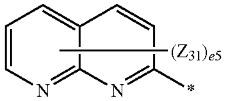
6-29
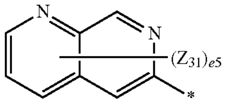
6-30
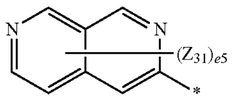
-continued
6-31
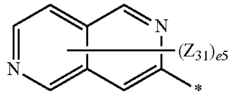
6-32
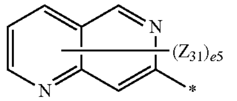
6-33
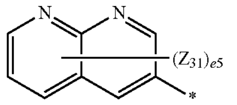
6-34
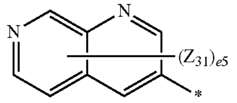
6-35
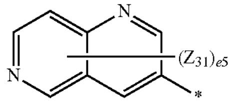
6-36
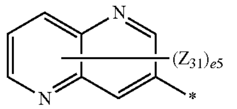
6-37
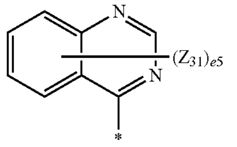
6-38
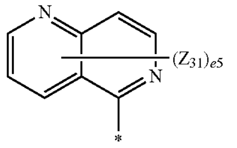
6-39
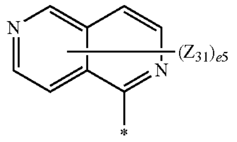
6-40
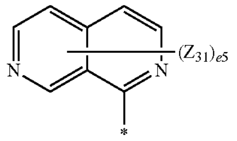
6-41
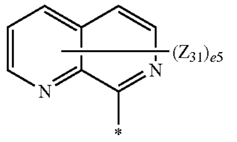
6-42
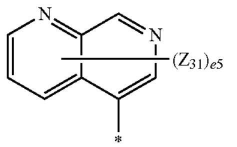

-continued 6-43

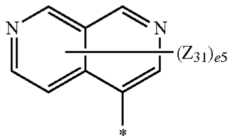

6-44

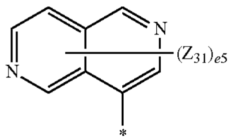

6-45

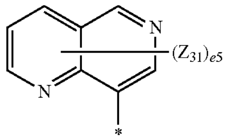

6-46

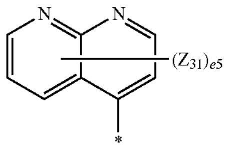

6-47

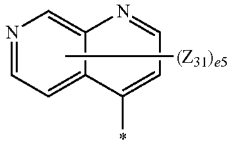

6-48

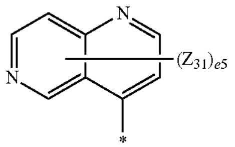

6-49

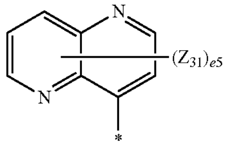

6-50

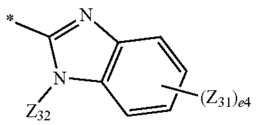

6-51

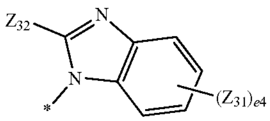

6-52

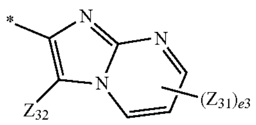

6-53

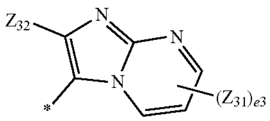

-continued 6-54

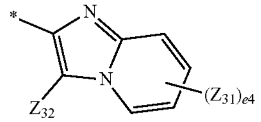

6-55

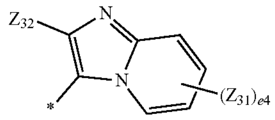

In Formulae 5-1 to 5-26 and 6-1 to 6-55, $Y_{31}$ and $Y_{32}$ may each independently be O, S, $C(Z_{33})(Z_{34})$, $N(Z_{33})$, or $Si(Z_{33})(Z_{34})$, $Z_{31}$ to $Z_{34}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a biphenyl group, a terphenyl group, a naphthyl group, a fluorenyl group, a spiro-bifluorenyl group, a phenanthrenyl group, an anthracenyl group, a triphenylenyl group, a pyridinyl group, a pyrimidinyl group, a carbazolyl group, or a triazinyl group, e2 may be 1 or 2, e3 may be an integer from 1 to 3, e4 may be an integer from 1 to 4, e5 may be an integer from 1 to 5, e6 may be an integer from 1 to 6, e7 may be an integer from 1 to 7, e9 may be an integer from 1 to 9, and indicates a binding site to a neighboring atom.

In an embodiment, in Formulae 1 and 2, b1 to b13 may each independently be 1, 2, 3, 4, 5, or 6.

In an embodiment, b1 to b13 may each independently be 1, 2, 3, or 4.

In an embodiment, b1 to b13 may each independently be 1 or 2.

In an embodiment, the second electron-transporting material may include at least one of Compounds 1 to 97:

1

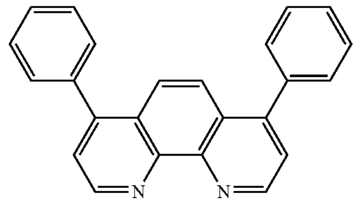

2

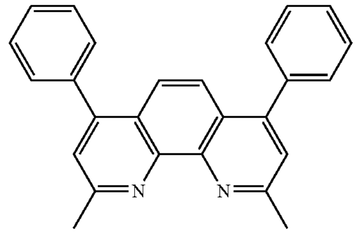

-continued
3
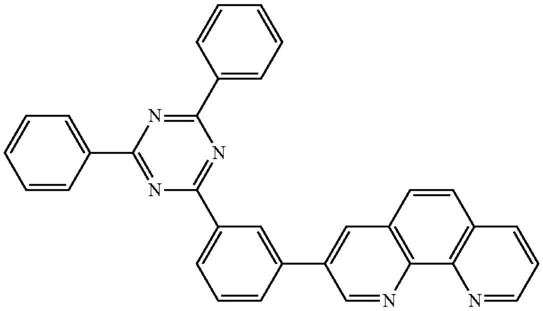
4
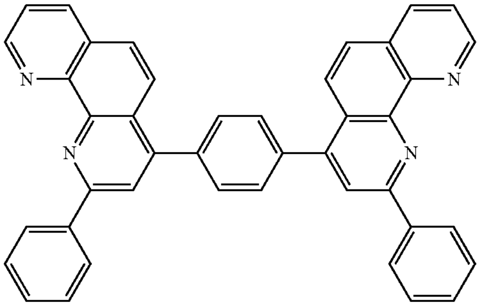
5
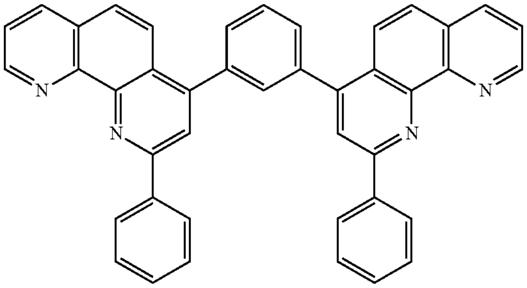
6
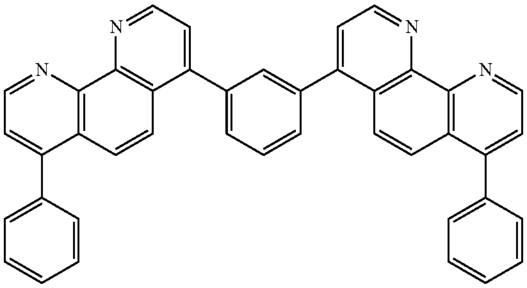
7
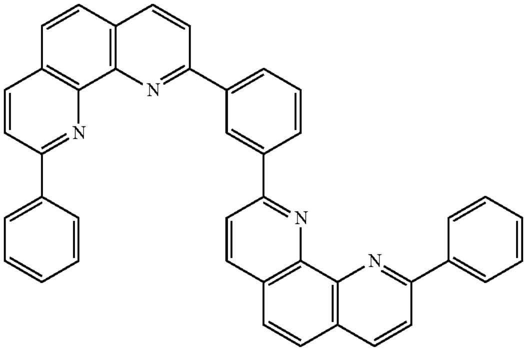
-continued
8
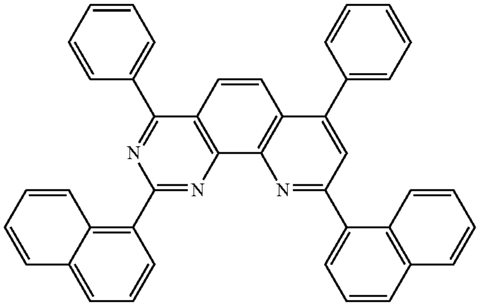
9
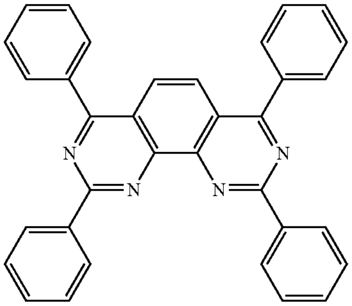
10
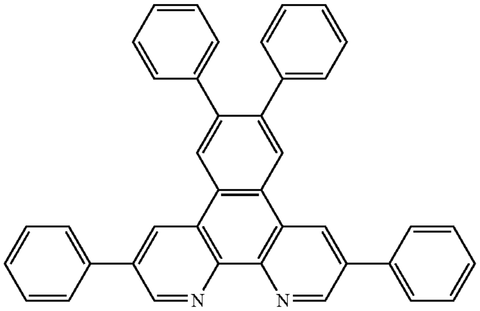
11
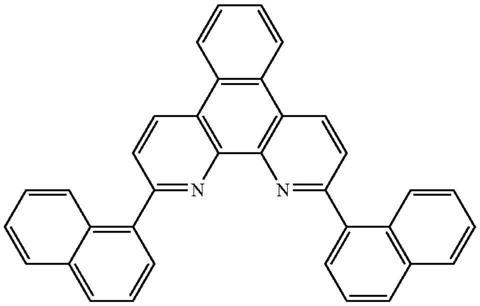
12
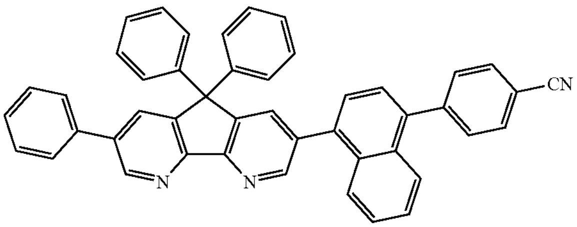

-continued
13
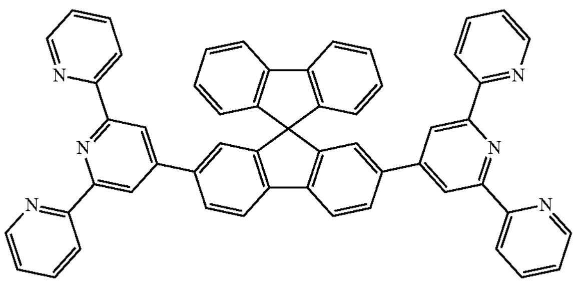
14
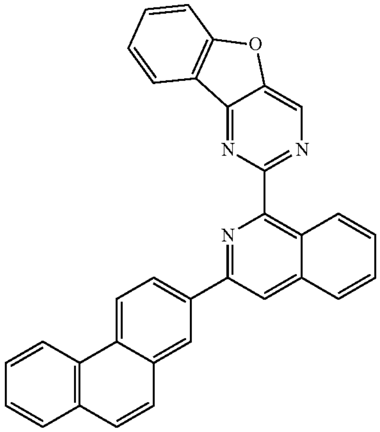
15
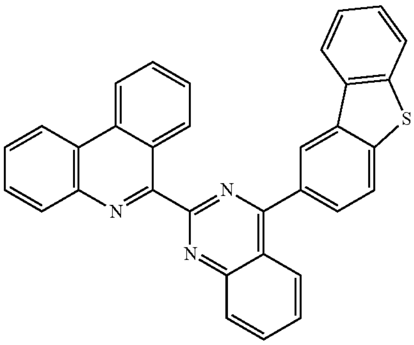
16
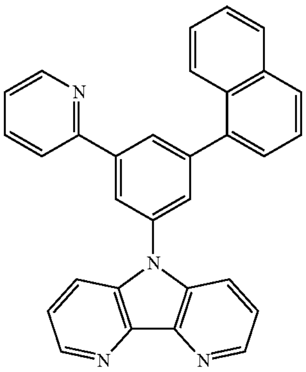
-continued
17
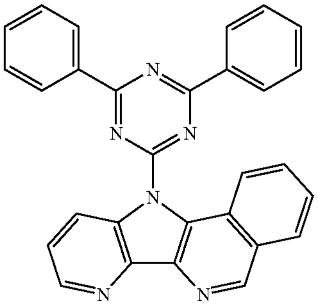
18
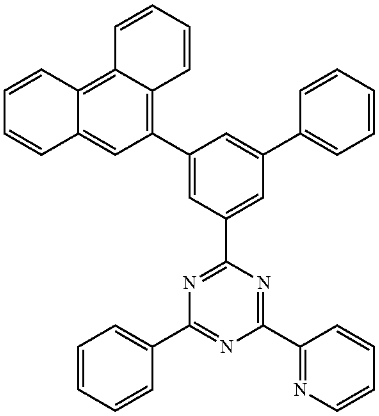
19
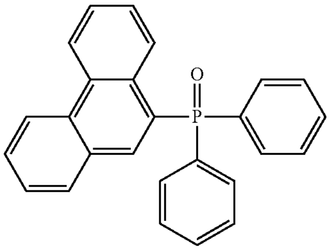
20
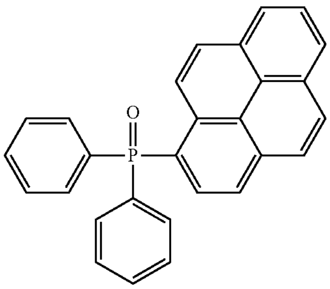
21
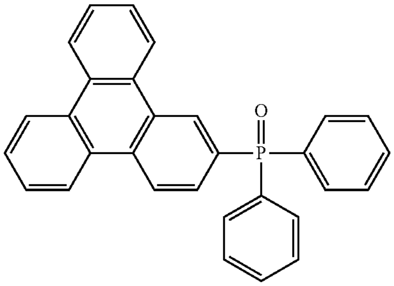

-continued
22
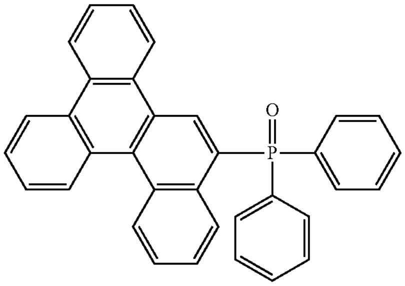
23
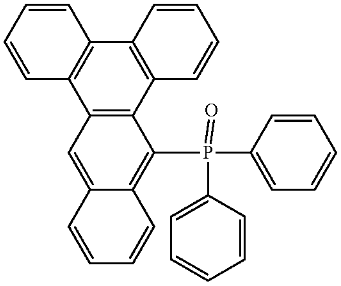
24
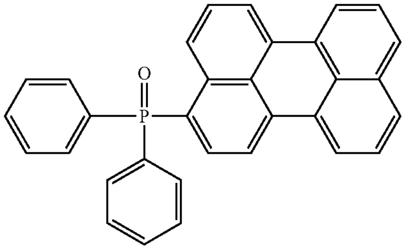
25
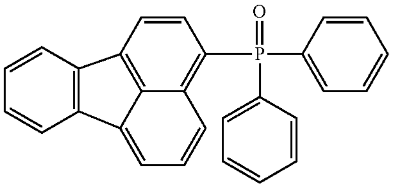
26
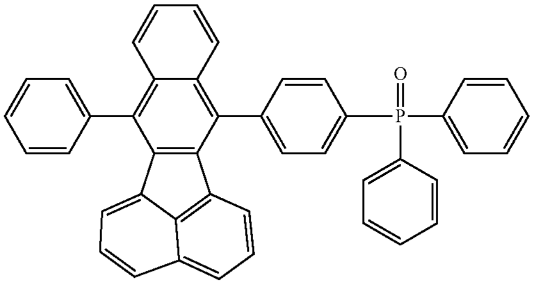
27
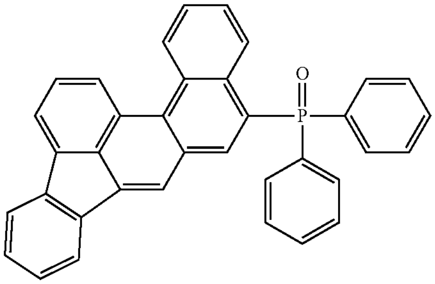
-continued
28
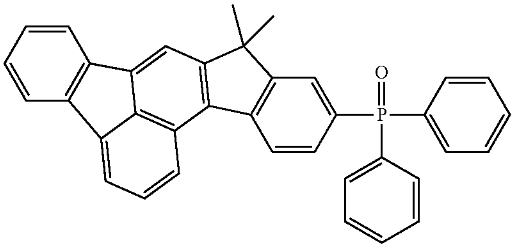
29
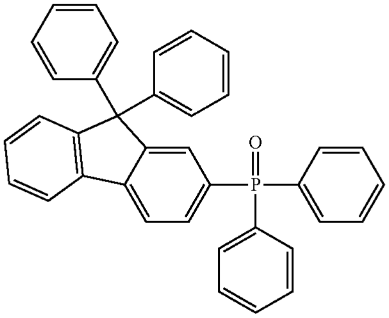
30
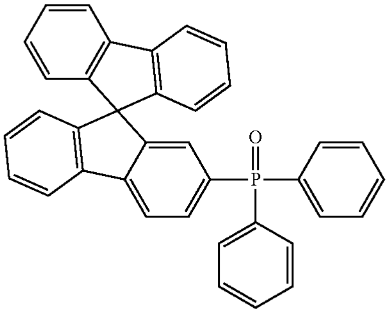
31
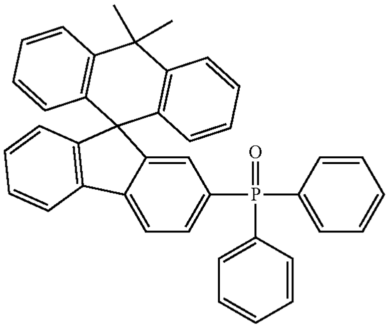
32
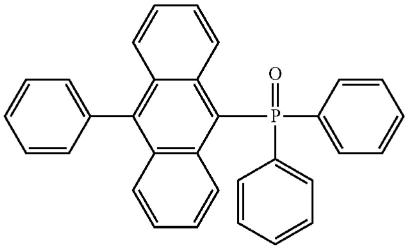

-continued
33
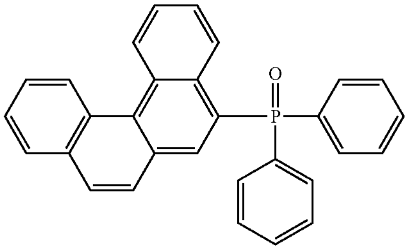
34
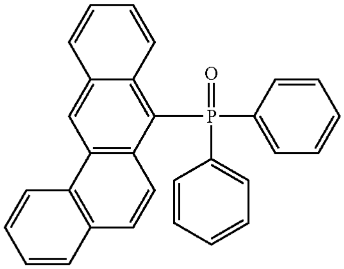
35
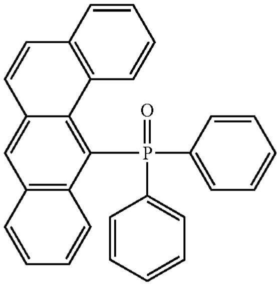
36
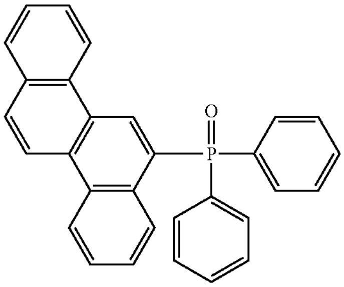
37
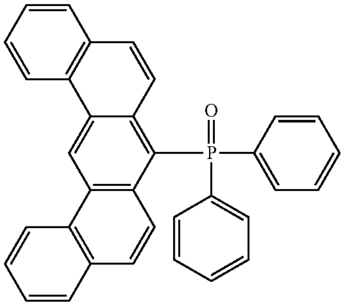
-continued
38
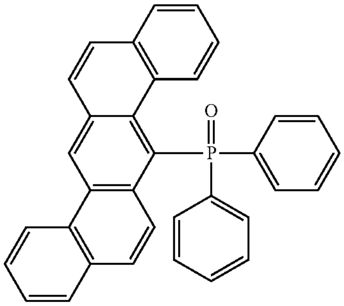
39
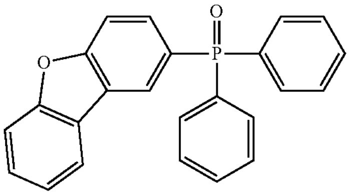
40
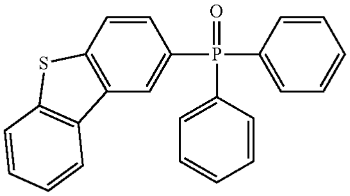
41
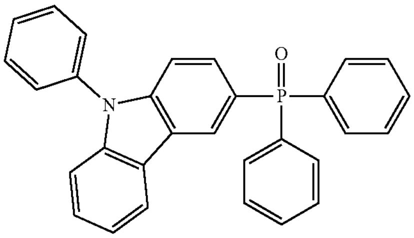
42
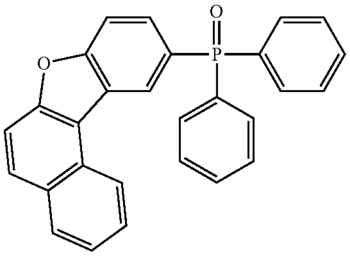
43
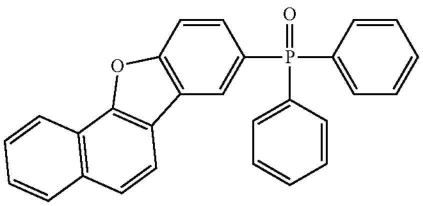

-continued
44
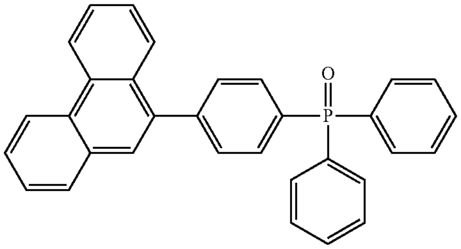
45
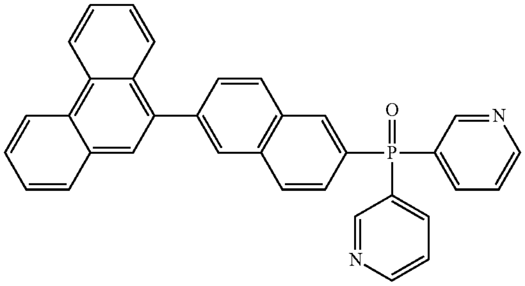
46
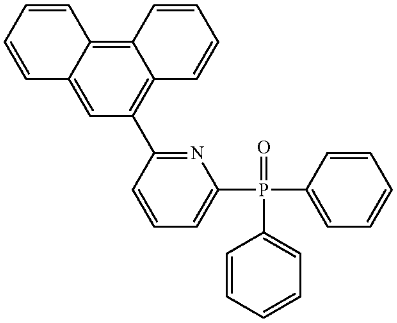
47
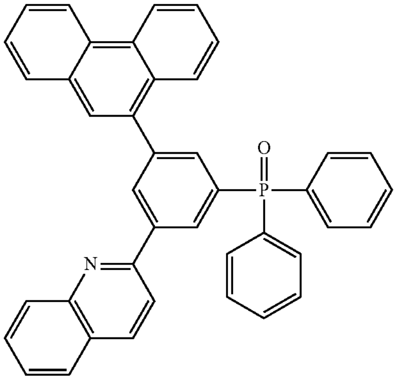
-continued
48
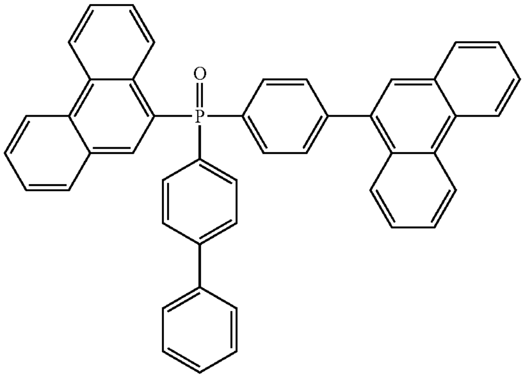
49
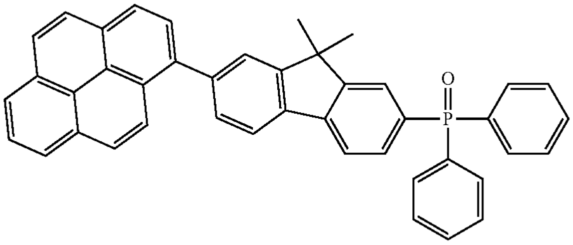
50
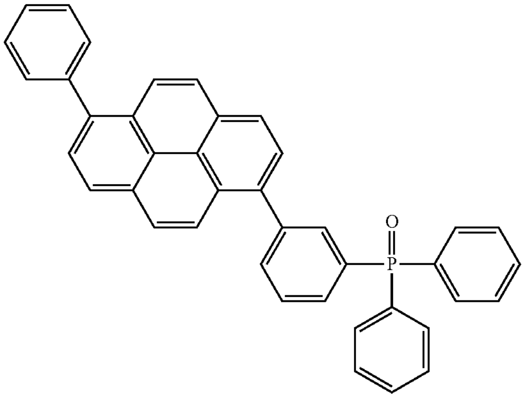
51
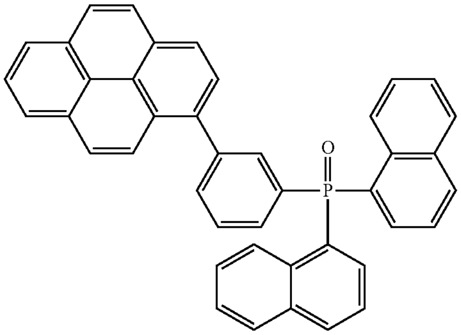

-continued
52
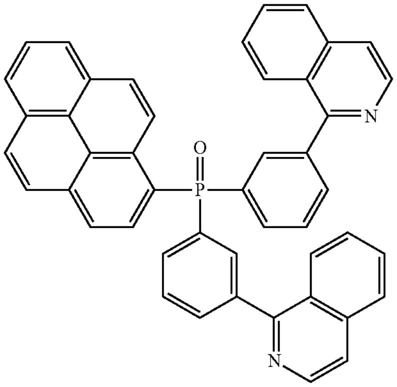
53
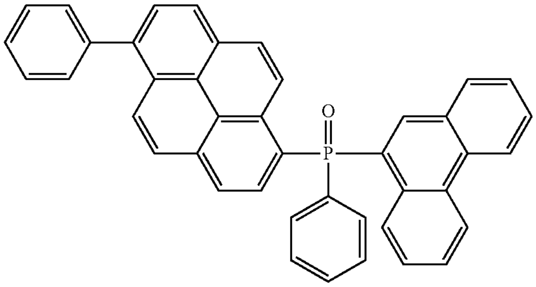
54
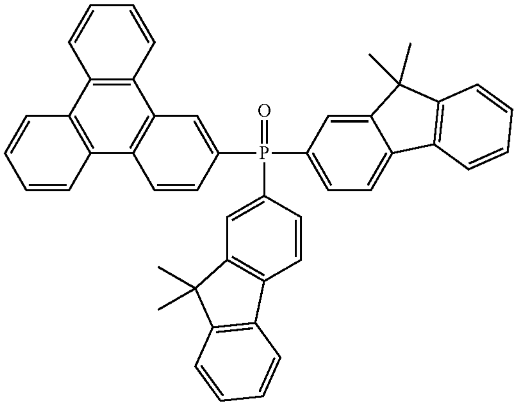
55
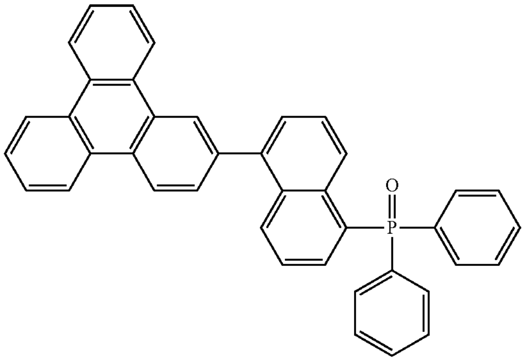
-continued
56
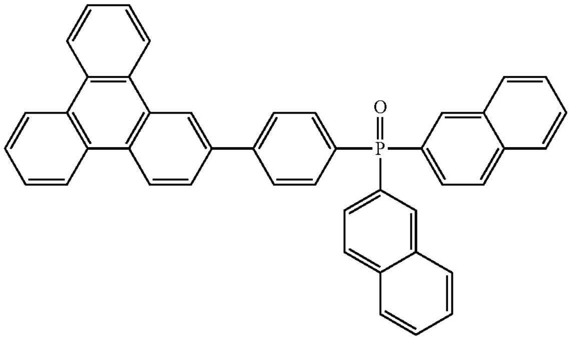
57
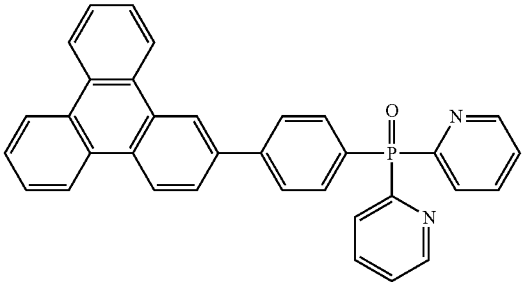
58
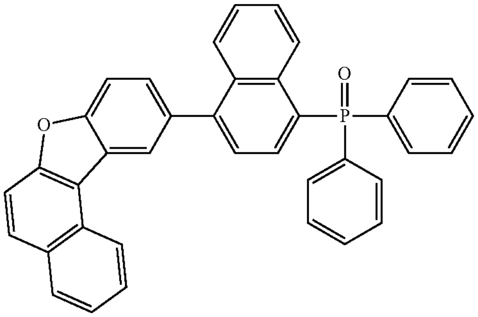
59
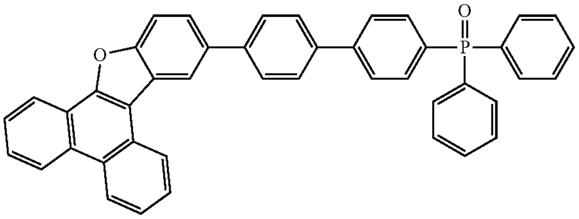
60
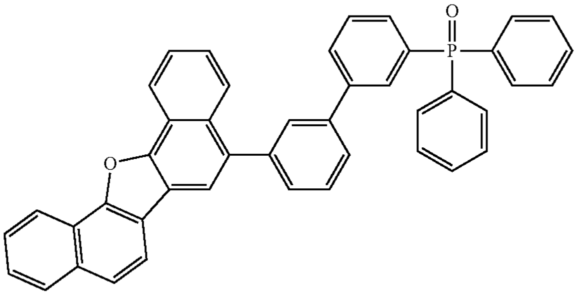

-continued
61
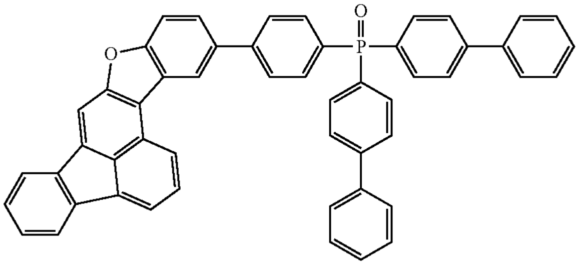
62
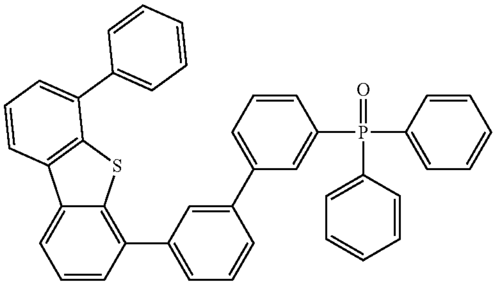
63
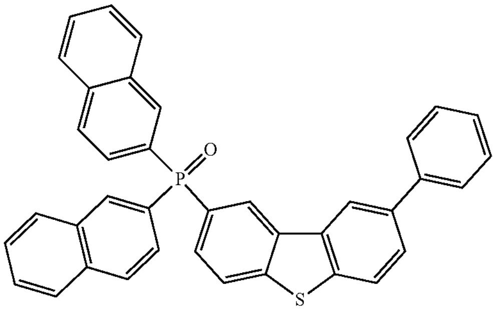
64
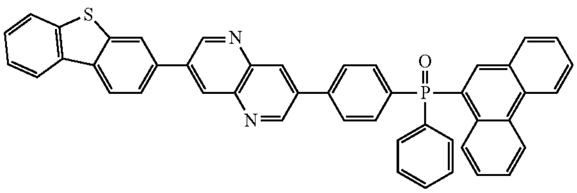
65
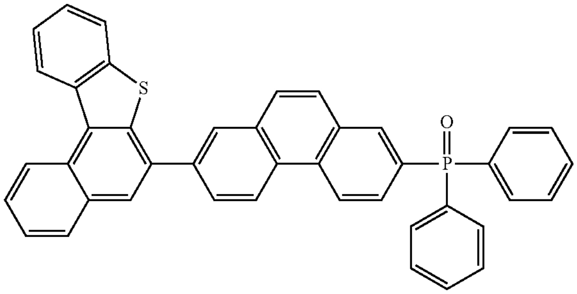
-continued
66
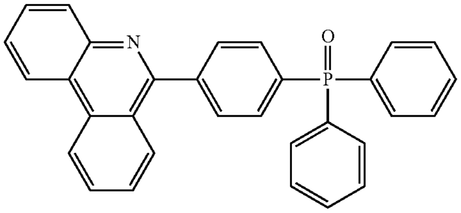
67
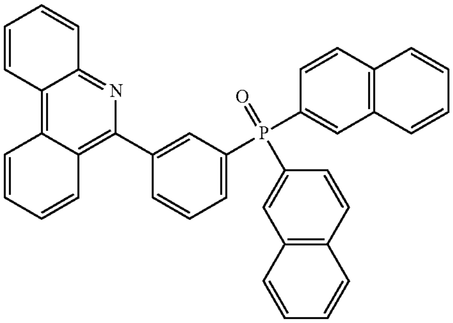
68
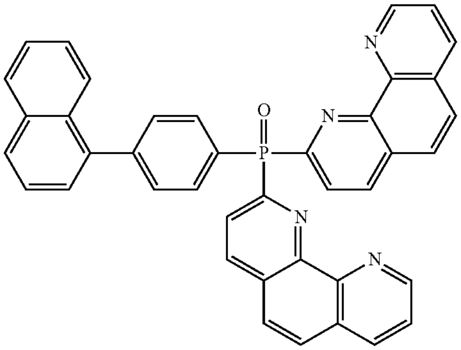
69
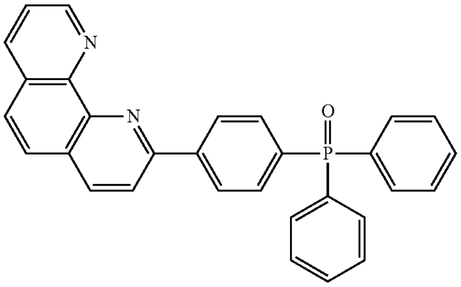
70
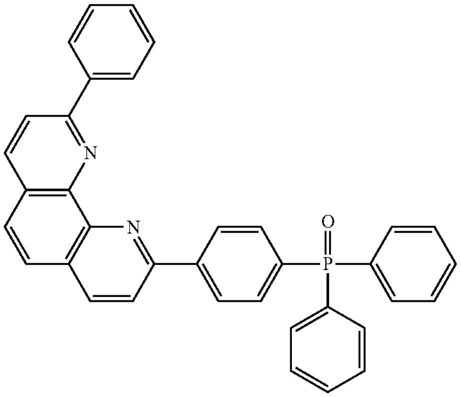

-continued
71
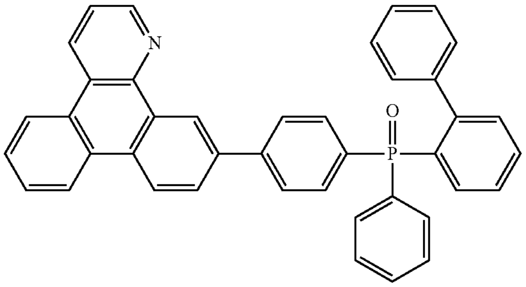
72
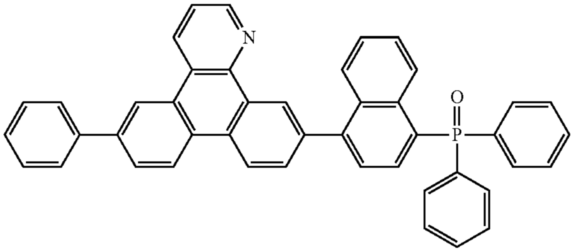
73
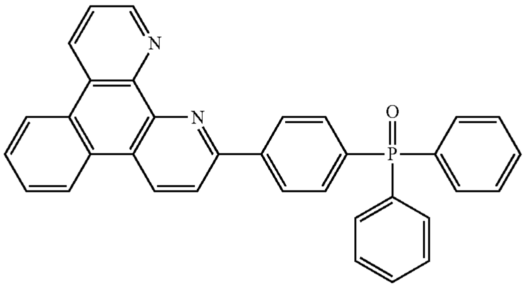
74
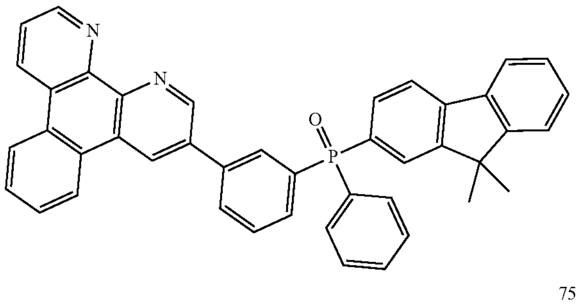
75
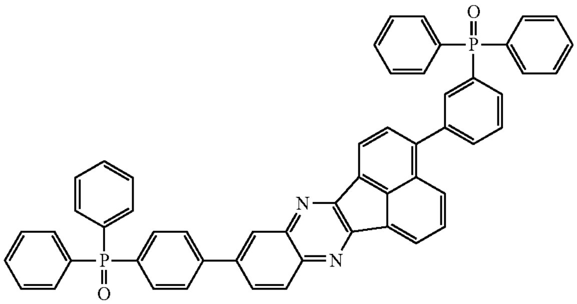
-continued
76
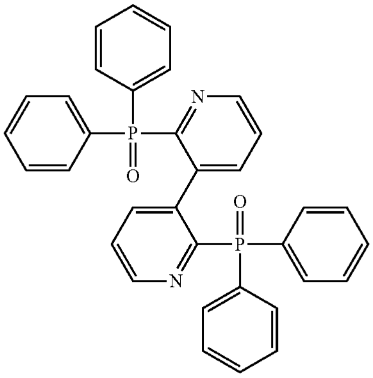
77
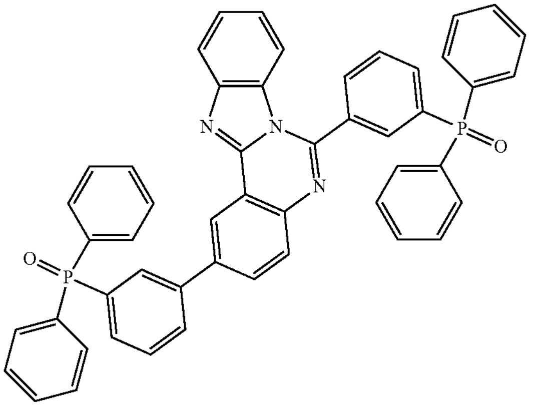
78
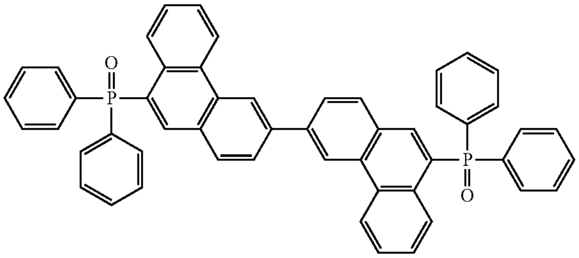
79
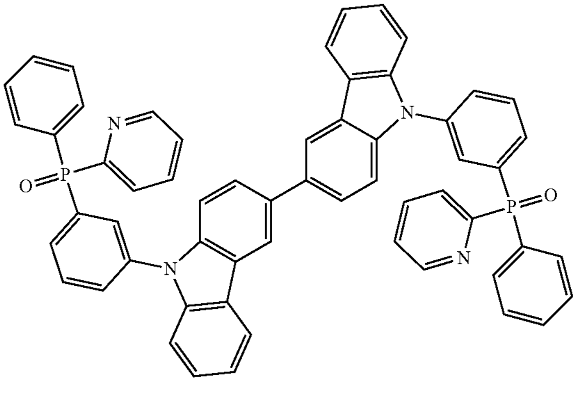

-continued
80
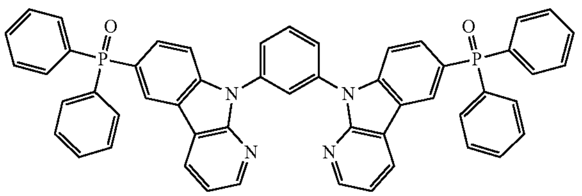
81
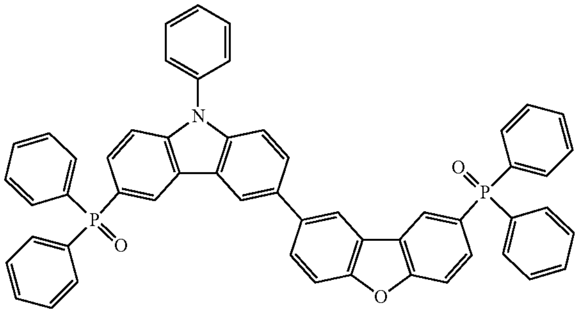
82
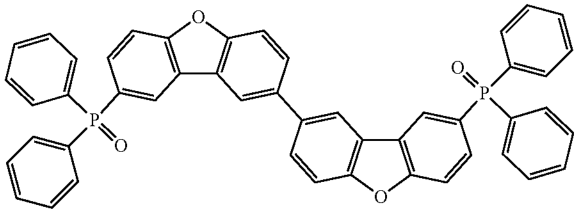
83
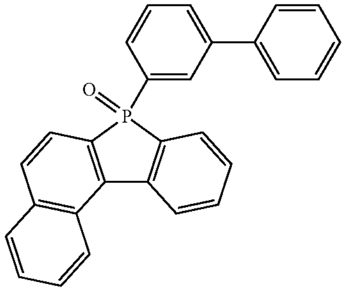
84
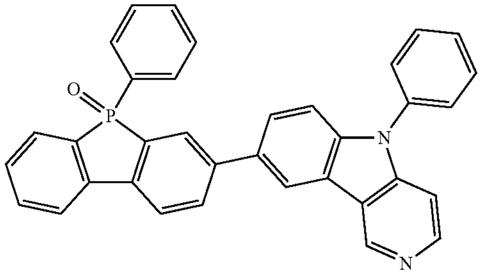
-continued
85
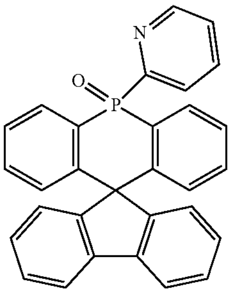
86
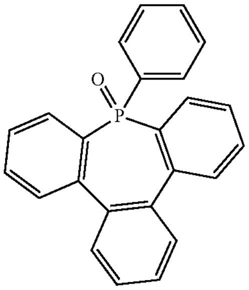
87
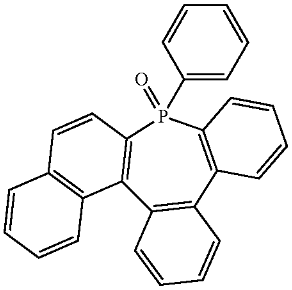
88
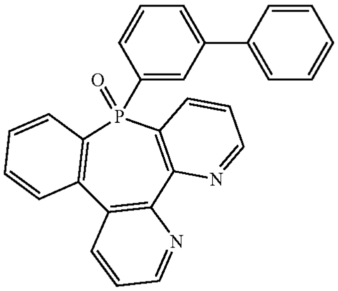
89
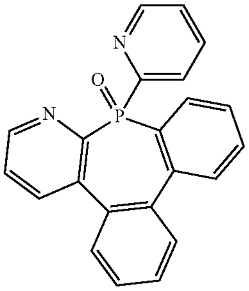

-continued
90
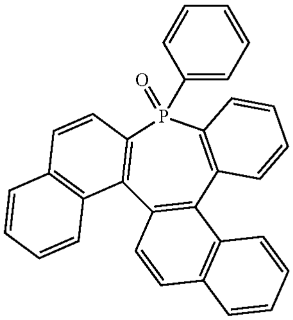
91
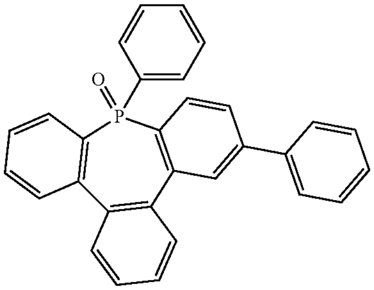
92
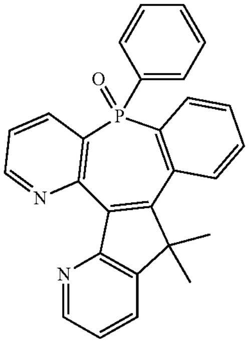
93
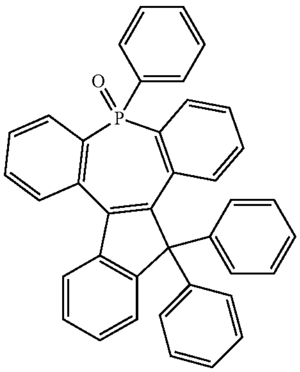
-continued
94
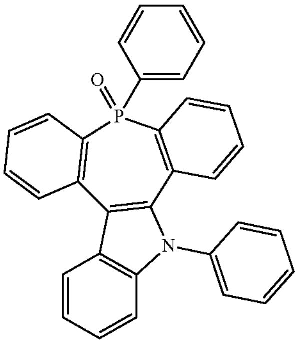
95
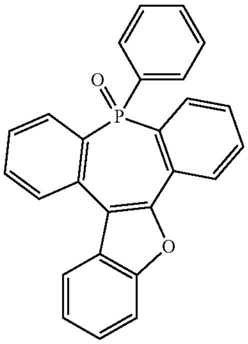
96
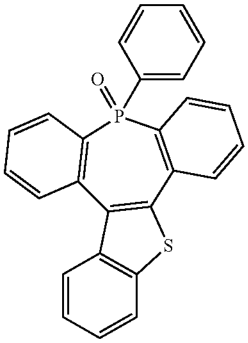
97
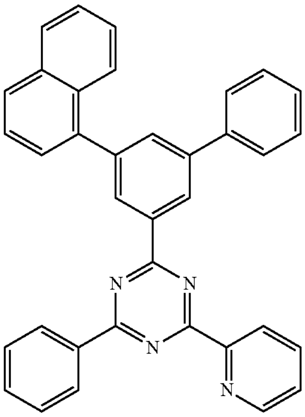
.
In an embodiment, the metal dopant may include an alkali metal, an alkaline earth metal, a rare earth metal, or any combination thereof.
In an embodiment, the metal dopant may include Li, Na, K, Rb, Cs, Mg, Ca, Sr, Ba, Sc, Y, Ce, Tb, Yb, Gd, or any combination thereof.

In an embodiment, the metal dopant may be Li, Yb, or a combination thereof.

In an embodiment, the second electrode may further include magnesium (Mg).

In an embodiment, an amount of magnesium in the second electrode may be in a range of about 0 wt % to about 10 wt %.

In an embodiment, an amount of magnesium in the second electrode may be in a range of about 0 wt % to about 5 wt %.

In an embodiment, the light-emitting device may further include a first capping layer disposed outside the first electrode, a second capping layer disposed outside the second electrode, or the first capping layer and the second capping layer. In an embodiment, the first capping layer and/or the second capping layer may each independently include a compound represented by Formula 1.

In an embodiment, the light-emitting device may include a first pixel, a second pixel, and a third pixel, and the emission layer may include a first emission layer of the first pixel, a second emission layer of the second pixel, and a third emission layer of the third pixel. The first emission layer may include a first host and a first dopant, the second emission layer may include a second host and a second dopant, the third emission layer may include a third host and a third dopant, and the first dopant, the second dopant, and the third dopant may satisfy at least one of Inequalities 2-1 to 2-3:

$$T_1(ET1)>T_1(D1) \quad \text{[Inequality 2-1]}$$

$$T_1(ET1)>T_1(D2) \quad \text{[Inequality 2-2]}$$

$$T_1(ET1)>T_1(D3) \quad \text{[Inequality 2-3]}$$

In Inequalities 2-1 to 2-3, $T_1$(ET1) may be a $T_1$ energy level of the first electron-transporting material, $T_1$(D1) may be a $T_1$ energy level of the first dopant, $T_1$(D2) may be a $T_1$ energy level of the second dopant, and $T_1$(D3) may be a $T_1$ energy level of the third dopant.

Because the first electron transport layer includes the first electron-transporting material having a greater $T_1$ energy level than that of the first dopant, the second dopant, and/or the third dopant, excitons in the emission layer may be efficiently confined, and thus efficiency of the light-emitting device may be improved.

In an embodiment, the first dopant, the second dopant, and the third dopant may satisfy all of Inequalities 2-1 to 2-3.

In an embodiment, the first emission layer, the second emission layer, and the third emission layer may each independently be a red emission layer, a green emission layer, or a blue emission layer.

In an embodiment, the first emission layer may emit red light having a maximum emission wavelength in a range of about 580 nm to about 750 nm, the second emission layer may emit green light having a maximum emission wavelength in a range of about 490 nm to about 580 nm, and the third emission layer may emit blue light having a maximum emission wavelength in a range of about 410 nm to about 490 nm.

In an embodiment, the light-emitting device may include a microcavity structure.

In an embodiment, a thickness of the first emission layer, a thickness of the second emission layer, and a thickness of the third emission layer may be different from one another.

In an embodiment, the hole transport region may include a first hole transport layer of the first pixel, a second hole transport layer of the second pixel, and a third hole transport layer of the third pixel, and a thickness of the first hole transport layer, a thickness of the second hole transport layer, and a thickness of the third hole transport layer may be different from one another.

In an embodiment, the light-emitting device may further include a first auxiliary layer between the hole transport region and the first emission layer, a second auxiliary layer between the hole transport region and the second emission layer, and a third auxiliary layer between the hole transport region and the third emission layer.

In an embodiment, a thickness of the first auxiliary layer, a thickness of the second auxiliary layer, and a thickness of the third auxiliary layer may be different from one another.

Thicknesses of the first emission layer, the second emission layer, and the third emission layer may each be differently configured or thicknesses of the first hole transport layer, the second hole transport layer, and the third hole transport layer may each be differently configured, to compensate for an optical resonance distance according to a wavelength of light emitted from each of the emission layers, and thus light-emission efficiency may be increased. In an embodiment, the first auxiliary layer, the second auxiliary layer, and the third auxiliary layer may each be located between the emission layer and the hole transport region to compensate for an optical resonance distance according to a wavelength of light emitted from each of the emission layers, and thus light-emission efficiency may be increased.

According to another aspect, provided is an electronic apparatus which may include the light-emitting device. The electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details on the electronic apparatus are the same as described in the specification.

[Description of FIG. 1]

FIGS. 1 to 5 are each a schematic cross-sectional view of a light-emitting device 10 according to an embodiment. The light-emitting device 10 includes a first electrode 110, an interlayer 130, and a second electrode 150. In the light-emitting device 10 according to an embodiment, the interlayer 130 may include emission layers 135, 135A, 135B, and 135C (also respectively referred to as an emission layer 135, a first emission layer 135A, a second emission layer 135B, and a third emission layer 135C), a first electron transport layer 136, and a second electron transport layer 137.

Hereinafter, a structure of the light-emitting device 10 according to an embodiment and a method of manufacturing the same will be described in connection with FIGS. 1 to 5.

[First Electrode 110]

In FIG. 1, a substrate may be further included under the first electrode 110 or above the second electrode 150. The substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110.

The first electrode 110 may have a single-layered structure or a multilayer structure including multiple layers. For example, the first electrode 110 may have a three-layered structure of ITO/Ag/ITO.

[Interlayer 130]

The interlayer 130 may be disposed on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

In embodiments, the interlayer 130 may include two or more emitting units sequentially stacked between the first electrode 110 and the second electrode 150 and a charge generation layer between the two or more emitting units. When the interlayer 130 includes two or more emitting units and a charge generation layer as described above, the light-emitting device 10 may be a tandem light-emitting device.

[Hole Transport Region in Interlayer 130]

The hole transport region may have a structure consisting of a layer consisting of a single material, a structure consisting of a layer consisting of different materials, or a multi-layered structure including layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein, in each structure, layers may be stacked from the first electrode 110 in its respective stated order.

The hole transport region may include a compound represented by Formula 201, a compound represented by Formula 202, or any combination thereof:

[Formula 201]

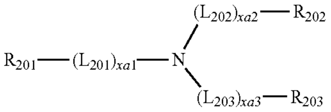

-continued

[Formula 202]

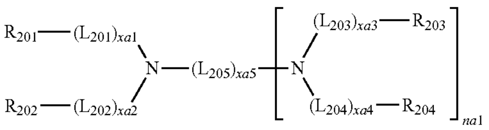

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, * and *' each indicate a binding site to a neighboring atom, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked together via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group) unsubstituted or substituted with at least one $R_{10a}$(for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{10a}$ may be understood by referring to the description of $R_{10a}$ provided herein, and na1 may be an integer from 1 to 4.

In an embodiment, each of Formulae 201 and 202 may include at least one of groups represented by Formulae CY201 to CY217.

CY201

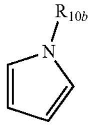

CY202

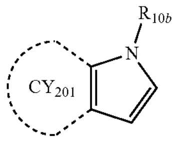

-continued

CY203

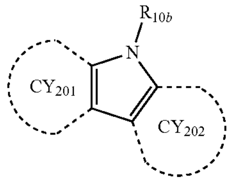

CY204

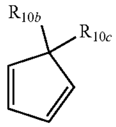

CY205

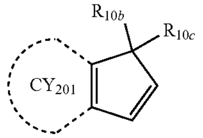

CY206

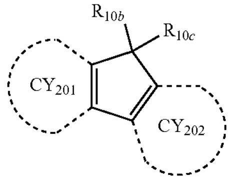

CY207

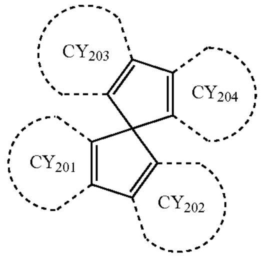

CY208

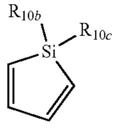

CY209

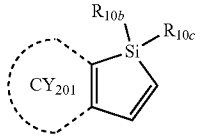

CY210

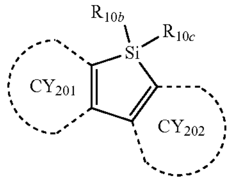

-continued

CY211

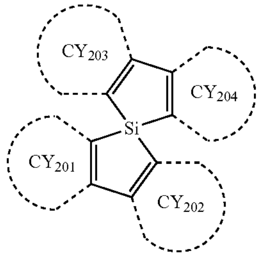

CY212

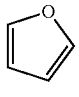

CY213

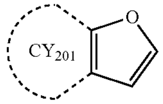

CY214

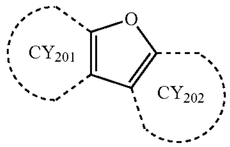

CY212

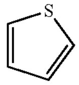

CY213

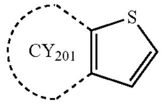

CY214

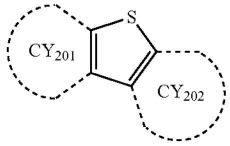

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, each of Formulae 201 and 202 may include at least one of groups represented by Formulae CY201 to CY203.

In an embodiment, Formula 201 may include at least one of groups represented by Formulae CY201 to CY203 and at least one of groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include a group represented by Formulae CY201 to CY203.

In an embodiment, each of Formulae 201 and 202 may not include a group represented by Formulae CY201 to CY203, and may include at least one of groups represented by Formulae CY204 to CY217.

In an embodiment, each of Formulae 201 and 202 may not include a group represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

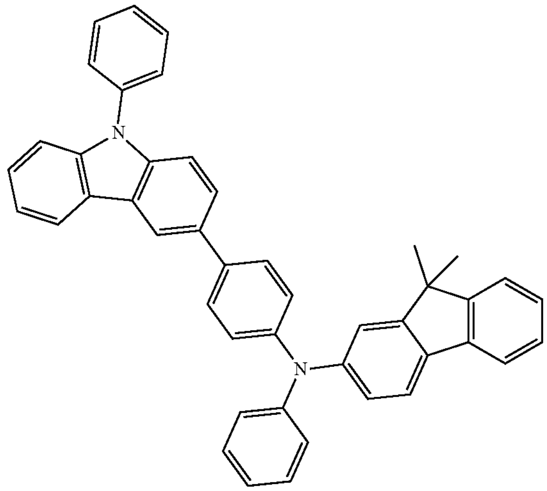

HT2

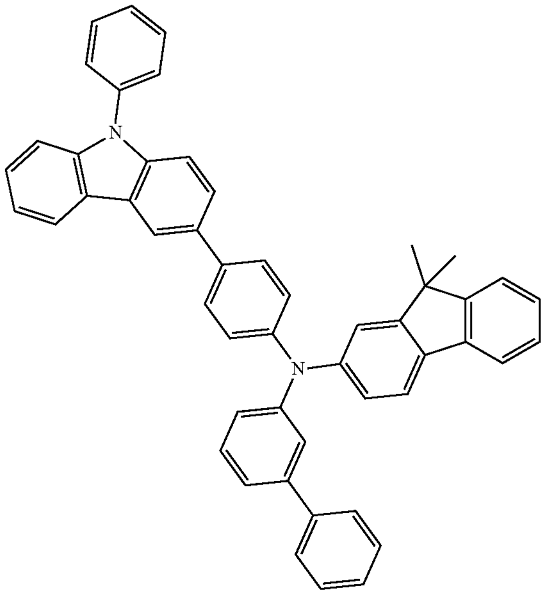

HT3

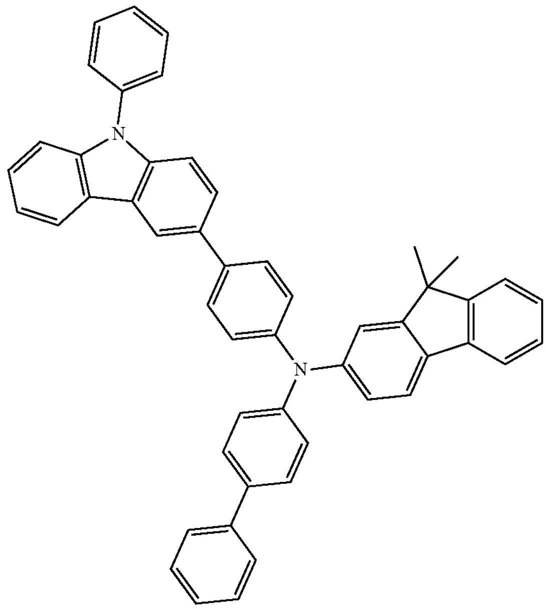

HT4

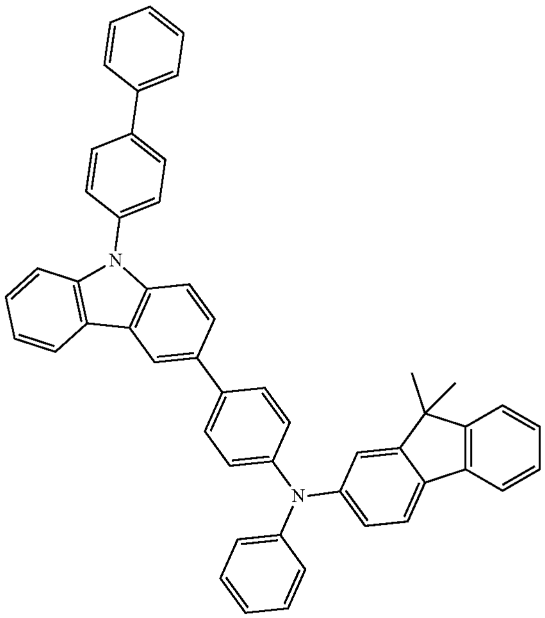

-continued
HT5
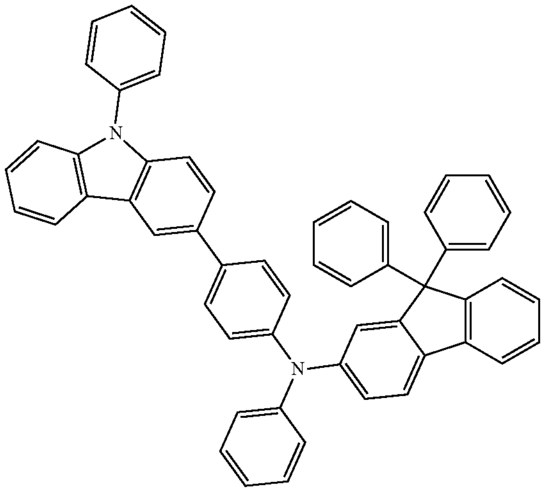
HT6
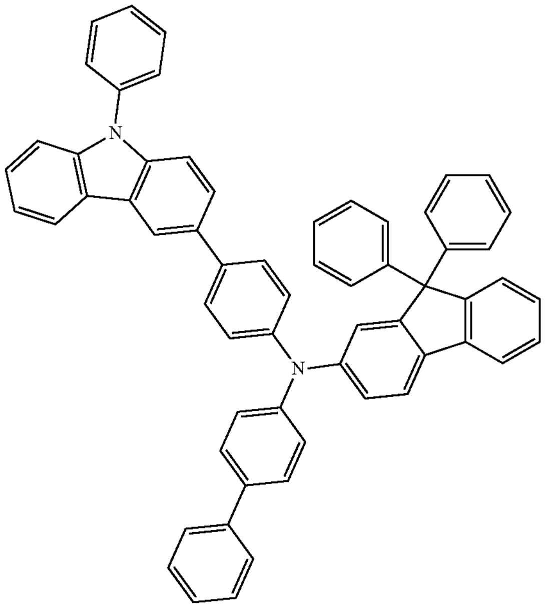
HT7
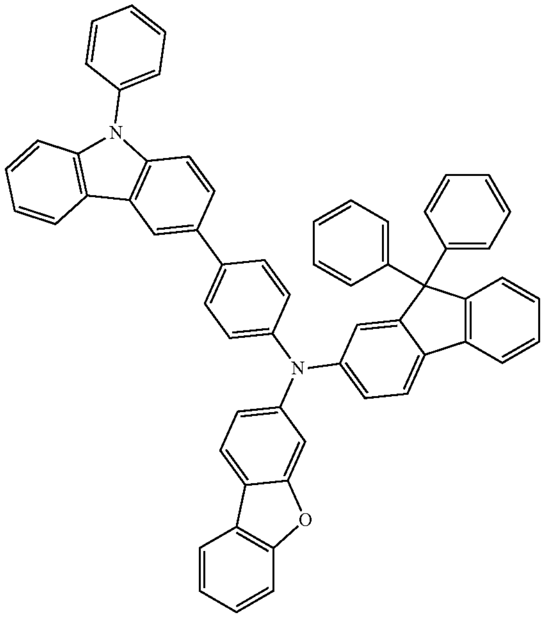
HT8
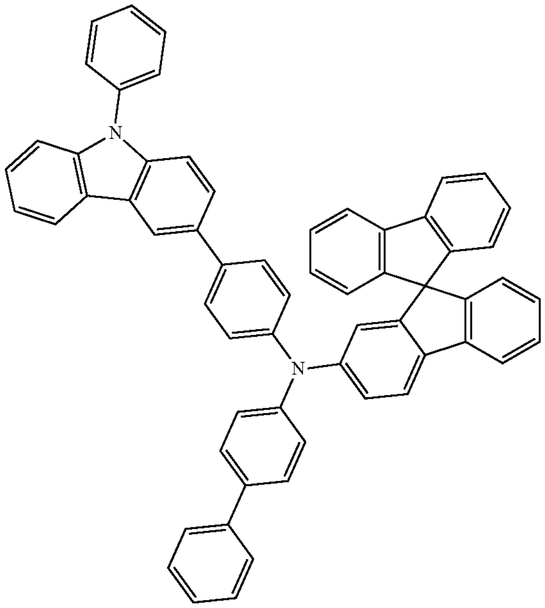

-continued
HT9
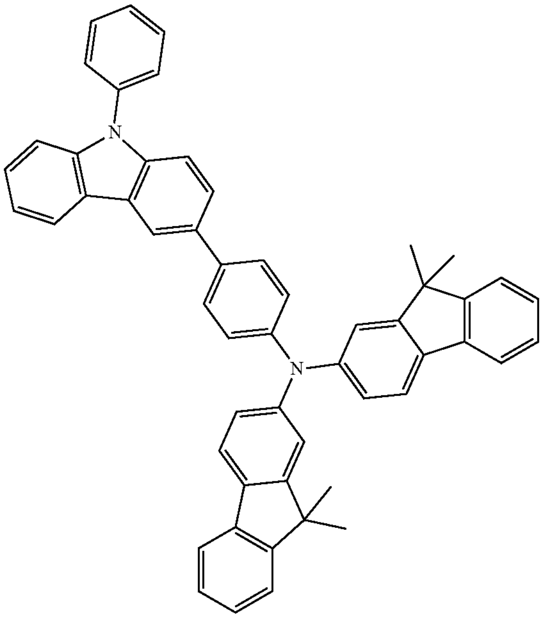
HT10
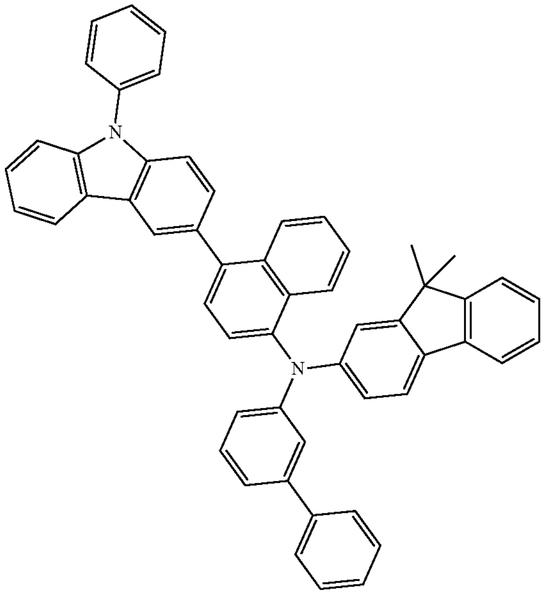
HT11
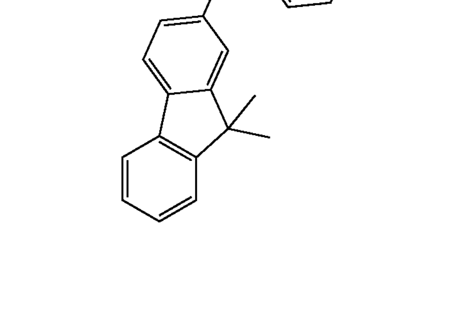
HT12
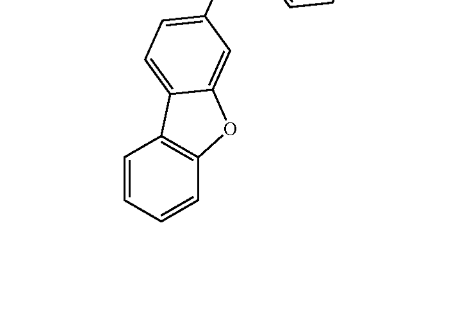

-continued
HT13
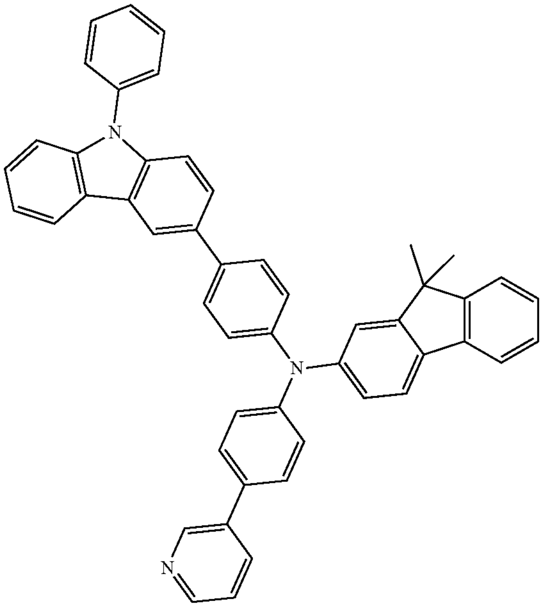
HT14
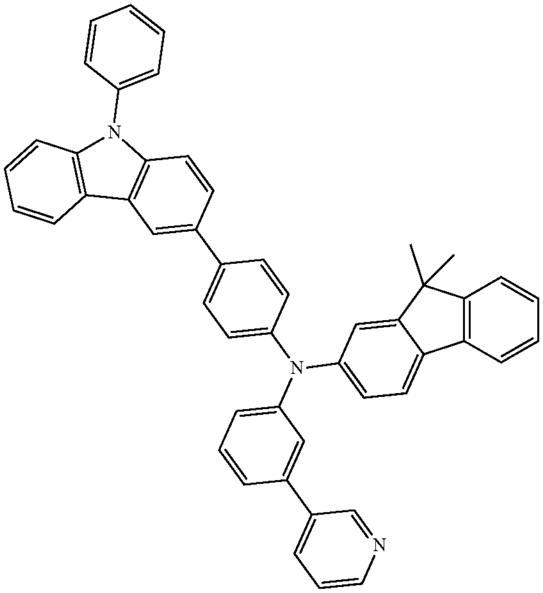
HT15
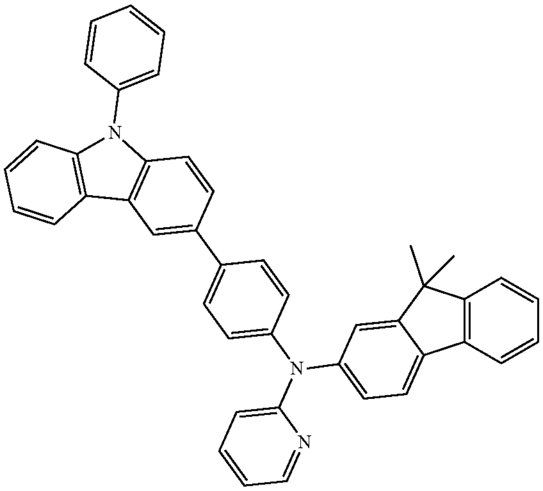
HT16
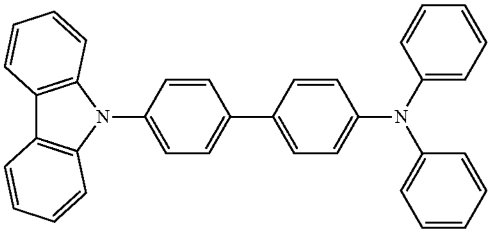
HT17
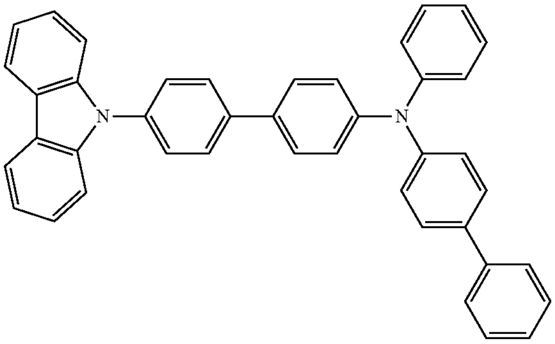
HT18
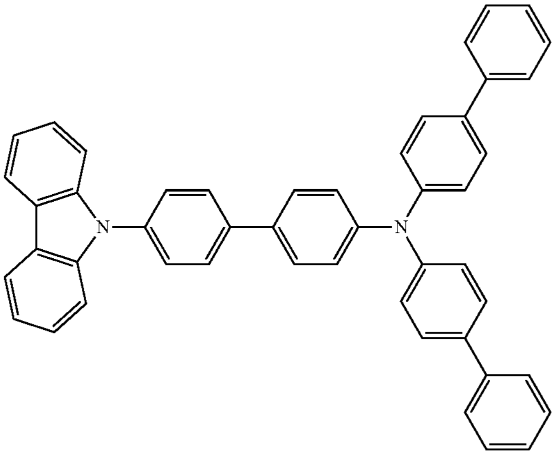

-continued
HT19
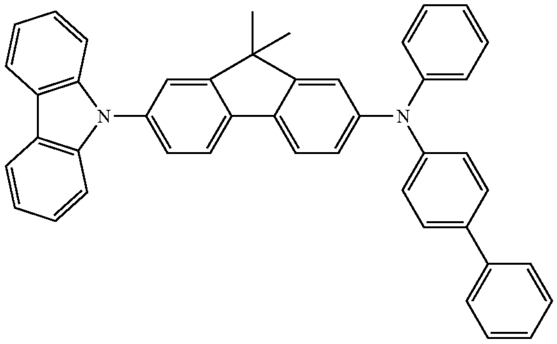
HT20
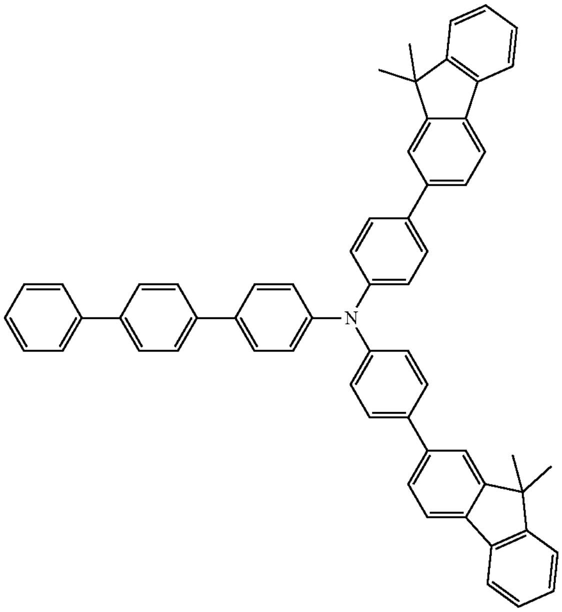
HT21
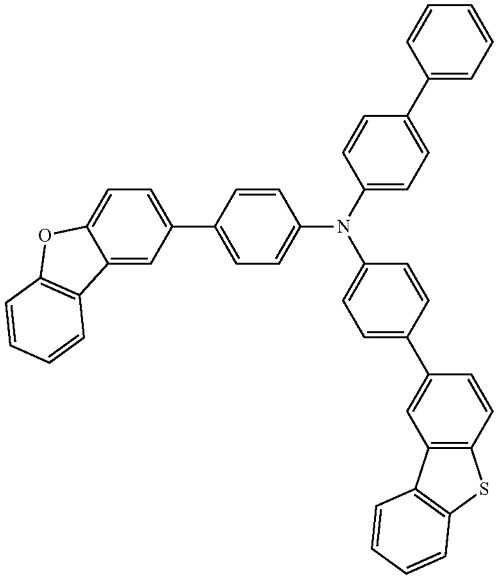
HT22
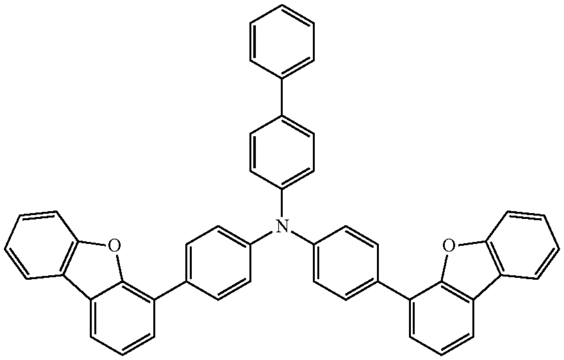

-continued
HT23
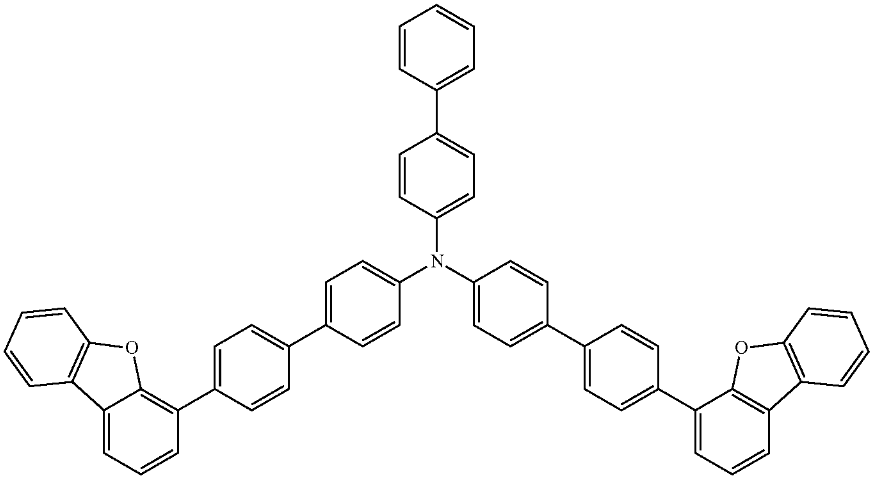
HT24
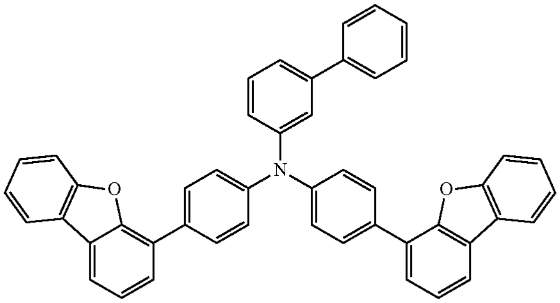
HT25
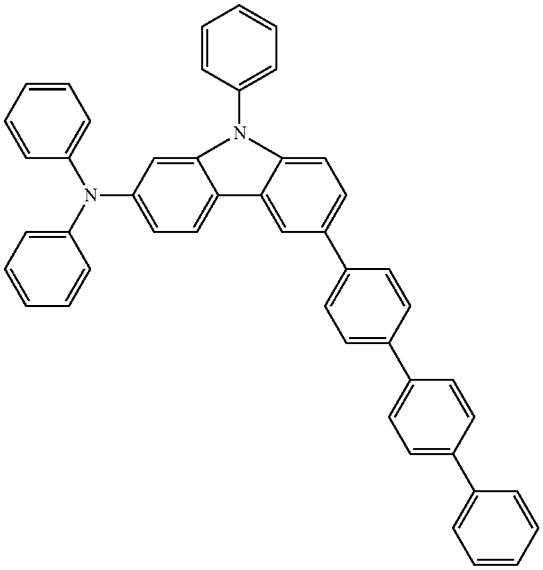
HT26
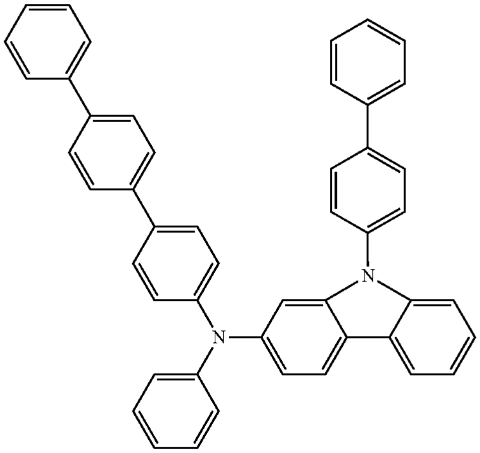
HT27
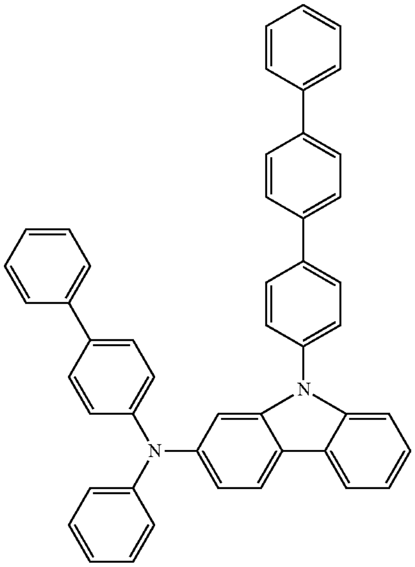

-continued
HT28
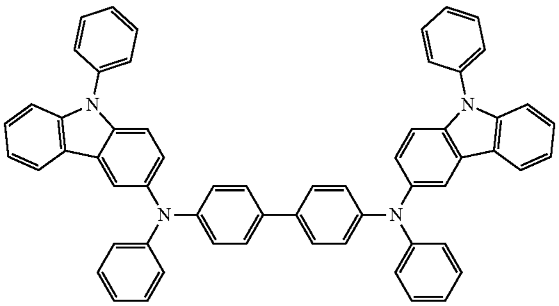
HT29
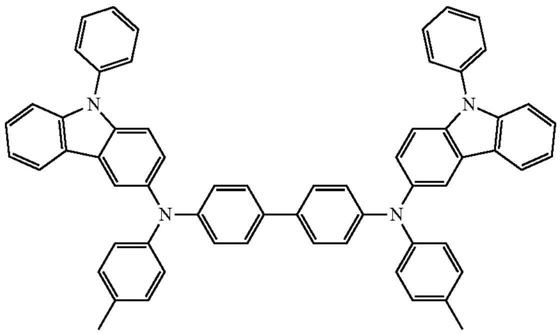
HT30
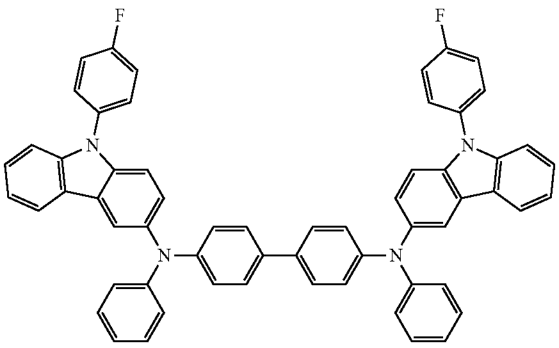
HT31
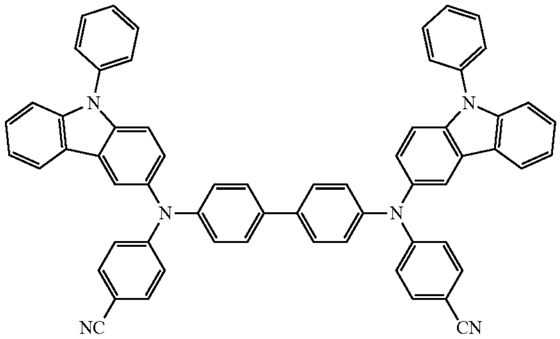
HT32
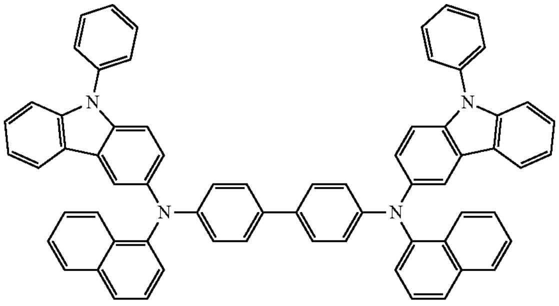
HT33
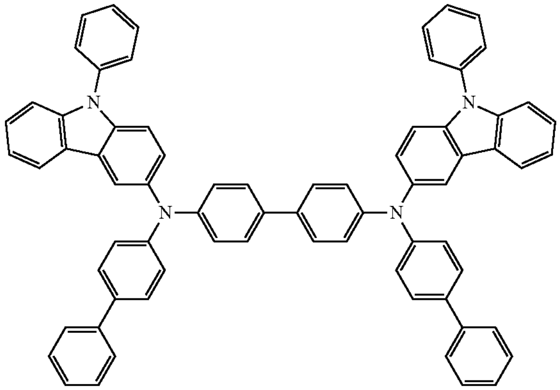
HT34
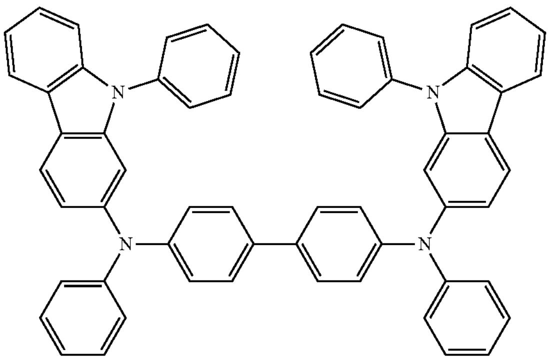
HT35
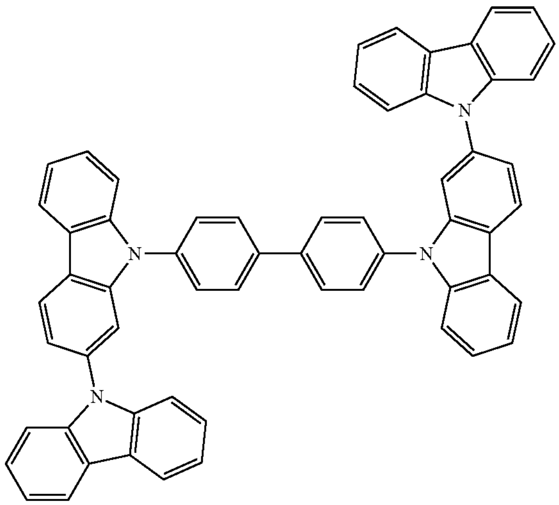

-continued
HT36
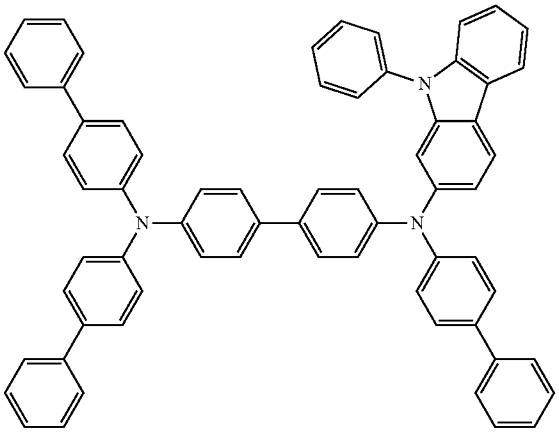
HT37
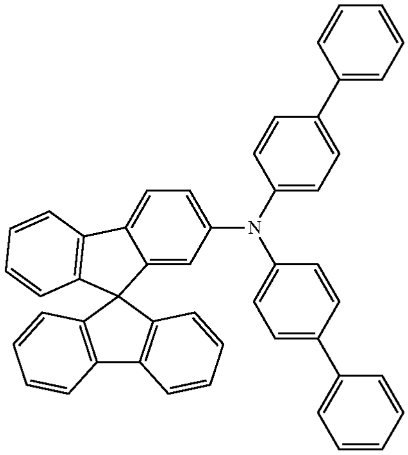
HT38
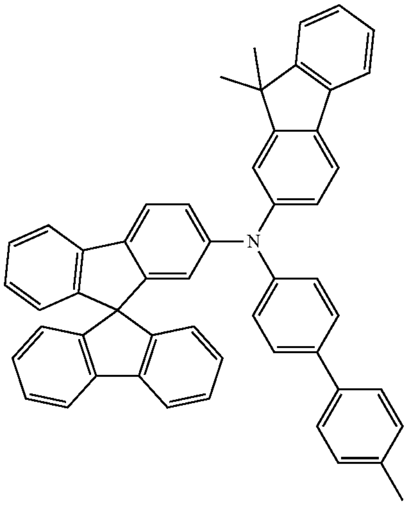
HT39
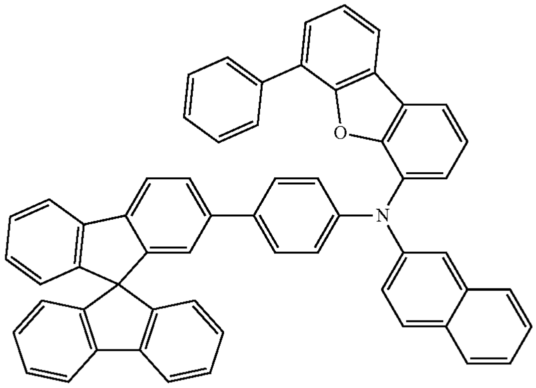
HT40
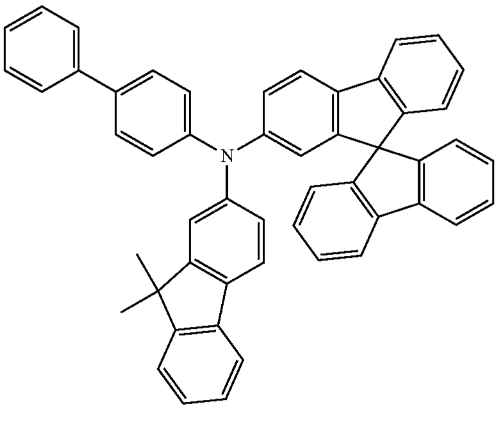
HT41
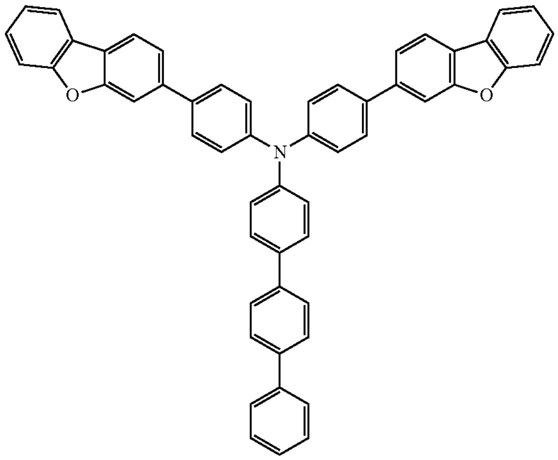

-continued
HT42
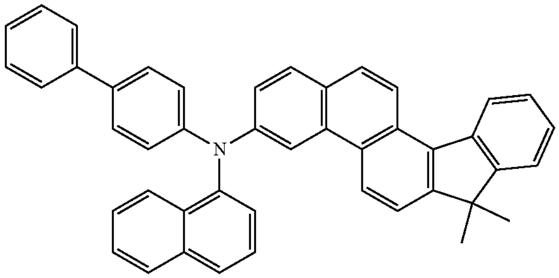
HT43
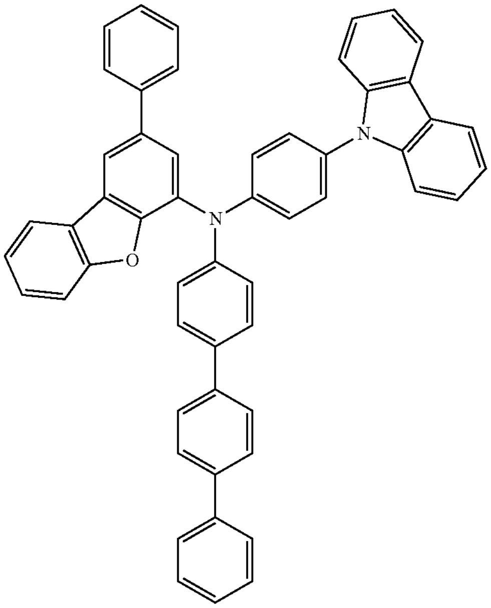
HT44
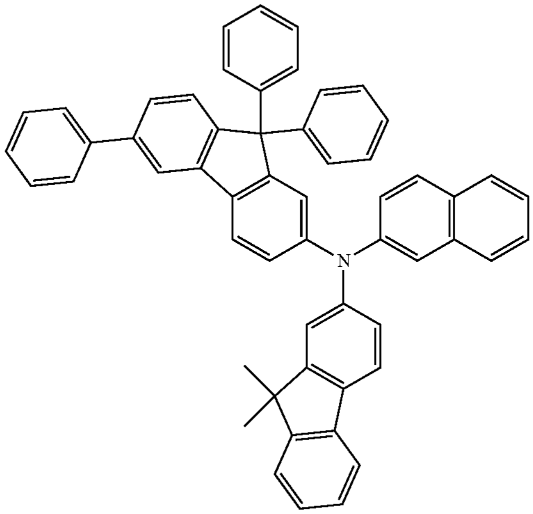
HT45
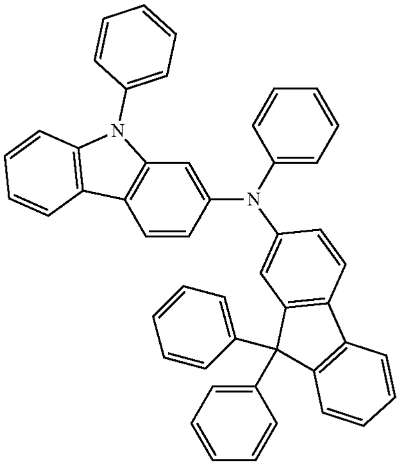

-continued
HT46
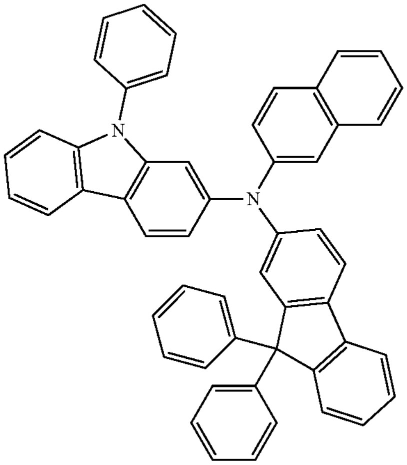
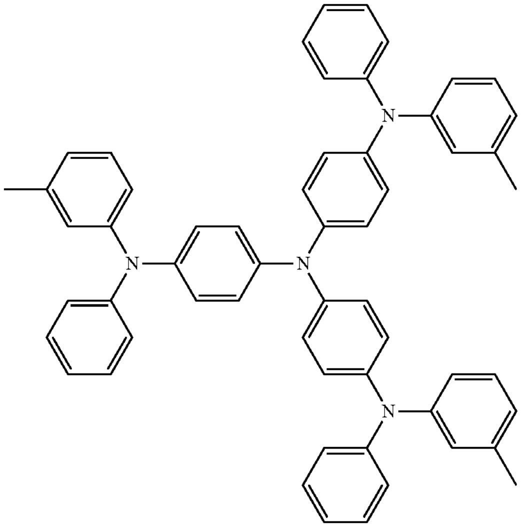
m-MTDATA
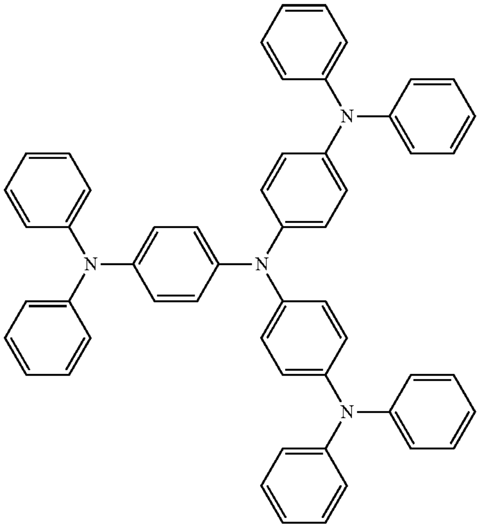
TDATA
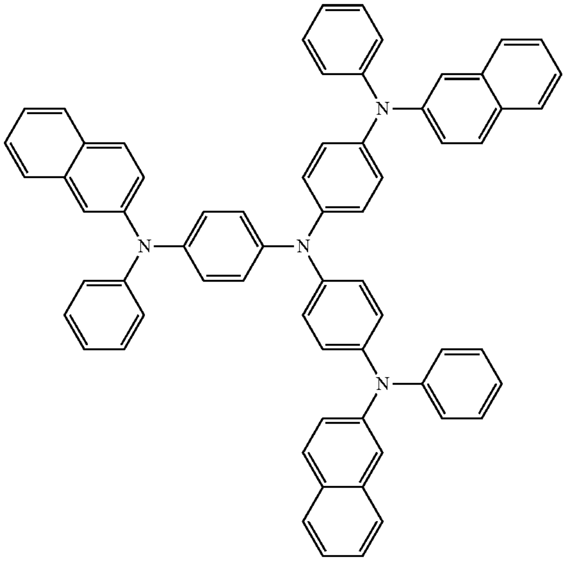
2-TNATA
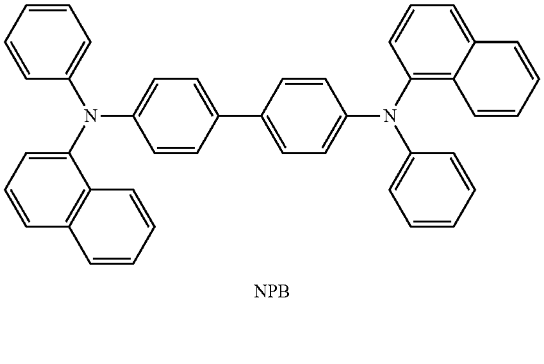
NPB
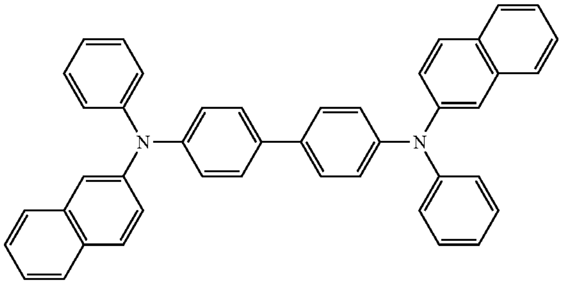
β-NPB -continued

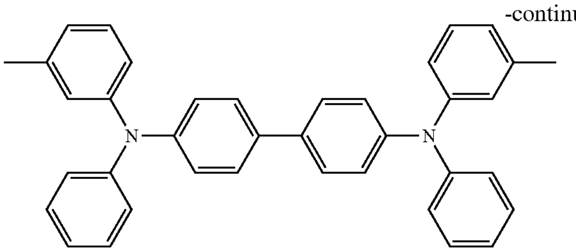

TPD

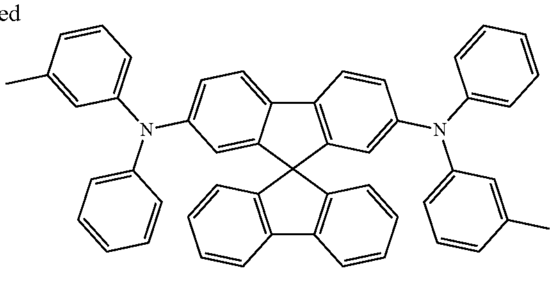

Spiro-TPD

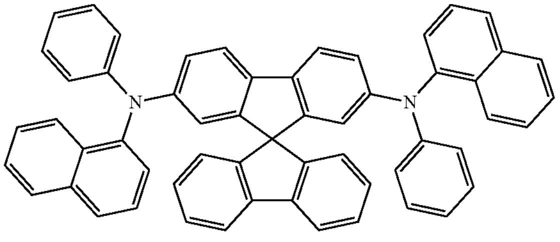

Spiro-NPB

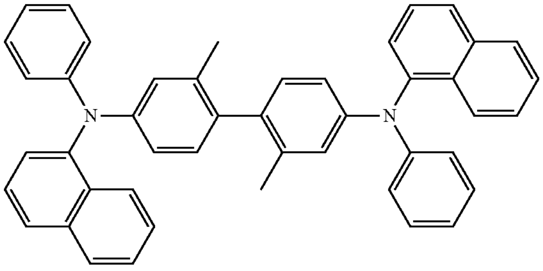

methylated-NPB

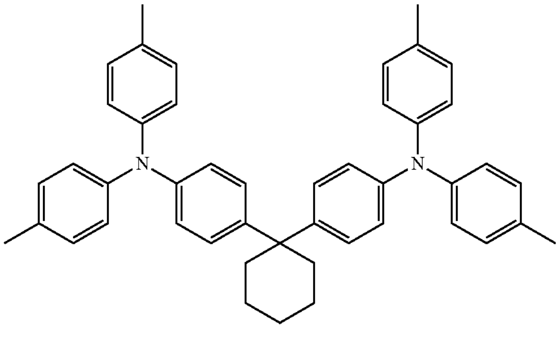

TAPC

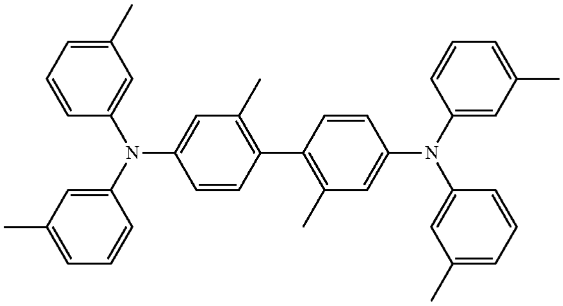

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å, for example, about 100 Å to about 1,500 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole-transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative may include TCNQ, F4-TCNQ, and the like.

Examples of the cyano group-containing compound may include HAT-CN, a compound represented by Formula 221 below, and the like.

TCNQ

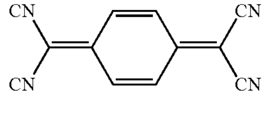

-continued

F4-TCNQ

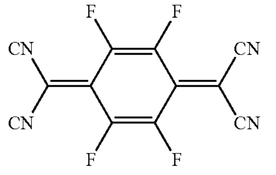

HAT-CN

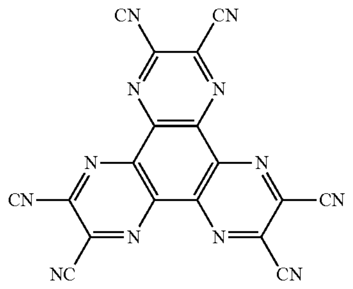

[Formula 221]

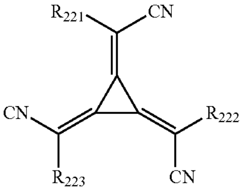

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be understood by referring to the description of $R_{10a}$ provided herein, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof, or any combination thereof.

In the compound containing element EL1 and element EL2, element EL1 may be a metal, a metalloid, or a combination thereof, and element EL2 may be a non-metal, a metalloid, or a combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include a metal oxide, a metal halide (for example, metal fluoride, metal chloride, metal bromide, or metal iodide), a metalloid halide (for example, metalloid fluoride, metalloid chloride, metalloid bromide, or metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (for example, MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TiCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer 135 in Interlayer 130]

The light-emitting device 10 according to an embodiment includes the emission layer 135 in the interlayer 130.

When the light-emitting device 10 is a full-color light-emitting device, the emission layer may be patterned into a red emission layer, a green emission layer, and/or a blue emission layer, according to a sub-pixel. In an embodiment, the emission layer 135 may have a stacked structure of two or more layers of a red emission layer, a green emission layer, and a blue emission layer, in which the two or more layers may contact each other or may be separated from each other. In embodiments, the emission layer may include two or more materials of a red light-emitting material, a green light-emitting material, and a blue light-emitting material, in which the two or more materials are mixed with each other in a single layer to emit white light.

The emission layer 135 may include a host and a dopant. The dopant may include a phosphorescent dopant, a fluorescent dopant, a delayed fluorescence dopant, or any combination thereof.

An amount of the dopant in the emission layer 135 may be in a range of about 0.01 parts by weight to about 15 parts by weight, based on 100 parts by weight of the host.

In an embodiment, the emission layer 135 may include a quantum dot.

In an embodiment, the emission layer 135 may include a delayed fluorescence dopant. The delayed fluorescence dopant may act as a host or a dopant in the emission layer 135.

A thickness of the emission layer 135 may be in a range of about 100 Å to about 1,000 Å. For example, the thickness of the emission layer 135 may be in a range of about 200 Å to about 600 Å. When the thickness of the emission layer 135 is within these ranges, excellent light-emission characteristics may be obtained without a substantial increase in driving voltage.

Figure 4:
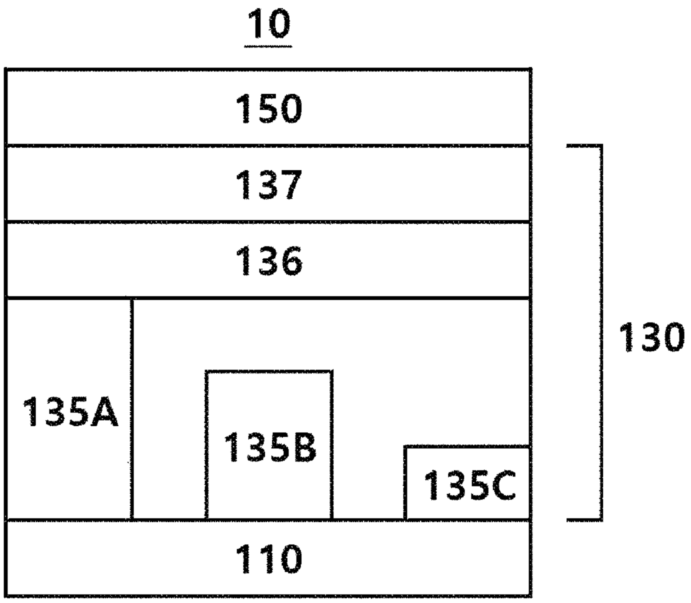
FIG. 4 is a schematic cross-sectional view of a structure of a light-emitting device according to an embodiment.
Figure 5:
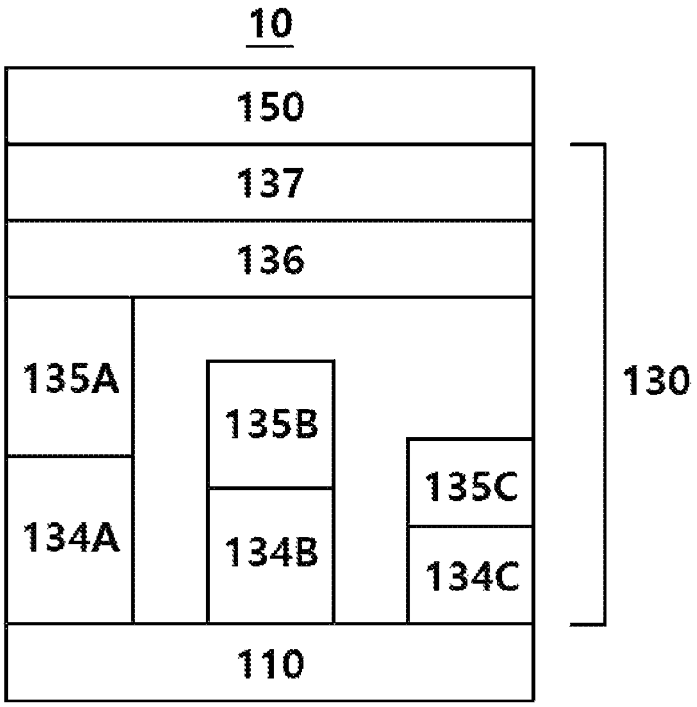
FIG. 5 is a schematic cross-sectional view of a structure of a light-emitting device according to an embodiment.

For example, referring to FIGS. 4 and 5, the light-emitting device 10 includes a first pixel, a second pixel, and a third pixel, and the emission layer 135 may include the first emission layer 135A of the first pixel, the second emission layer 135B of the second pixel, and the third emission layer 135C of the third pixel.

In an embodiment, the first emission layer 135A may include a first host and a first dopant, the second emission layer 135B may include a second host and a second dopant, and the third emission layer 135C may include a third host and a third dopant.

In an embodiment, the first dopant, the second dopant, and the third dopant may satisfy at least one of Inequalities 2-1 to 2-3:

$$T_1(ET1)>T_1(D1) \quad \text{[Inequality 2-1]}$$

$$T_1(ET1)>T_1(D2) \quad \text{[Inequality 2-2]}$$

$$T_1(ET1)>T_1(D3) \quad \text{[Inequality 2-3]}$$

In Inequalities 2-1 to 2-3, $T_1$(ET1) may be a $T_1$ energy level of the first electron-transporting material, $T_1$(D1) may be a $T_1$ energy level of the first dopant, $T_1$(D2) may be a $T_1$ energy level of the second dopant, and $T_1$(D3) may be a $T_1$ energy level of the third dopant.

In an embodiment, the first emission layer 135A, the second emission layer 135B, the third emission layer 135C may be a red emission layer, a green emission layer, and a blue emission layer, respectively.

In an embodiment, the first emission layer may emit red light having a maximum emission wavelength in a range of about 580 nm to about 750 nm, the second emission layer may emit green light having a maximum emission wavelength in a range of about 490 nm to about 580 nm, and the third emission layer may emit blue light having a maximum emission wavelength in a range of about 410 nm to about 490 nm.

In an embodiment, the light-emitting device may include a microcavity structure.

In an embodiment, a thickness of the first emission layer 135A, a thickness of the second emission layer 135B, and a thickness of the third emission layer 135C may be different from one another.

In an embodiment, the hole transport region in the light-emitting device may include a first hole transport layer 134A corresponding to the first emission layer 135A and located in the first pixel, a second hole transport layer 134B corresponding to the second emission layer 135B and located in the second pixel, and a third hole transport layer 134C corresponding to the third emission layer 135C and located in the third pixel.

In an embodiment, a thickness of the first hole transport layer 134A, a thickness of the second hole transport layer 134B, and a thickness of the third hole transport layer 134C may be different from one another.

In an embodiment, the light-emitting device may further include a first auxiliary layer between the hole transport region and the first emission layer, a second auxiliary layer between the hole transport region and the second emission layer, and a third auxiliary layer between the hole transport region and the third emission layer.

In an embodiment, a thickness of the first auxiliary layer, a thickness of the second auxiliary layer, and a thickness of the third auxiliary layer may be different from one another.

[Host]

The host may include a compound represented by Formula 301 below:

$$[Ar_{301}]_{xb11}\text{-}[(L_{301})_{xb1}\text{-}R_{301}]_{xb21} \quad \text{[Formula 301]}$$

In Formula 301, $Ar_3O_1$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

In an embodiment, the host may include one of Compounds H1 to H124, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

[Formula 301-1]

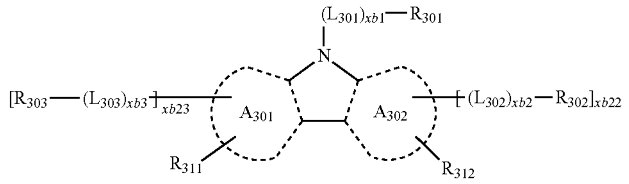

[Formula 301-2]

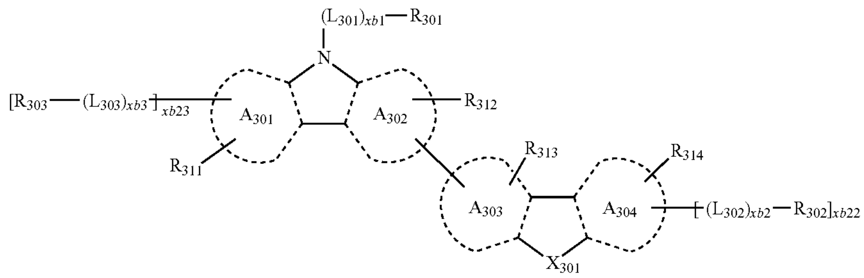

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be understood by referring to the description of $R_{10a}$ provided herein, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each respectively be the same as described in connection with $L_{301}$, xb1, and $R_{301}$ as provided in the specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

H1

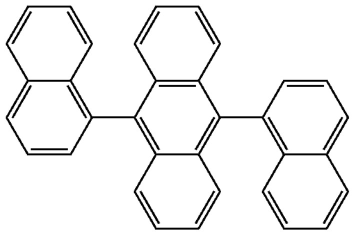

H2

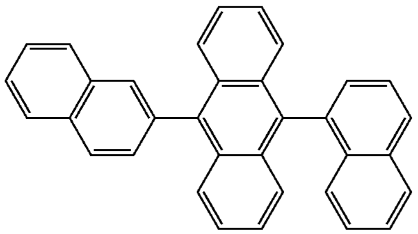

H3

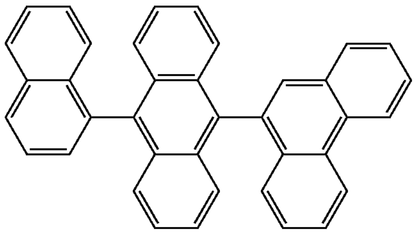

-continued
H4
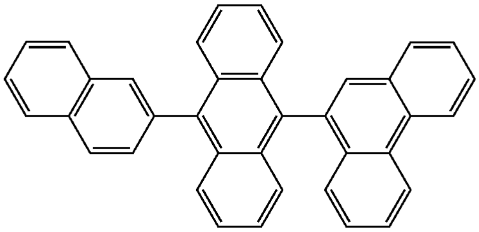
H5
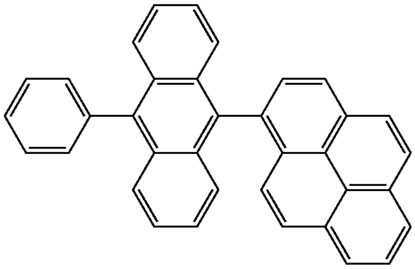
H6
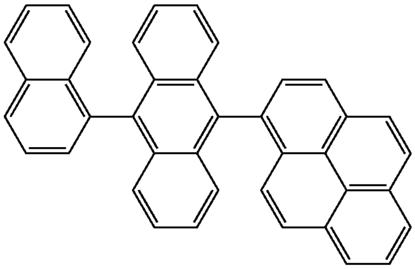
H7
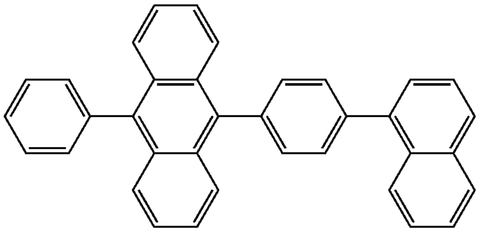
H8
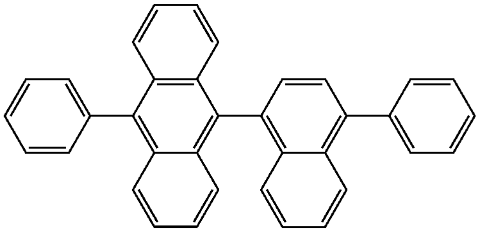
H9
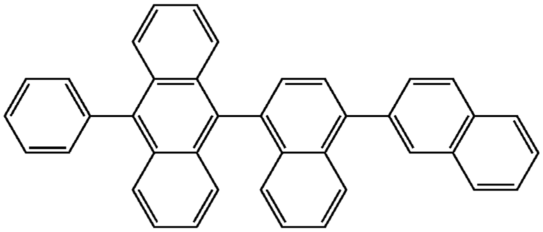
-continued
H10
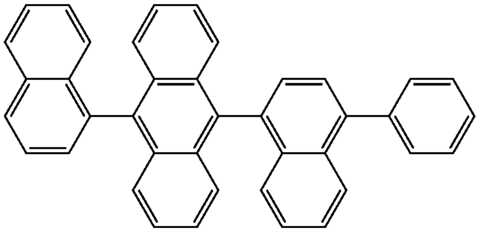
H11
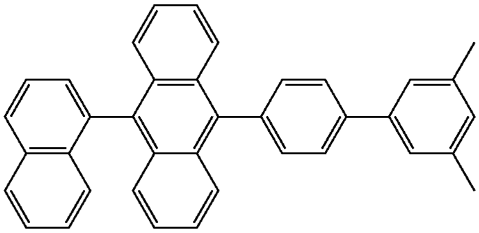
H12
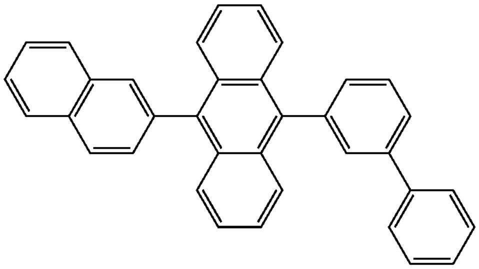
H13
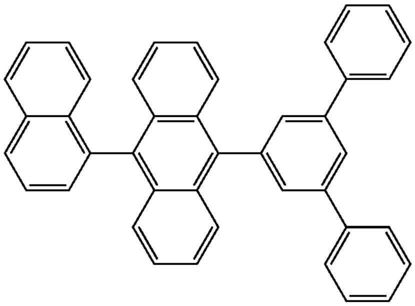
H14
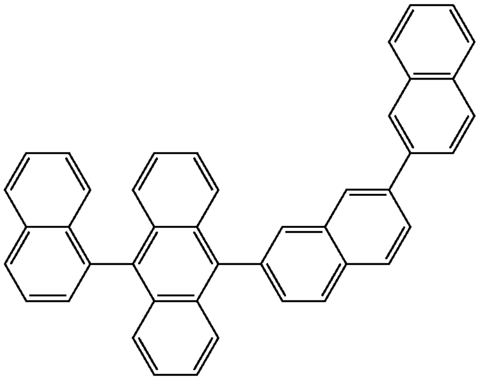

-continued
H15
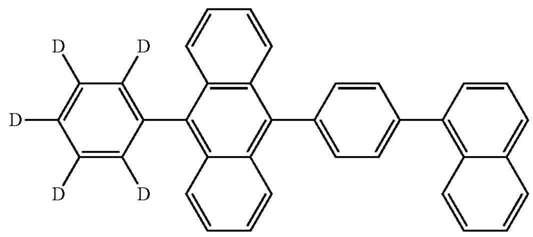
H16
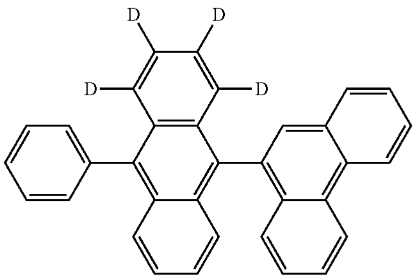
H17
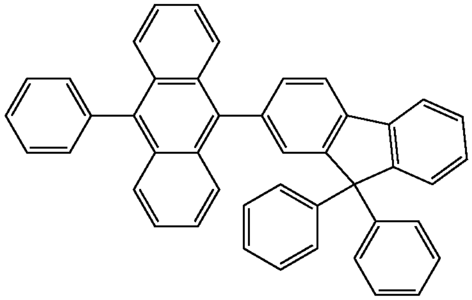
H18
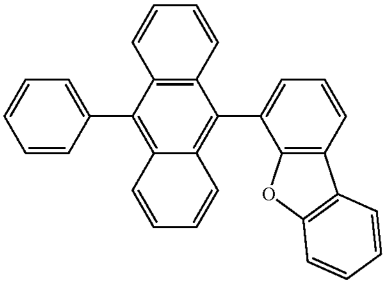
H19
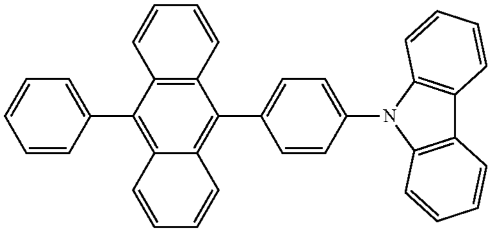
-continued
H20
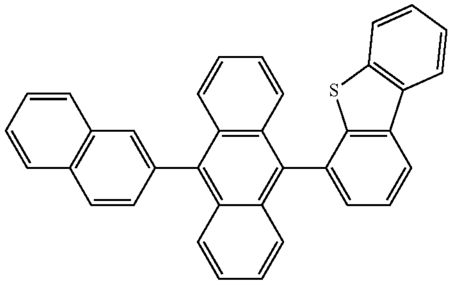
H21
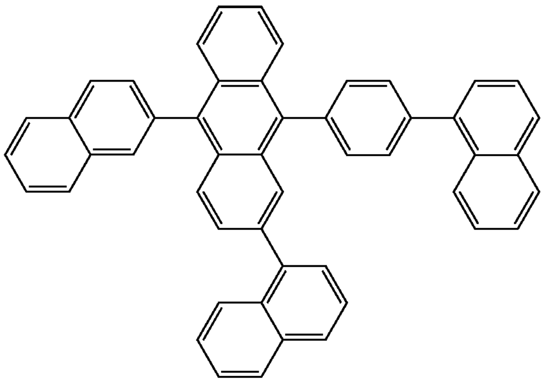
H22
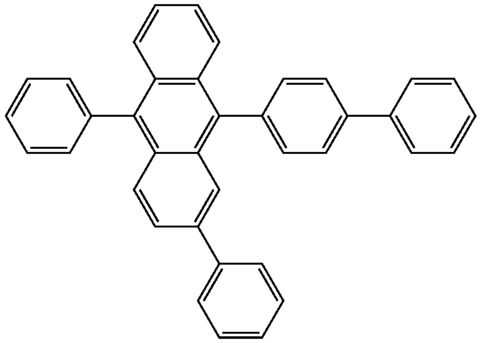
H23
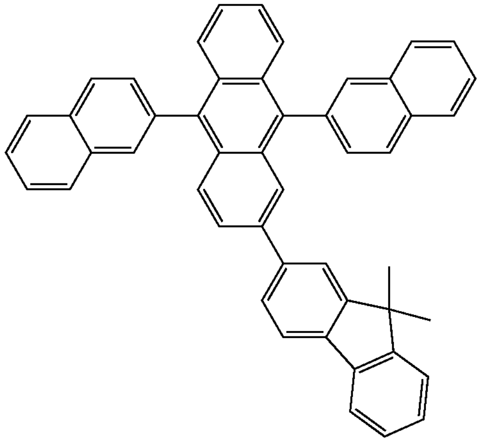

-continued
H24
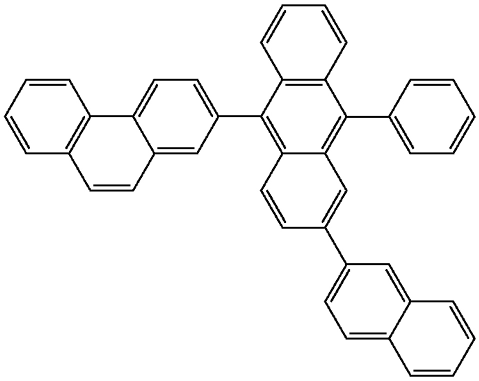
H25
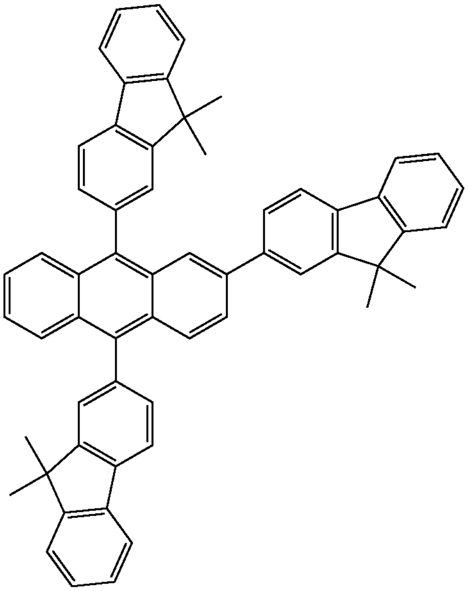
H26
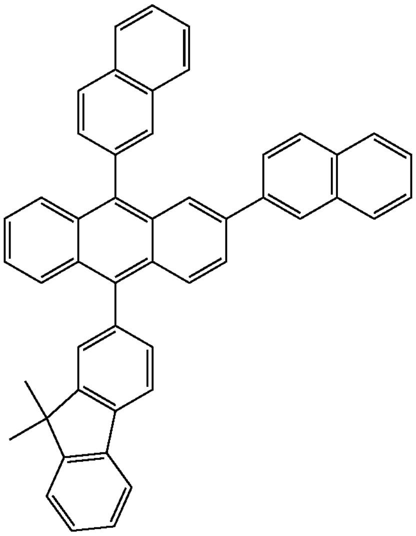
-continued
H27
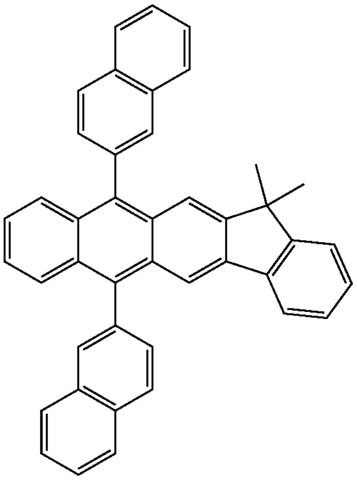
H28
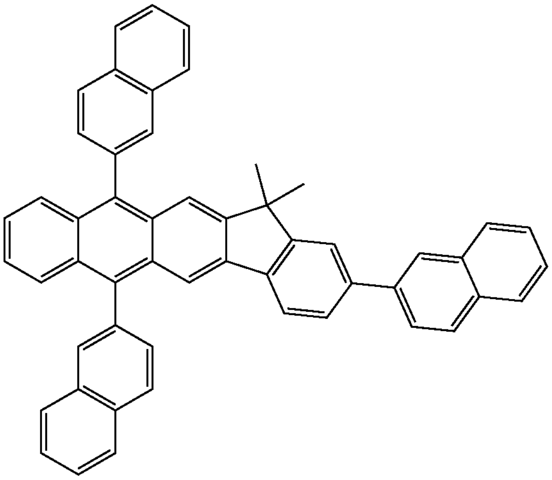
H29
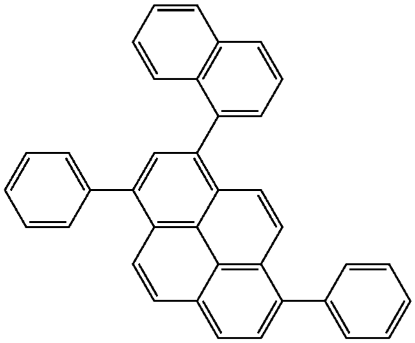

-continued
H30
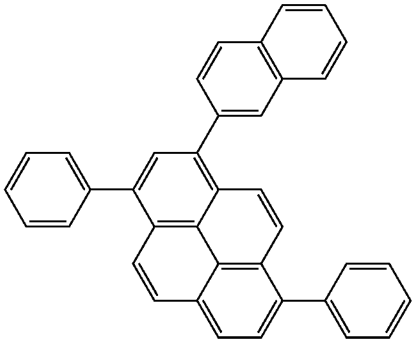
H31
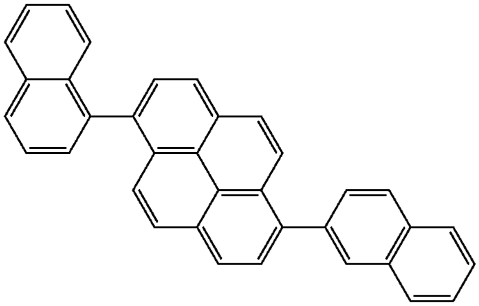
H32
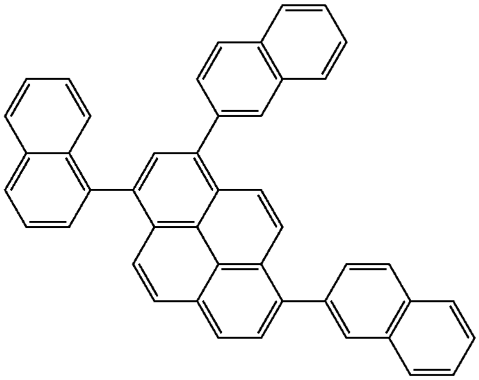
H33
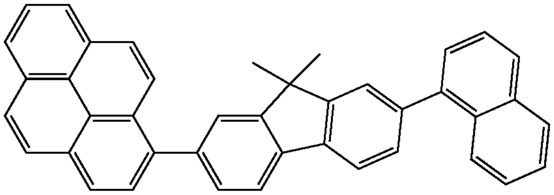
H34
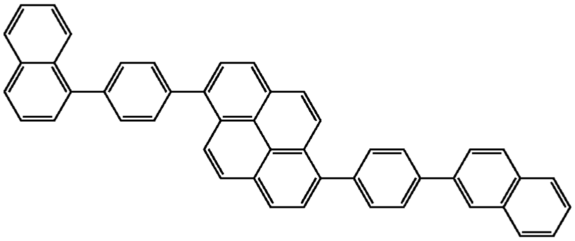
-continued
H35
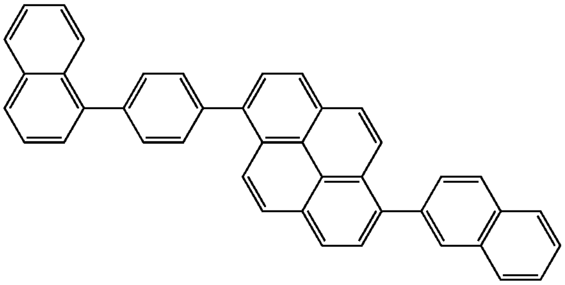
H36
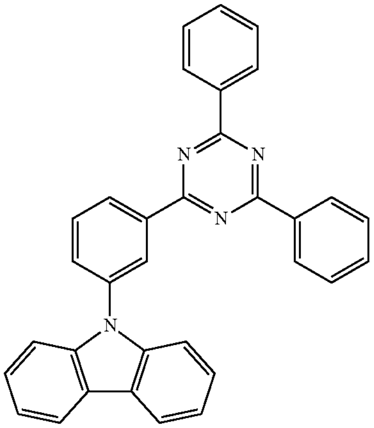
H37
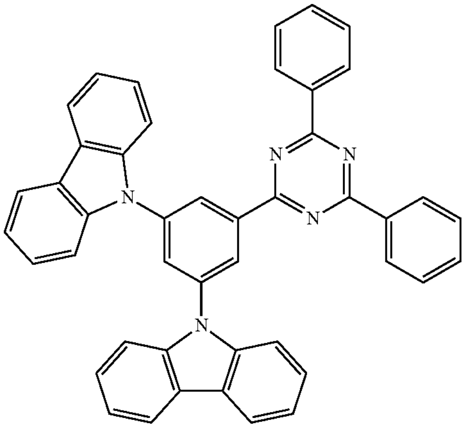
H38
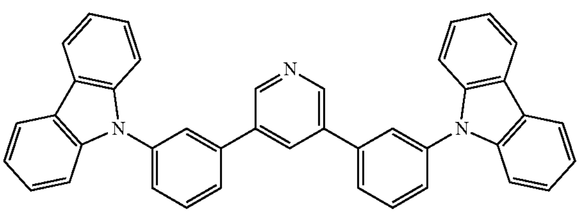

-continued
H39
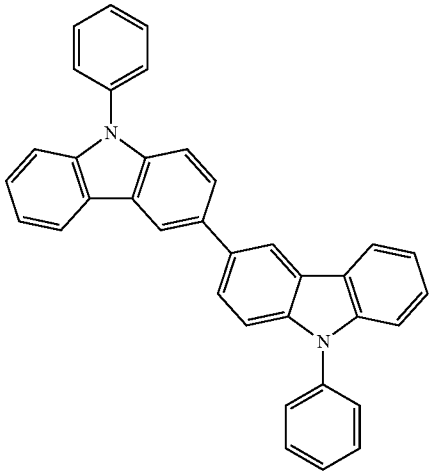
H40
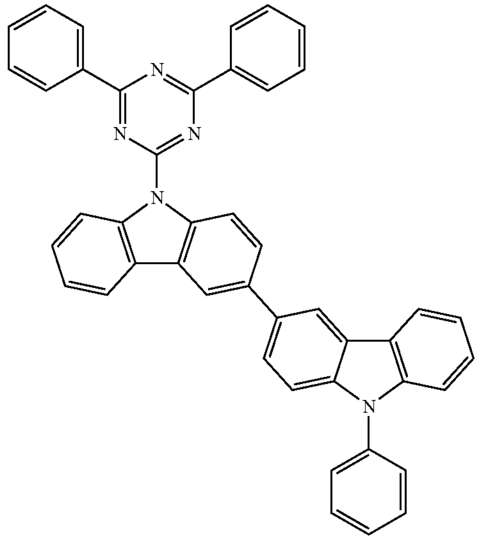
H41
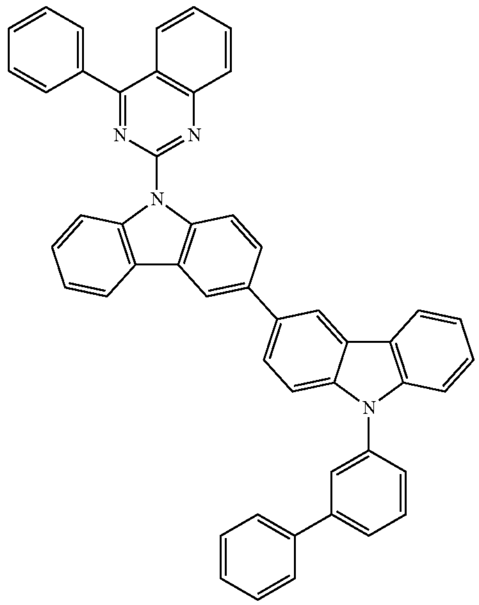
-continued
H42
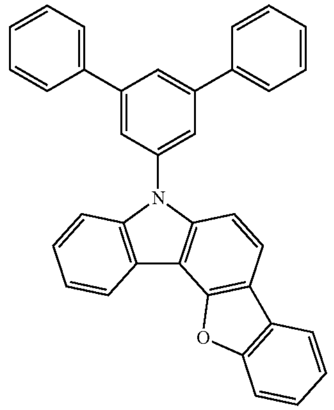
H43
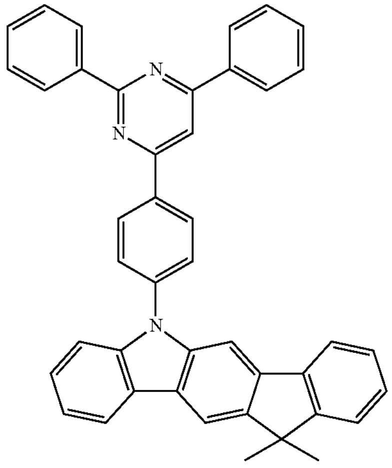
H44
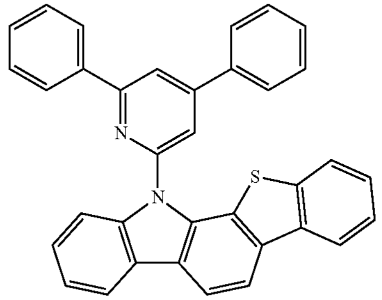
H45
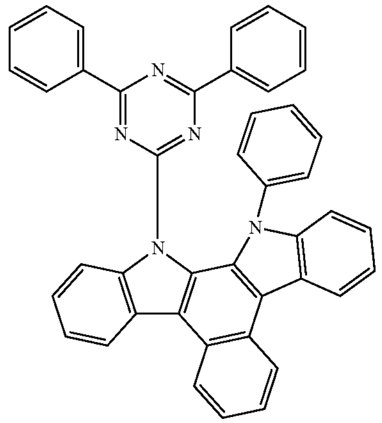

-continued
H46
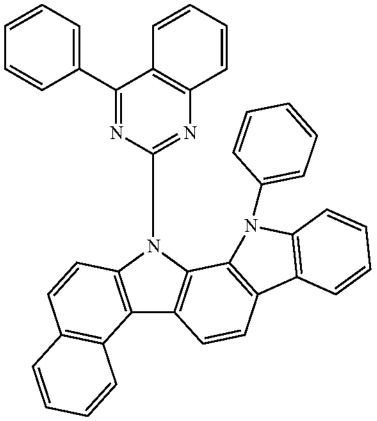
H47
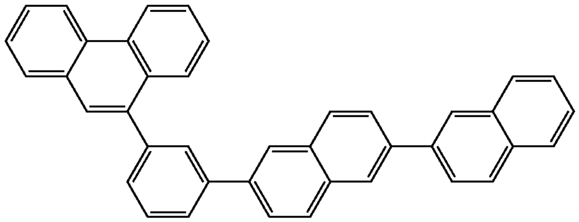
H48
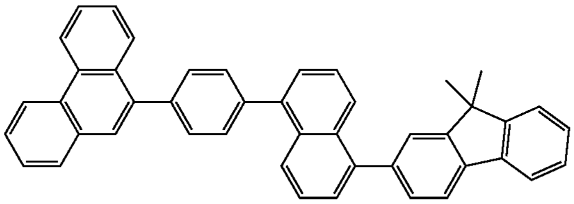
H49
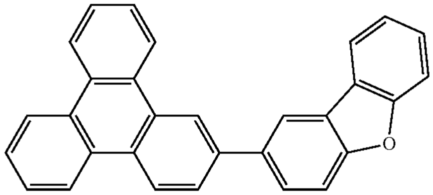
H50
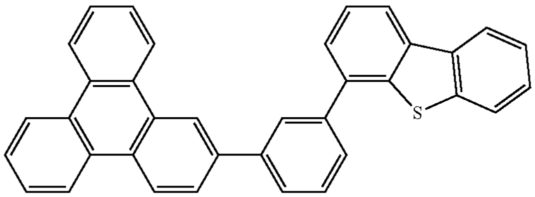
H51
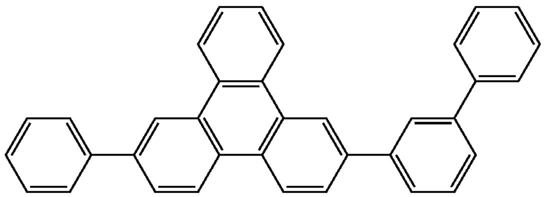
-continued
H52
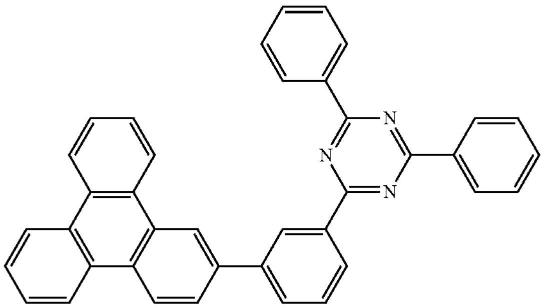
H53
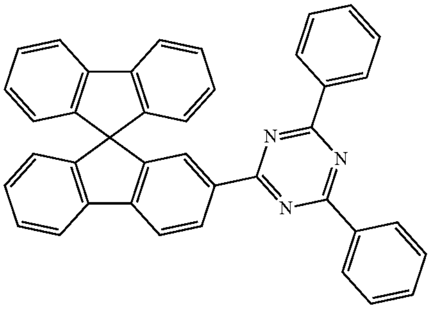
H54
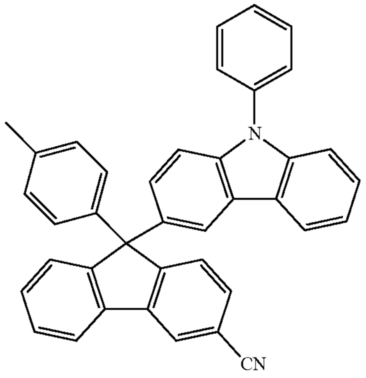
H55
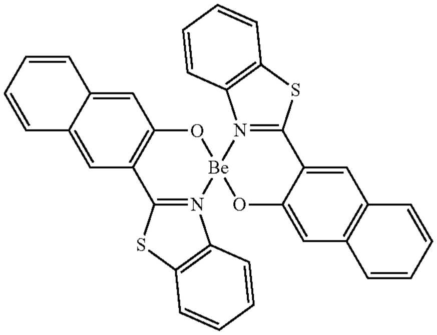

-continued
H56
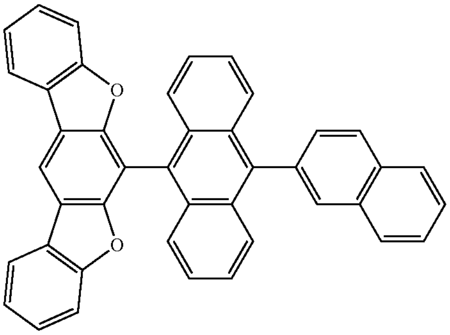
H57
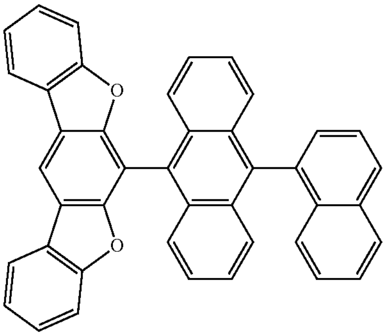
H58
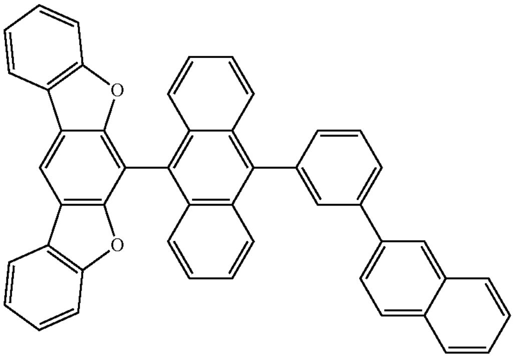
H59
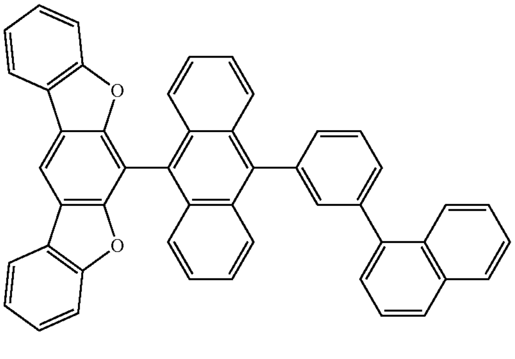
-continued
H60
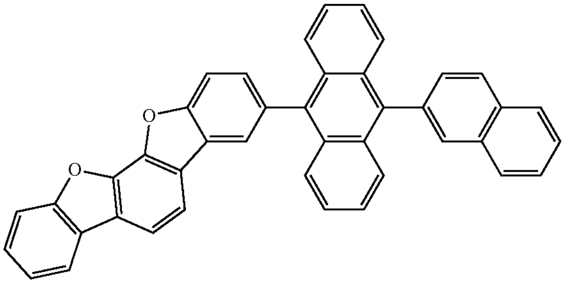
H61
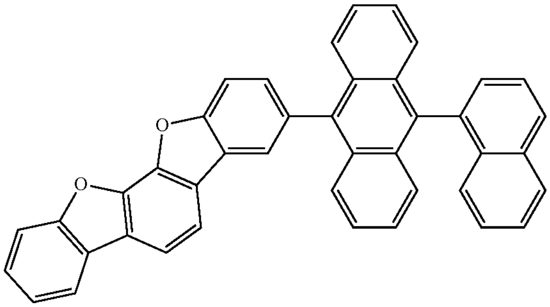
H62
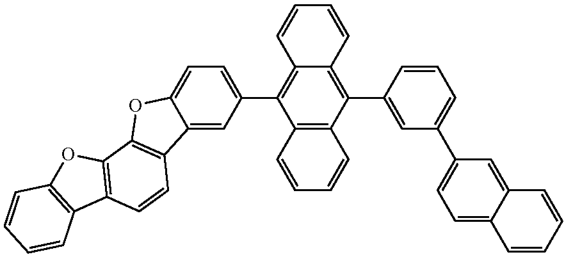
H63
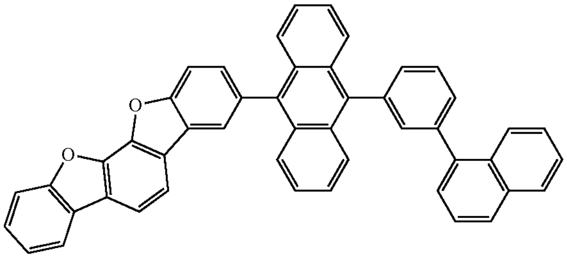
H64
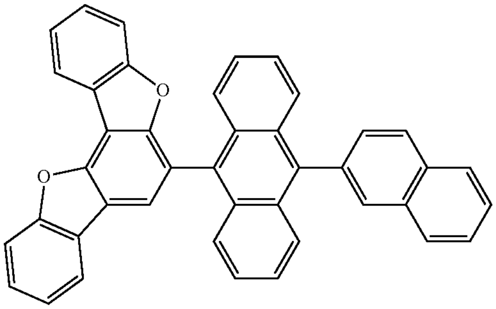

-continued
H65
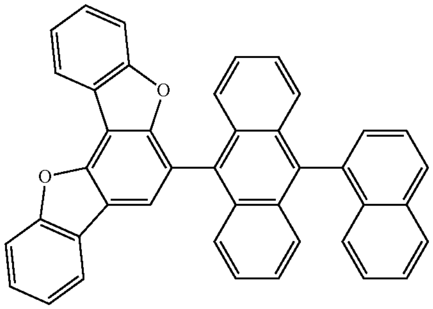
H66
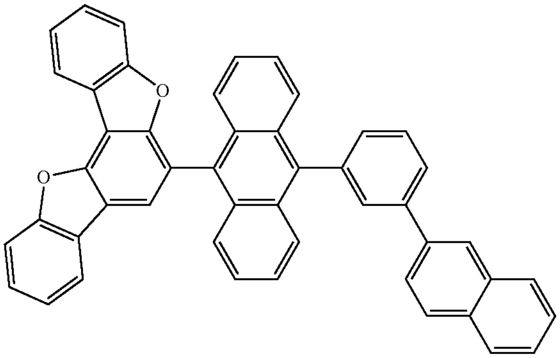
H67
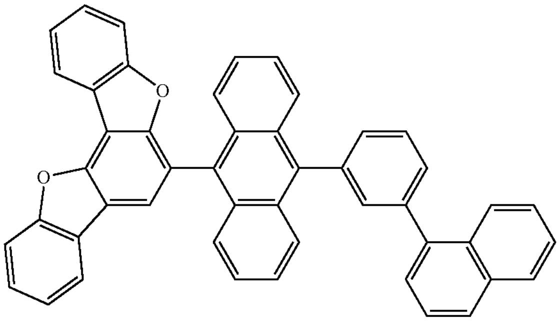
H68
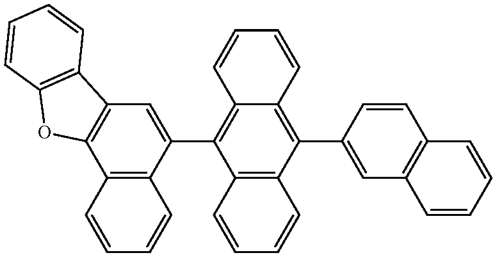
H69
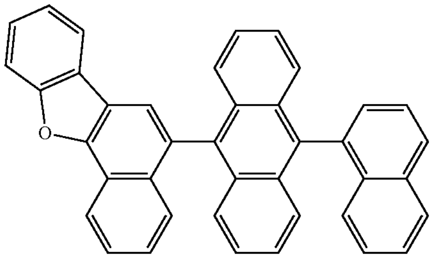
-continued
H70
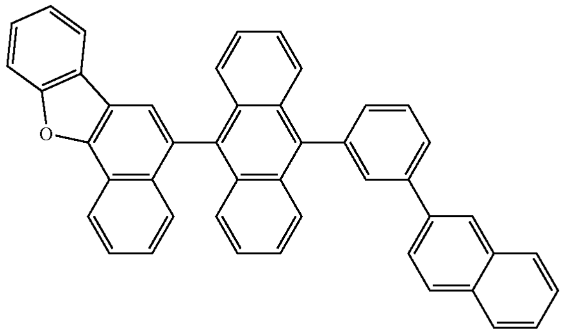
H71
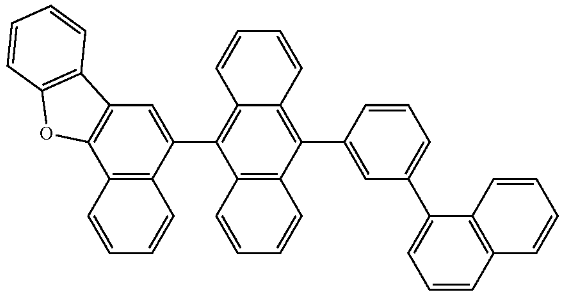
H72
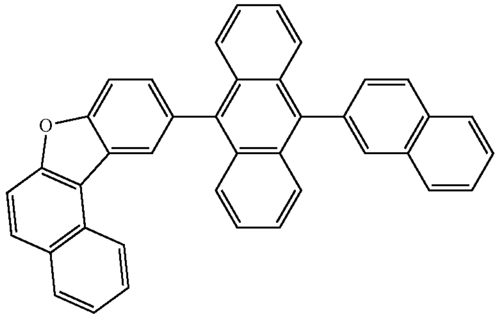
H73
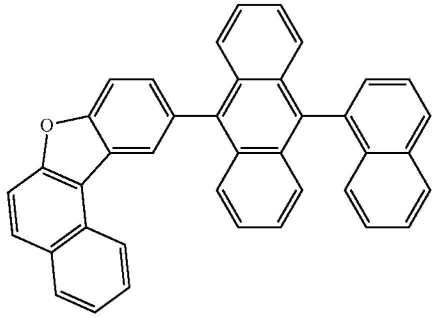

-continued
H74
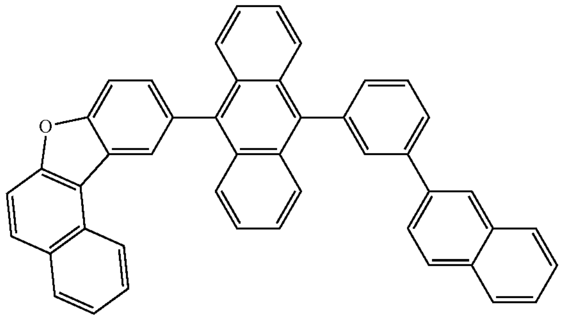
H75
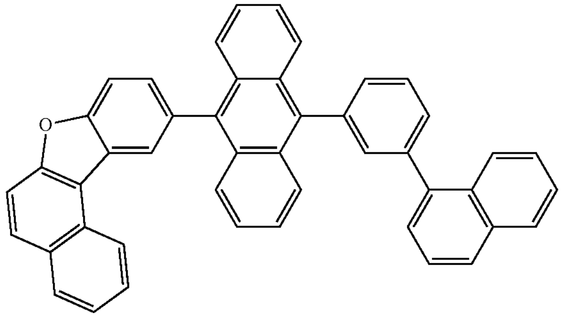
H76
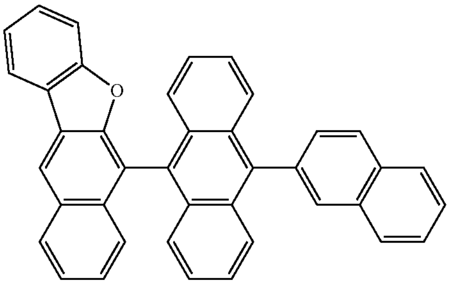
H77
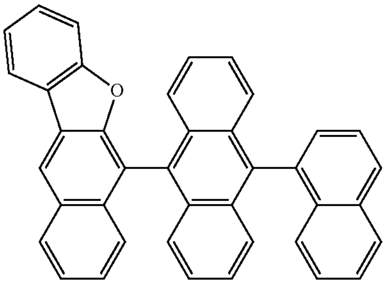
H78
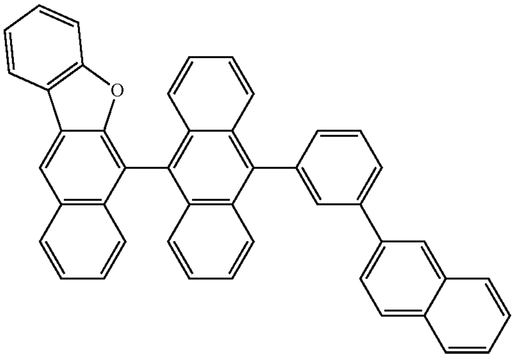
-continued
H79
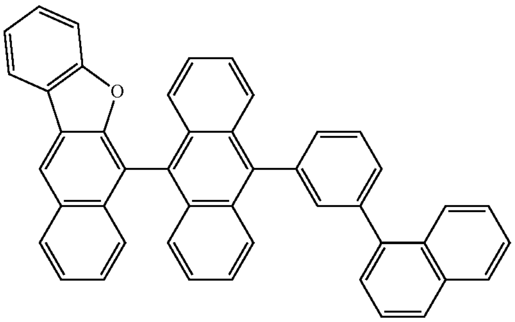
H80
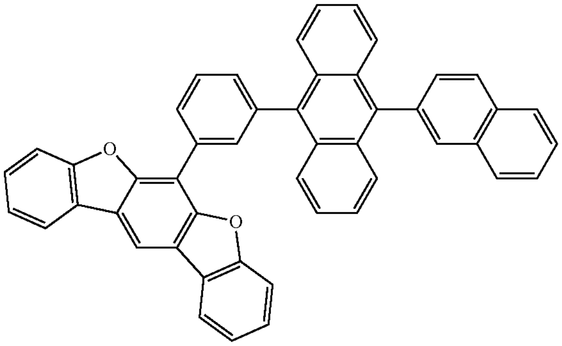
H81
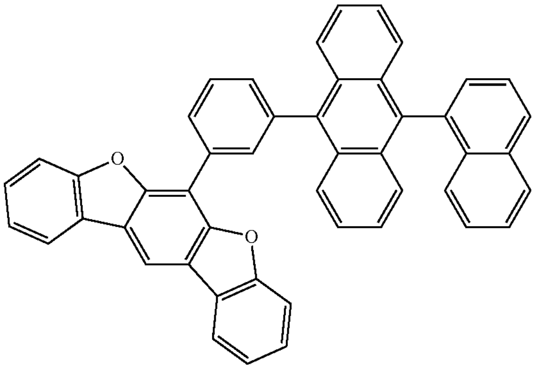
H82
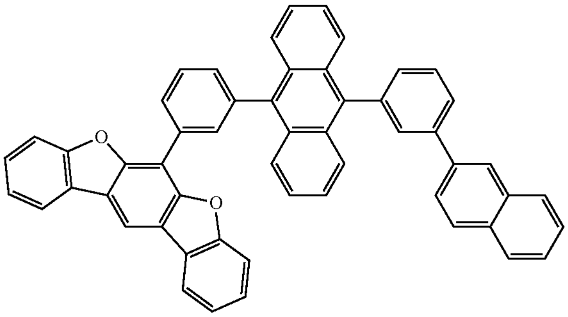

-continued
H83
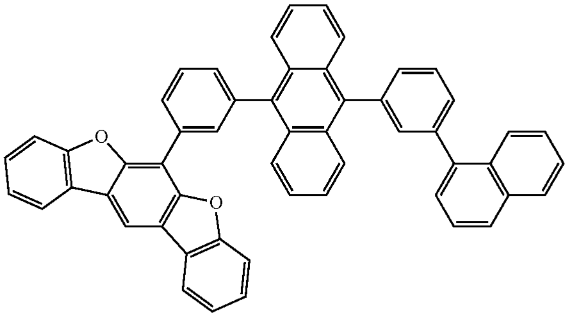
H84
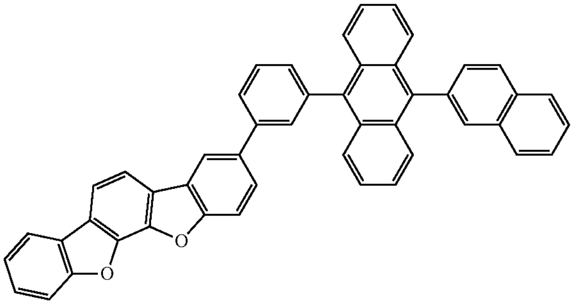
H85
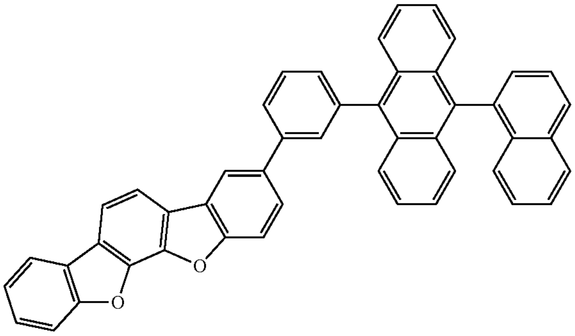
H86
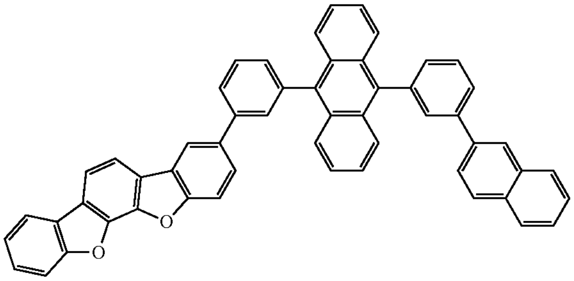
H87
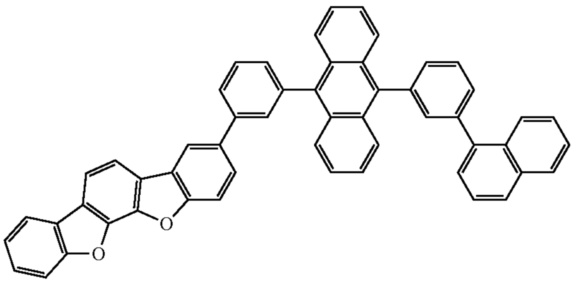
-continued
H88
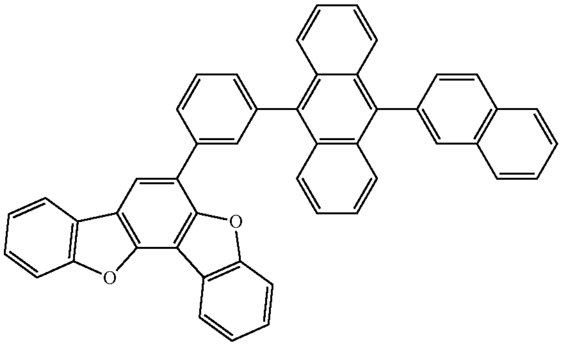
H89
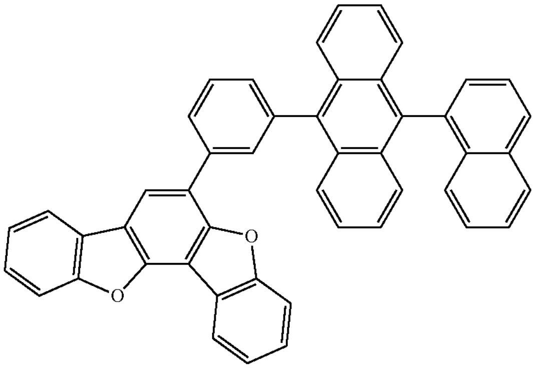
H90
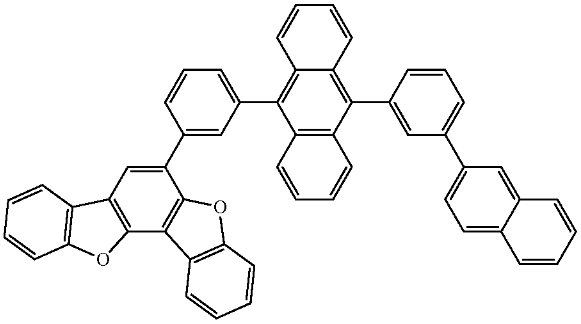
H91
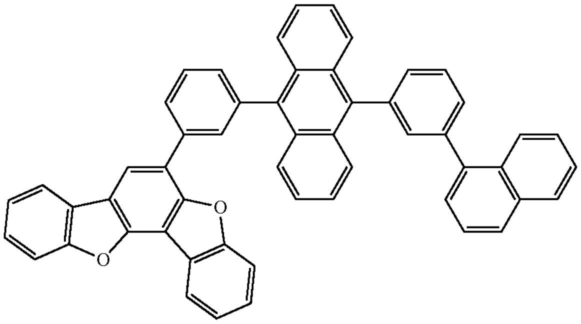

-continued
H92
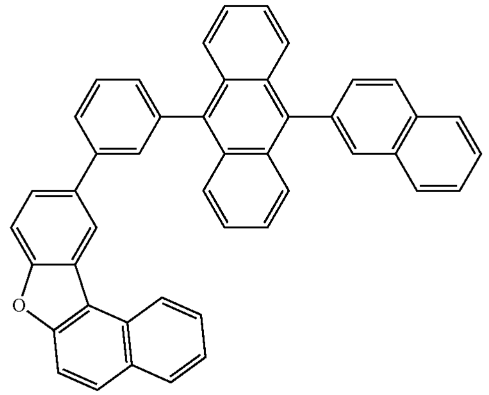
H93
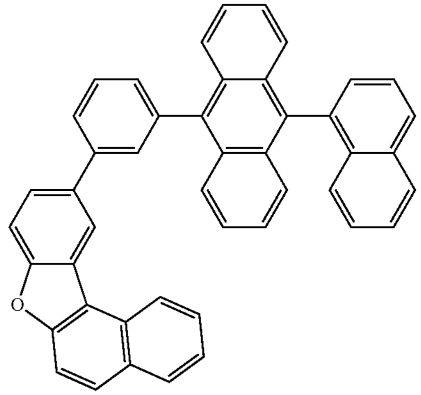
H94
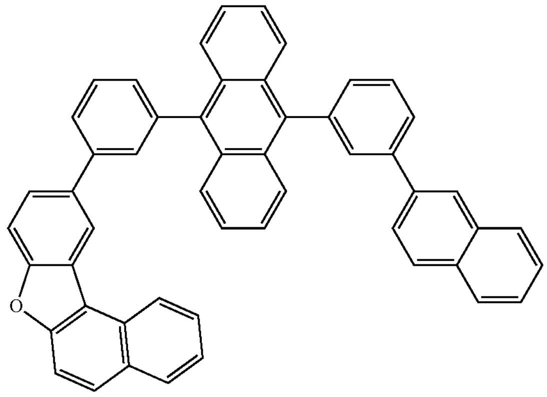
H95
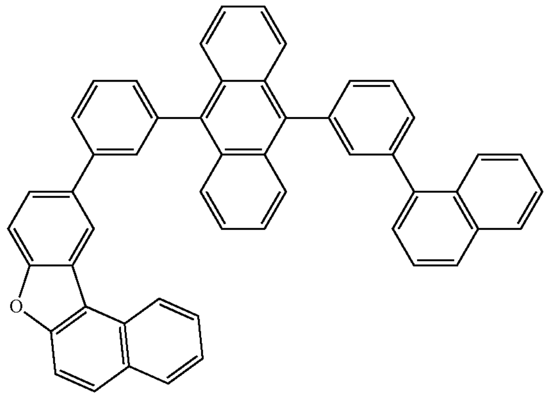
-continued
H96
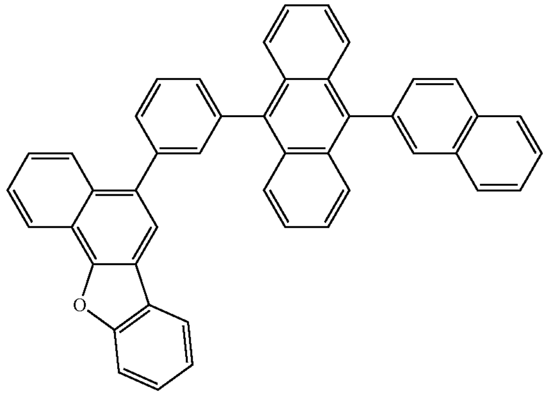
H97
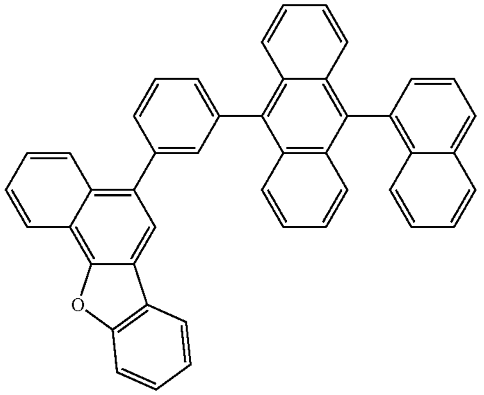
H98
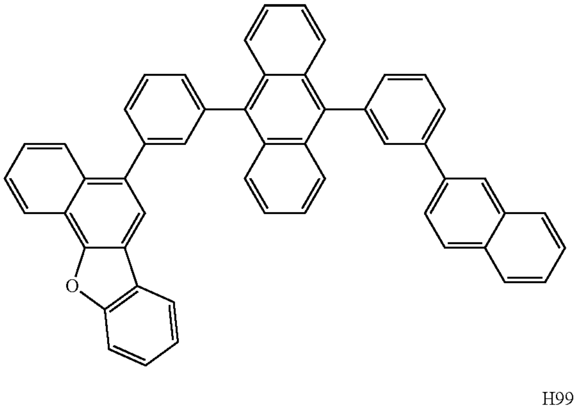
H99
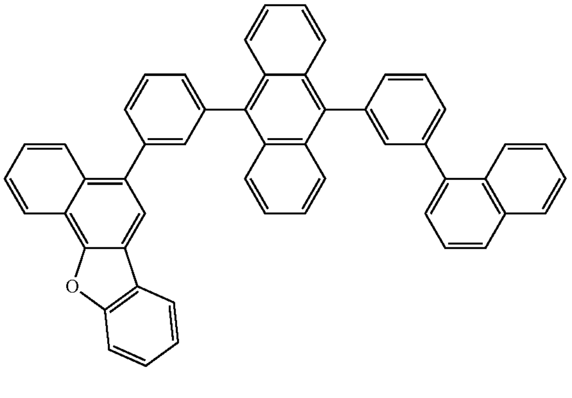

-continued
H100
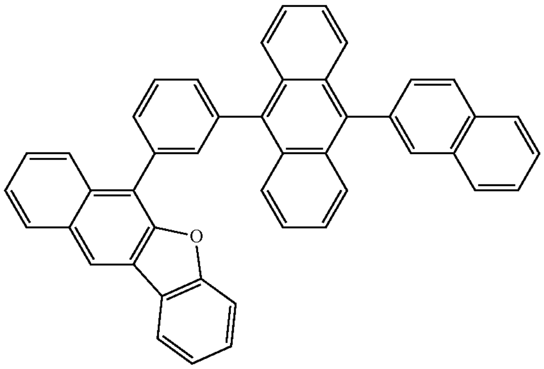
H101
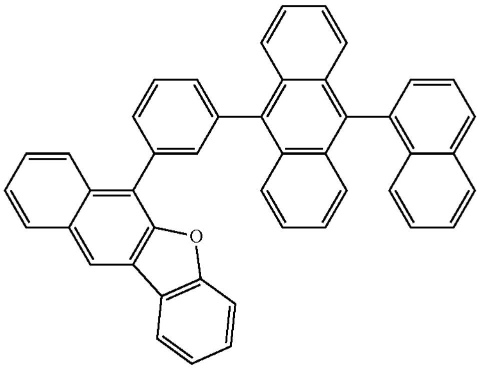
H102
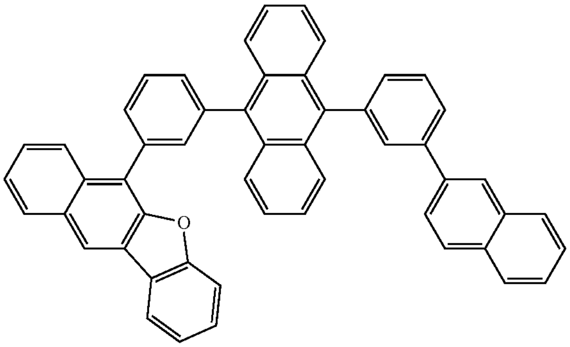
H103
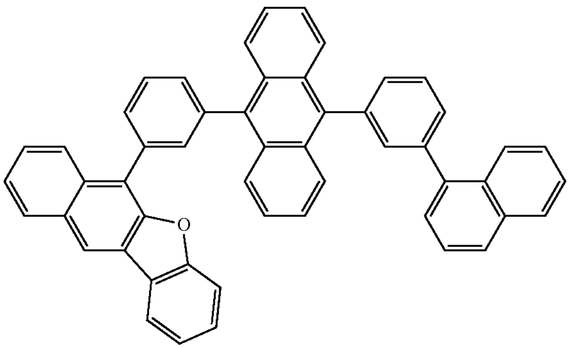
-continued
H104
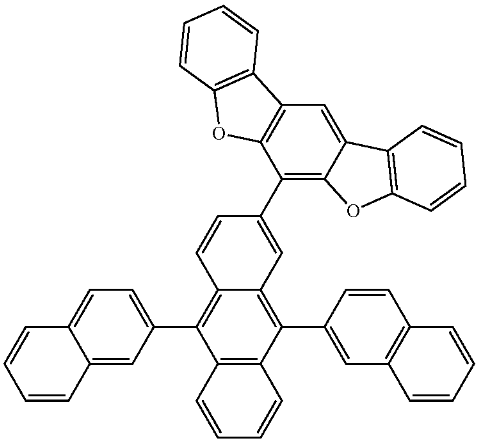
H105
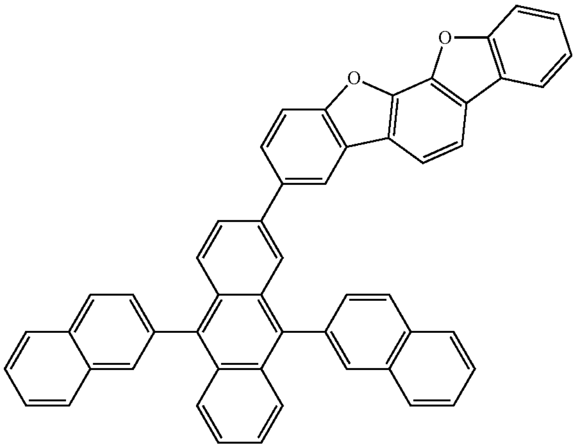
H106
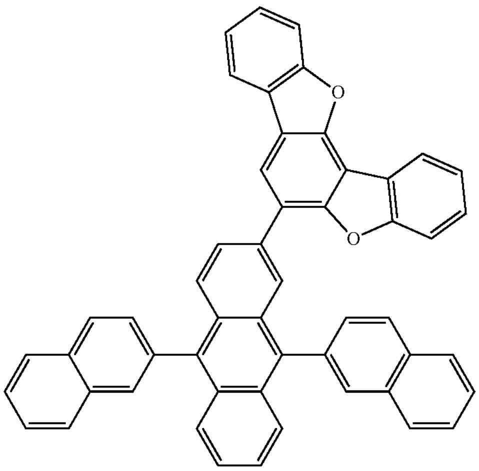

-continued
H107
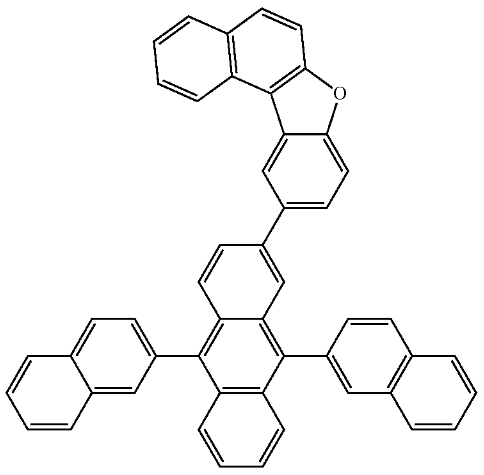
H108
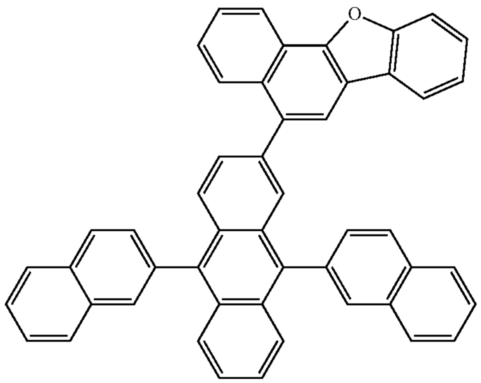
H109
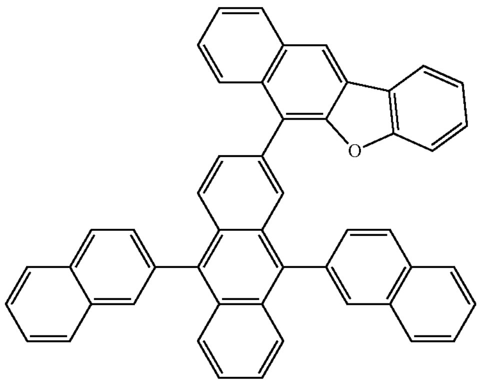
H110
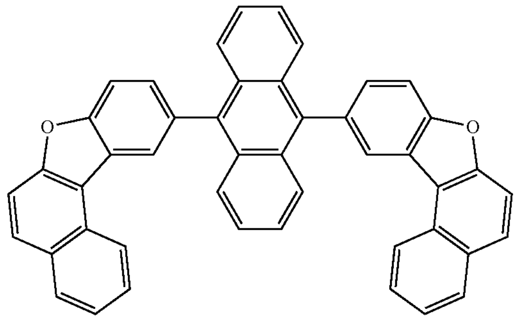
H111
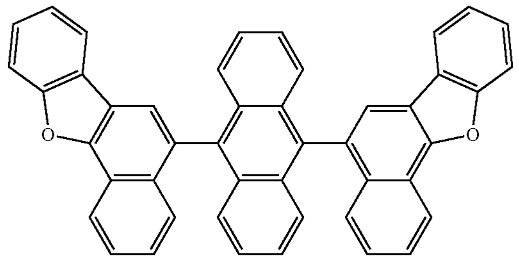
H112
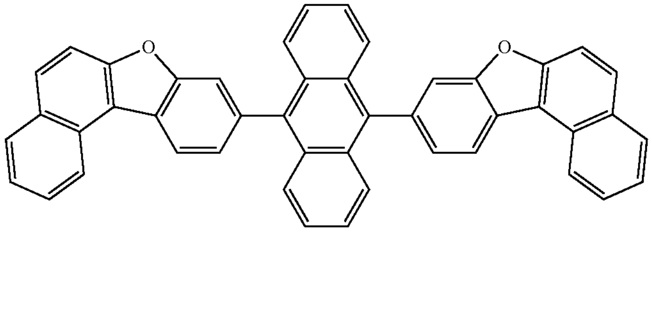

-continued
H113
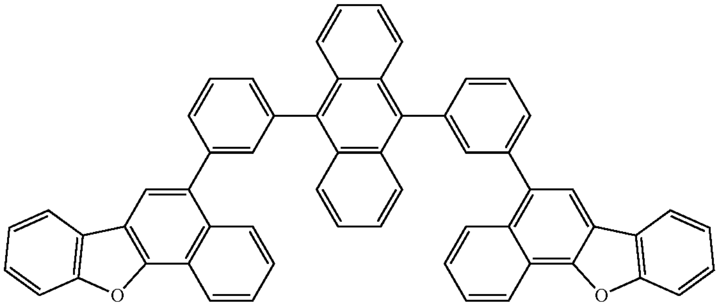
H114
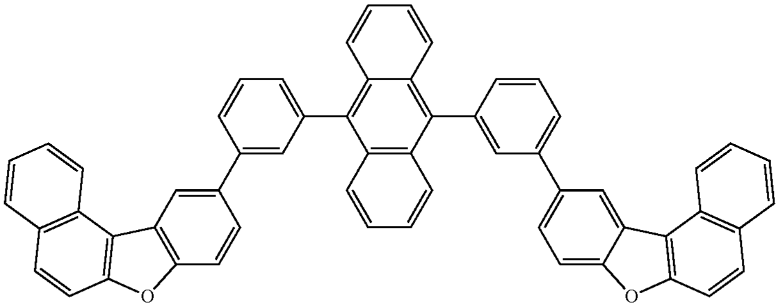
H115
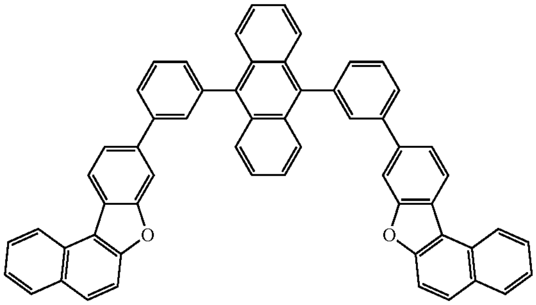
H116
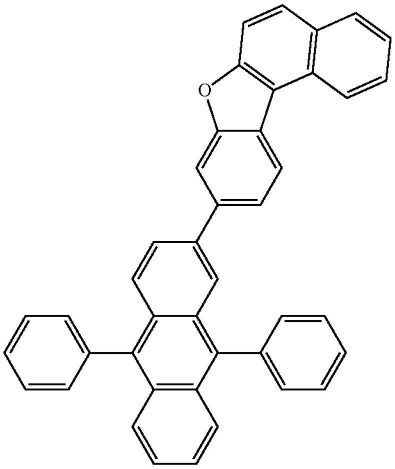
H117
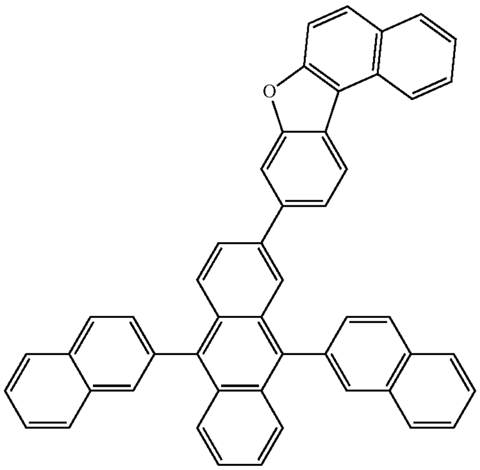
H118
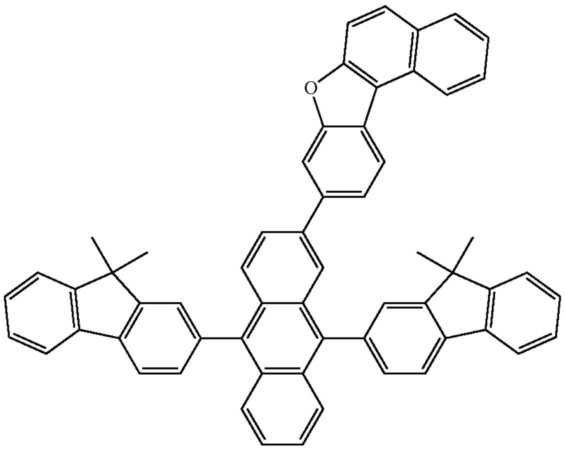

-continued
H119
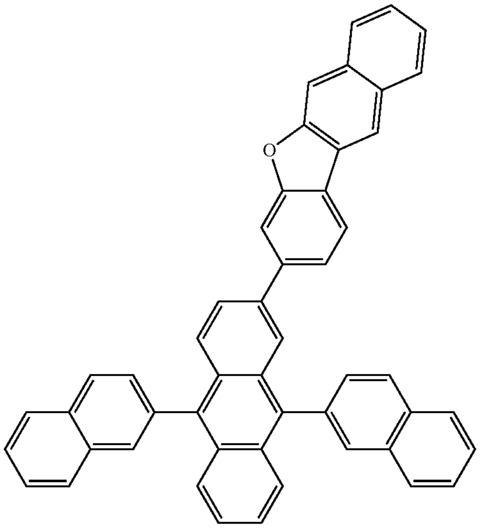
H120
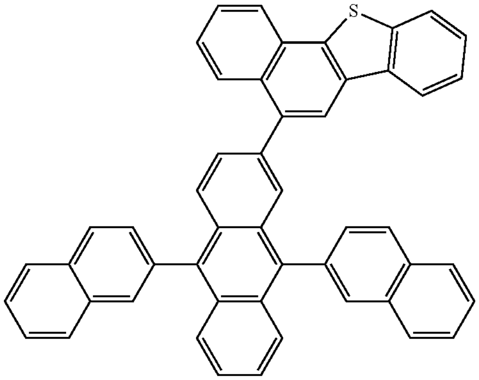
H121
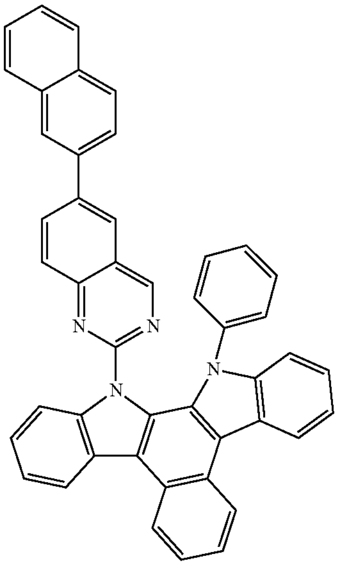
H122
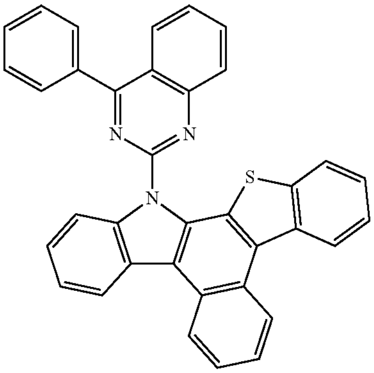
H123
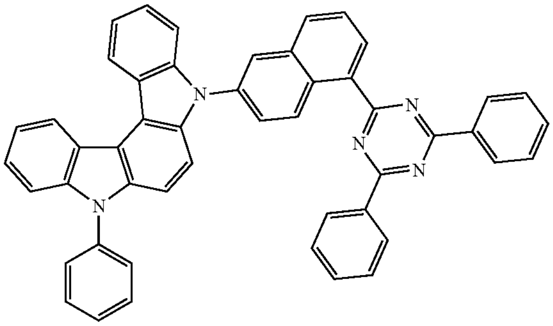
H124
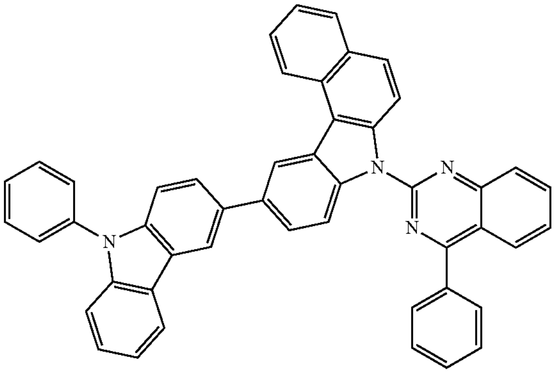

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

[Formula 401]

$M(L_{401})_{xc1}(L_{402})_{xc2}$

[Formula 402]

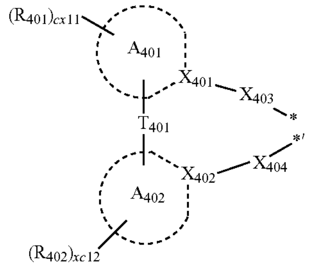

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_4O_2$ may each independently be nitrogen (N) or carbon (C), ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $R_{10a}$ may be understood by referring to the description of $R_{10a}$ provided herein, $Q_{401}$ to $Q_{403}$ may each independently be the same as described in connection with $Q_1$, xc11 and xc12 may each independently be an integer from 0 to 10, and

* and *' each indicates a binding site to a neighboring atom, * and *' in Formula 402 each indicates a binding site to M in Formula 401.

In an embodiment, in Formula 402, $X_{401}$ may be nitrogen and $X_{402}$ may be carbon, or each of $X_{401}$ and $X_{402}$ may be nitrogen.

In an embodiment, when xc1 in Formula 401 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

PD1

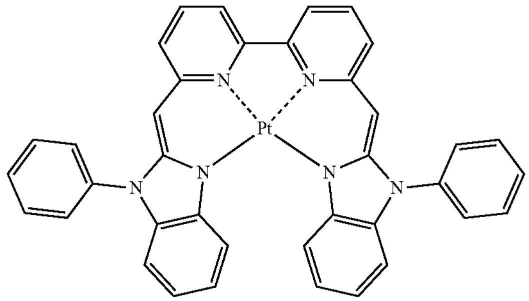

PD2

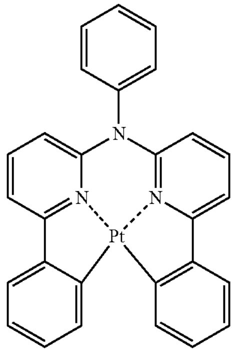

PD3

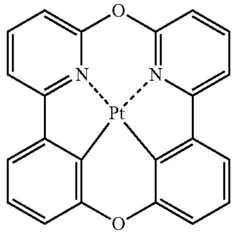

-continued
PD4
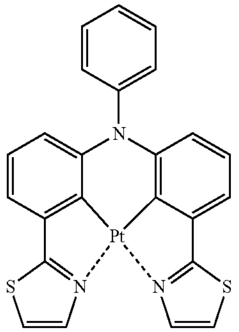
PD5
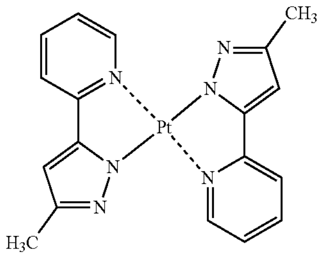
PD6
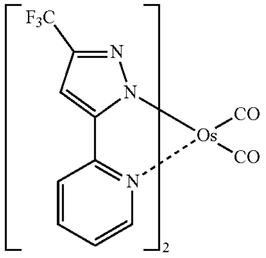
PD7
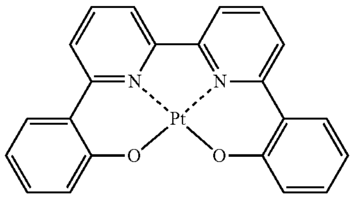
PD8
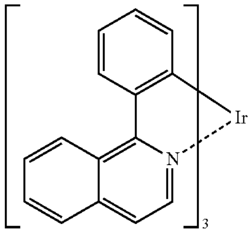
PD9
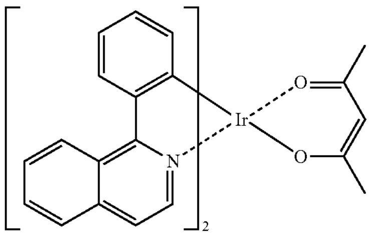
-continued
PD10
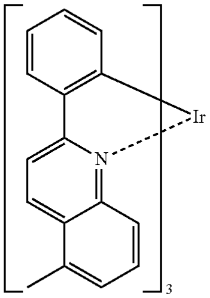
PD11
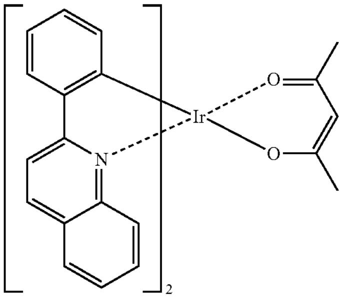
PD12
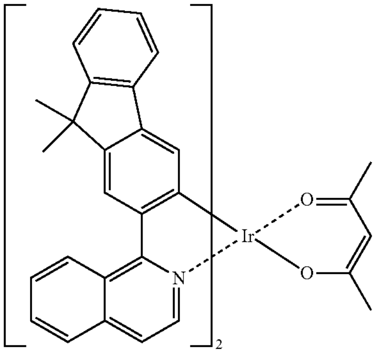
PD13
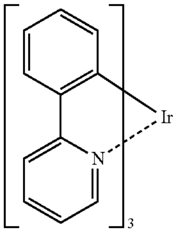
PD14
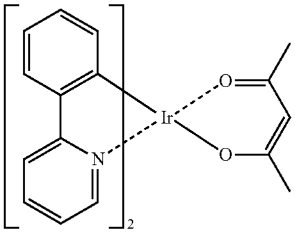

-continued
PD15
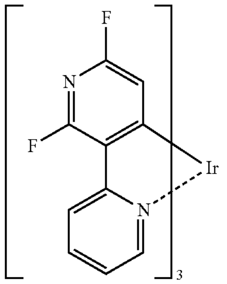
PD16
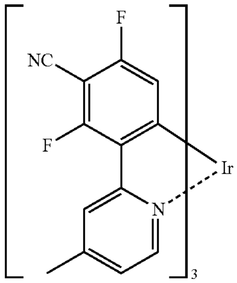
PD17
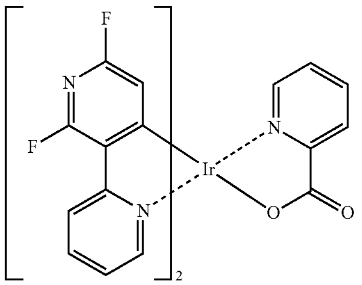
PD18
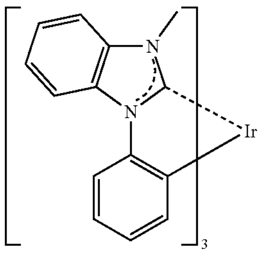
PD19
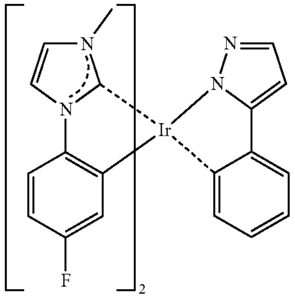
-continued
PD20
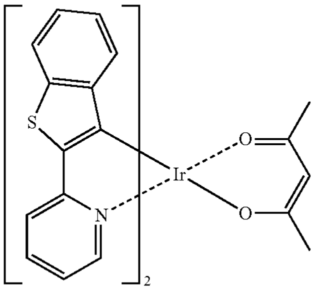
PD21
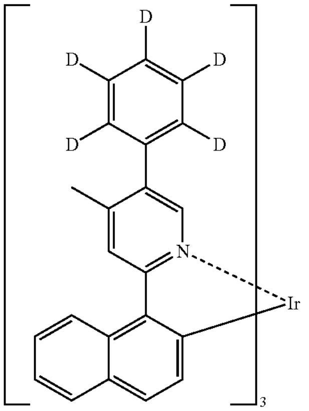
PD22
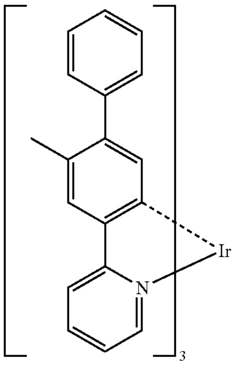
PD23
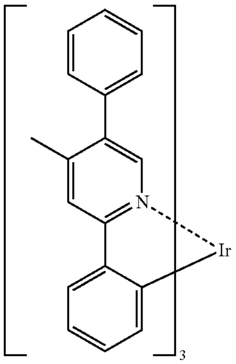

-continued

PD24

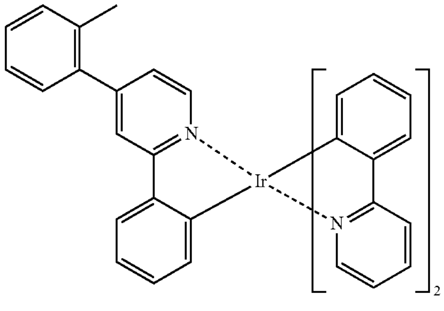

PD25

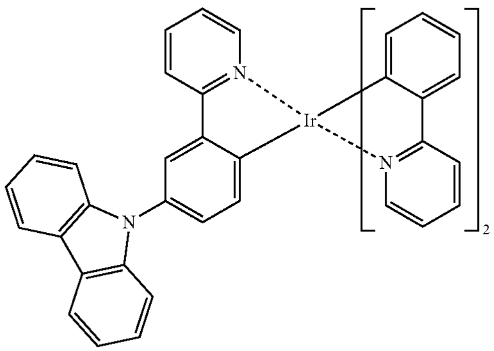

[Fluorescent Dopant]

The fluorescent dopant may include an amine group-containing compound, a styryl group-containing compound, or any combination thereof.

In an embodiment, the fluorescent dopant may include a compound represented by Formula 501:

[Formula 501]

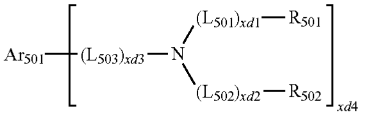

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

In embodiments, the fluorescent dopant may include one of Compounds FD1 to FD36, DPVBi, DPAVBi, or any combination thereof:

FD1

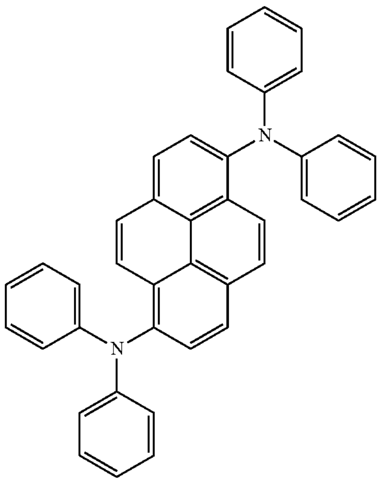

FD2

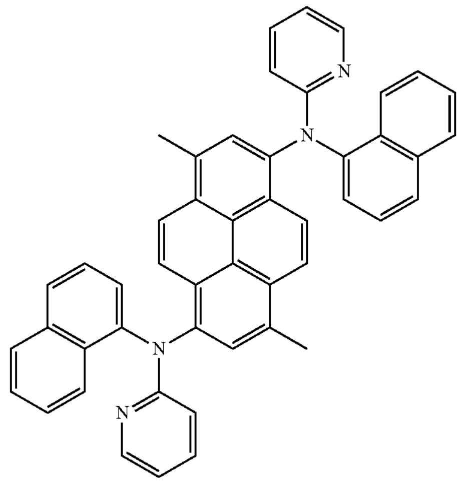

-continued
FD3
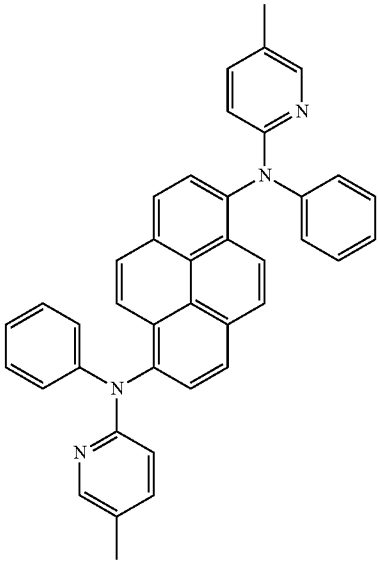
FD4
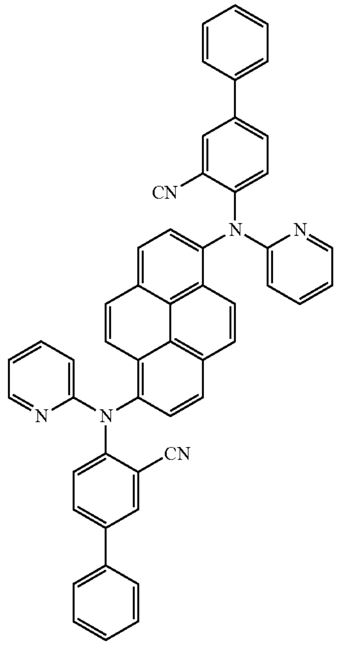
FD5
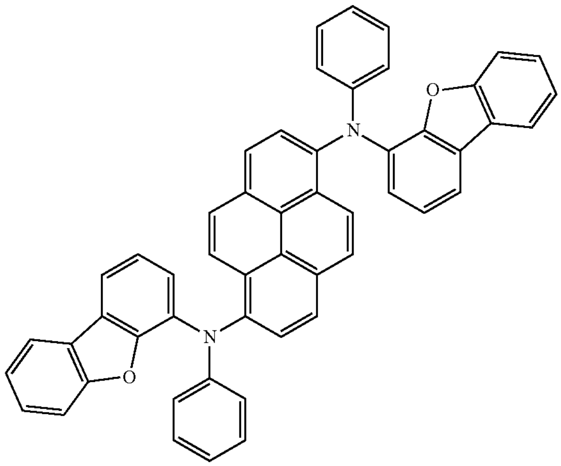
FD6
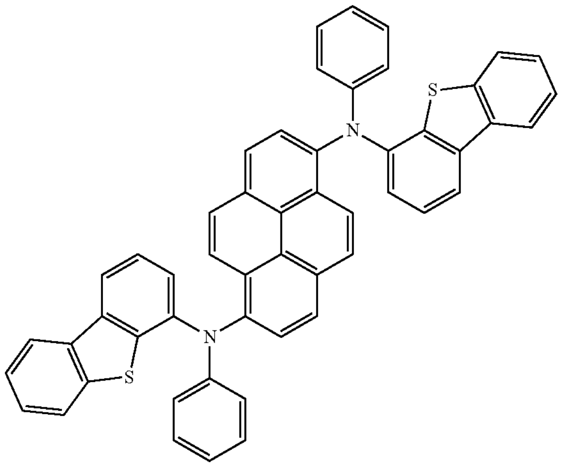

-continued
FD7
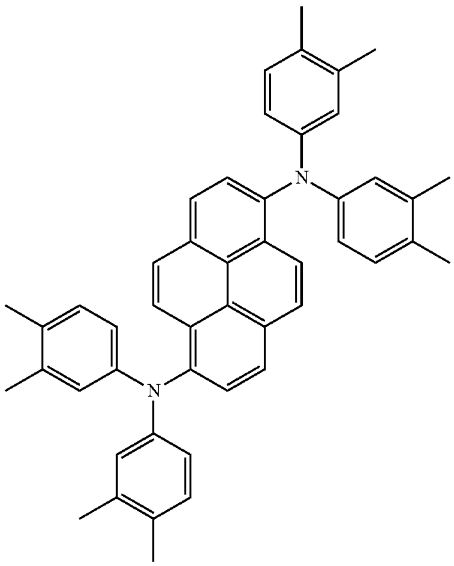
FD8
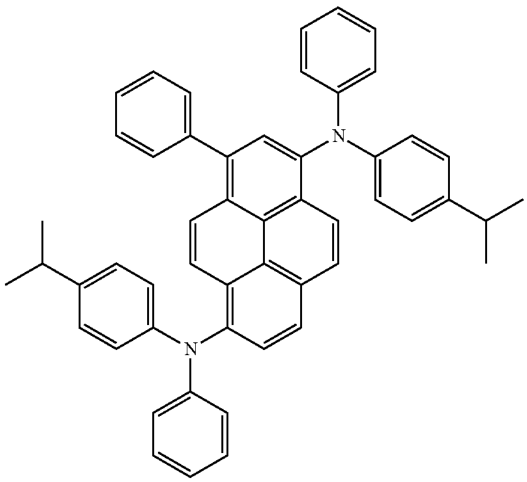
FD9
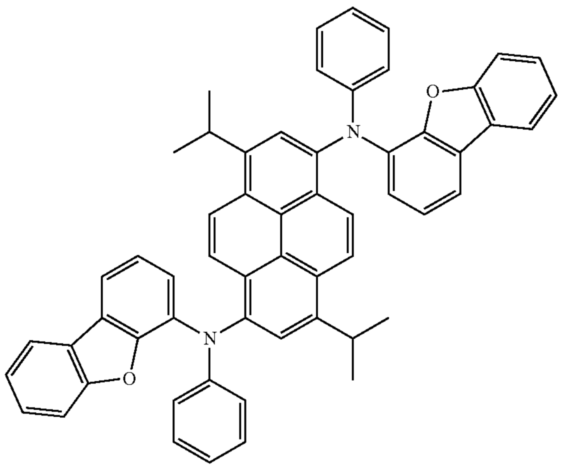
FD10
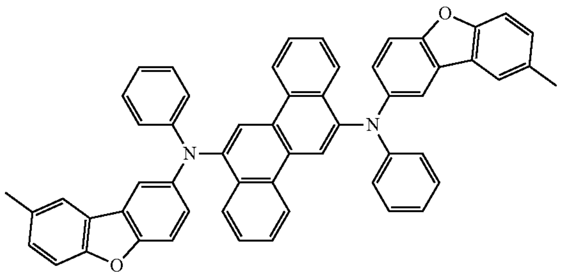
FD11
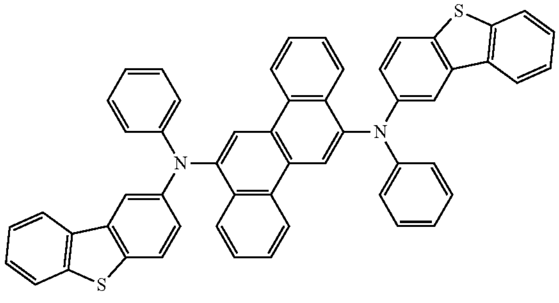
FD12
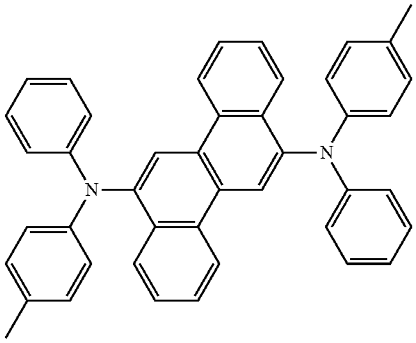

-continued
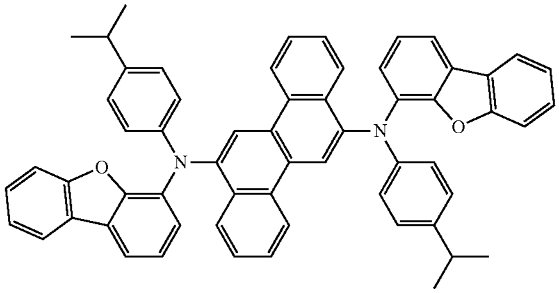
FD13
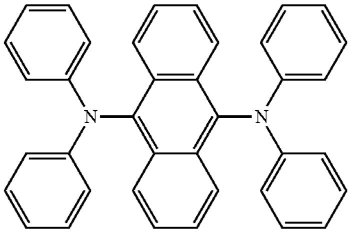
FD14
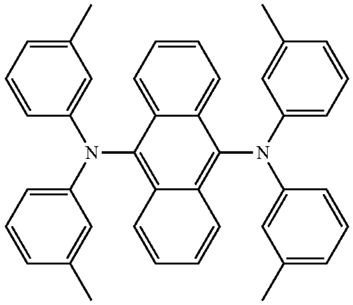
FD15
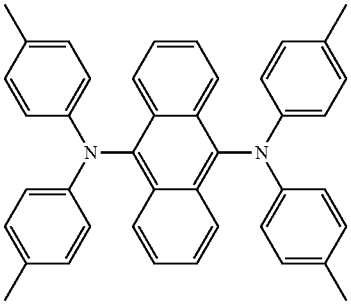
FD16
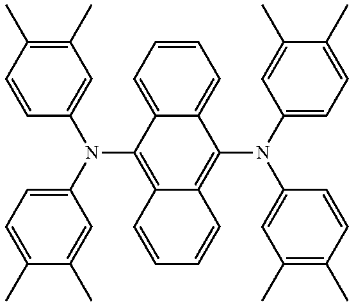
FD17
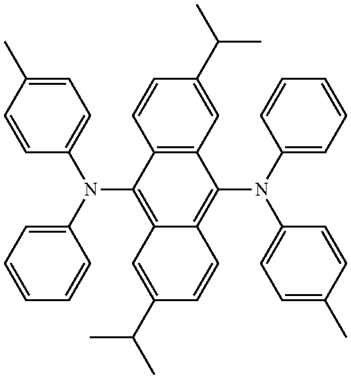
FD18
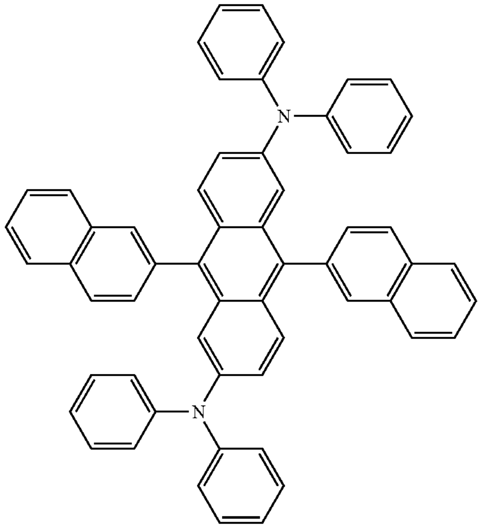
FD19
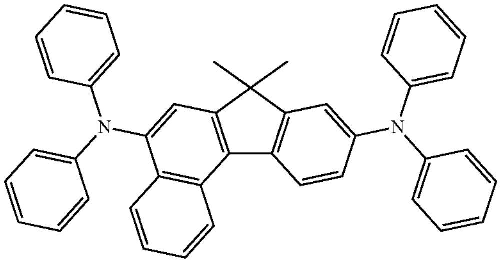
FD20

-continued
FD21
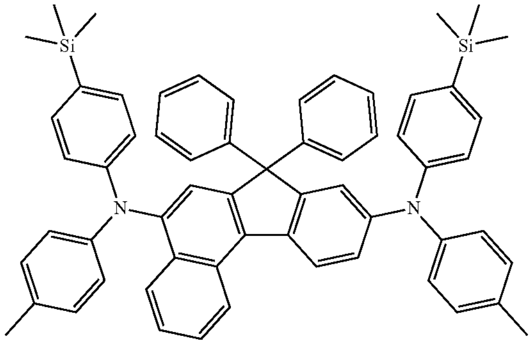
FD22
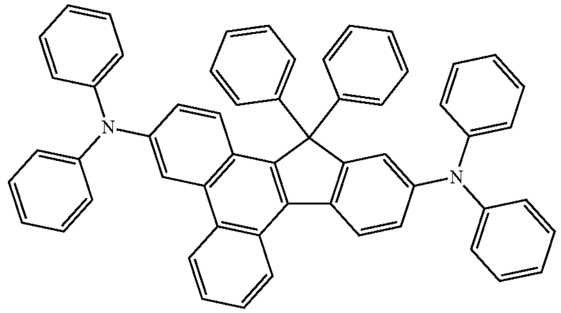
FD23
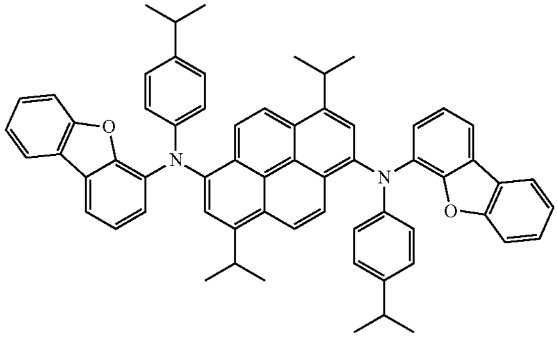
FD24
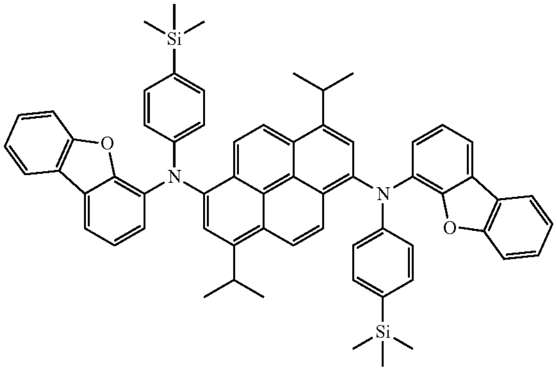
FD25
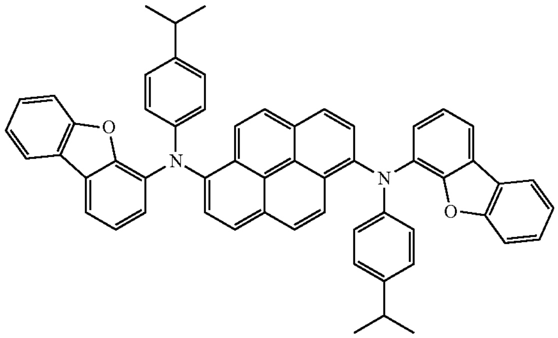
FD26
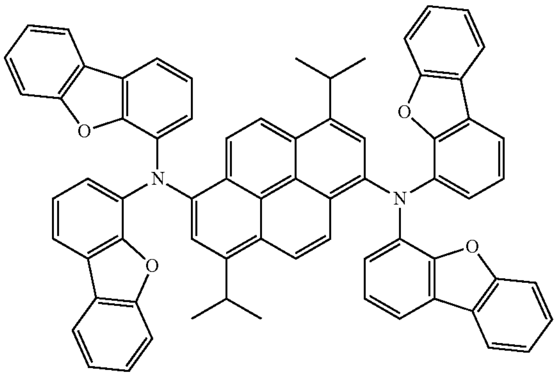
FD27
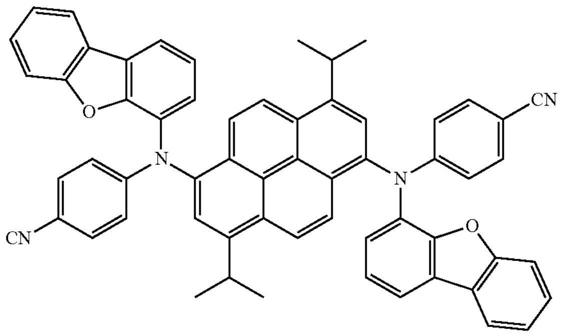
FD28
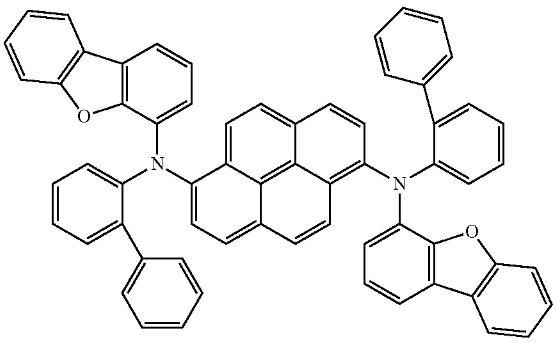

-continued
FD29
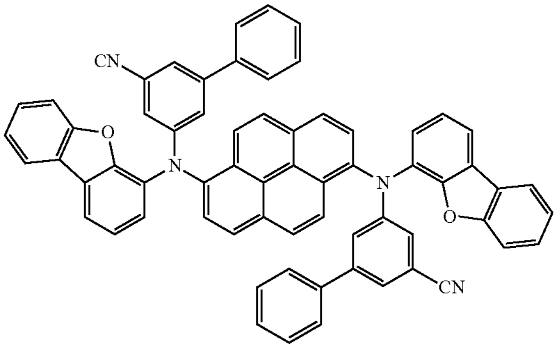
FD30
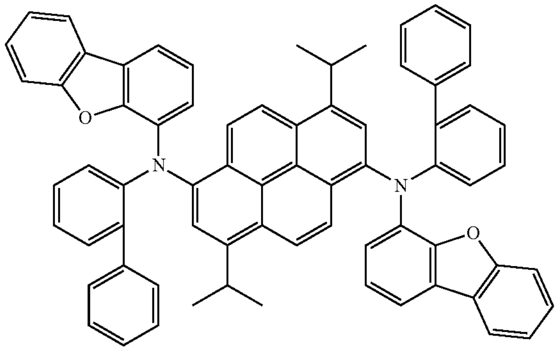
FD31
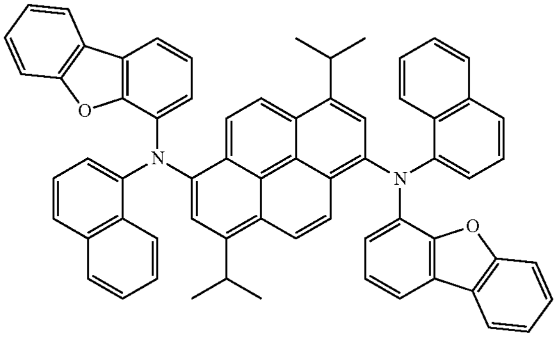
FD32
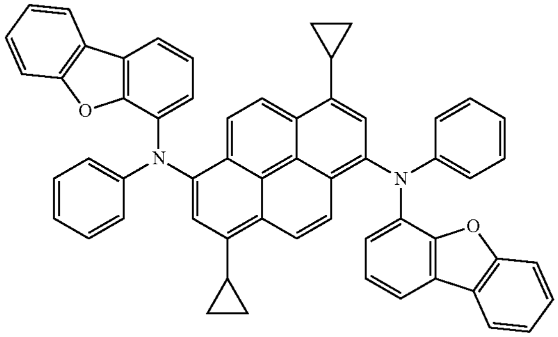
FD33
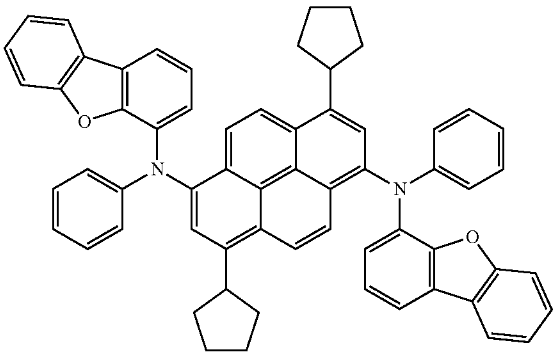
FD34
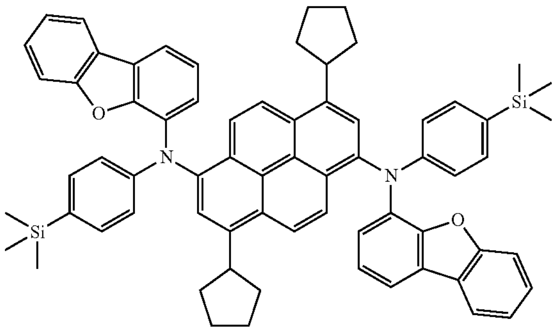
FD35
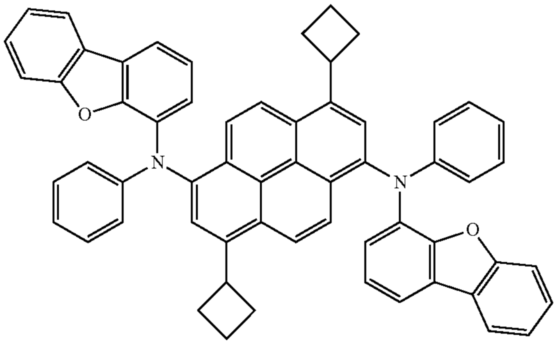
FD36
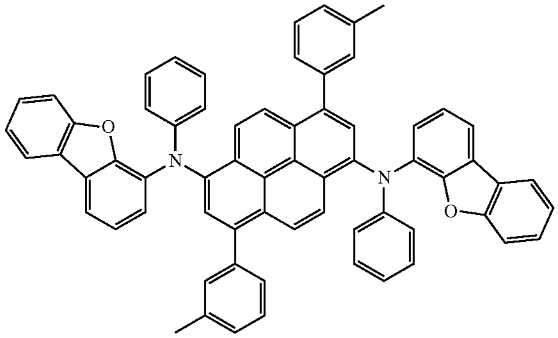

-continued

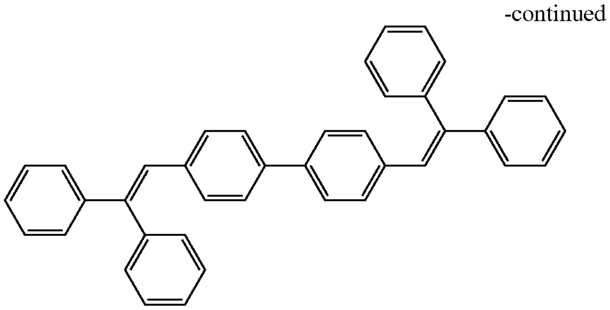

DPVBi

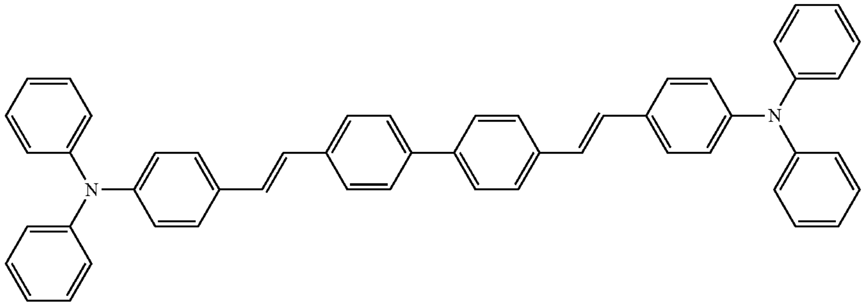

DPAVBi

[Delayed Fluorescence Dopant]

The emission layer may include a delayed fluorescence dopant.

In the specification, the delayed fluorescence dopant may be selected from compounds capable of emitting delayed fluorescence based on a delayed fluorescence emission mechanism.

The delayed fluorescence dopant included in the emission layer may act as a host or a dopant depending on the type of other materials included in the emission layer.

In embodiments, a difference between a triplet energy level (eV) of the delayed fluorescence dopant and a singlet energy level (eV) of the delayed fluorescence dopant may be in a range of about 0 eV to about 0.5 eV. When the difference between the triplet energy level (eV) of the delayed fluorescence dopant and the singlet energy level (eV) of the delayed fluorescence dopant satisfies the above-described range, up-conversion from the triplet state to the singlet state of the delayed fluorescence dopant may effectively occur, and thus, the luminescence efficiency of the light-emitting diode 10 may be improved.

In an embodiment, the delayed fluorescence dopant may include a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and a material including a $C_8$-$C_{60}$ polycyclic group in which two or more cyclic groups are condensed while sharing boron (B).

In an embodiment, the delayed fluorescence dopant may include at least one of the following Compounds DF1 to DF9:

DF1

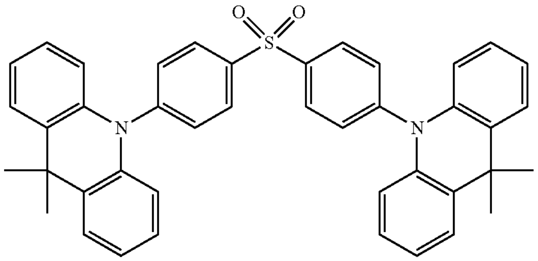

(DMAC-DPS)

DF2

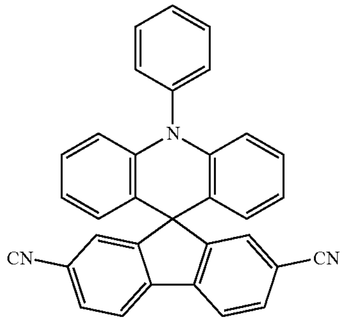

(ACRFLCN)

-continued

DF3

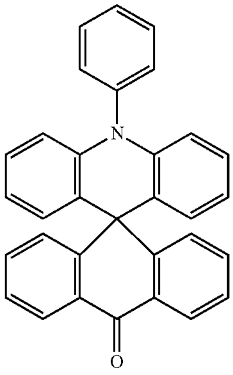

(ACRSA)

DF4

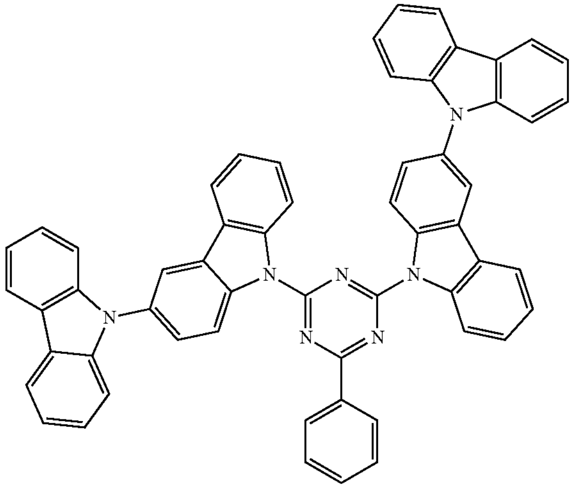

(CC2TA)

DF5

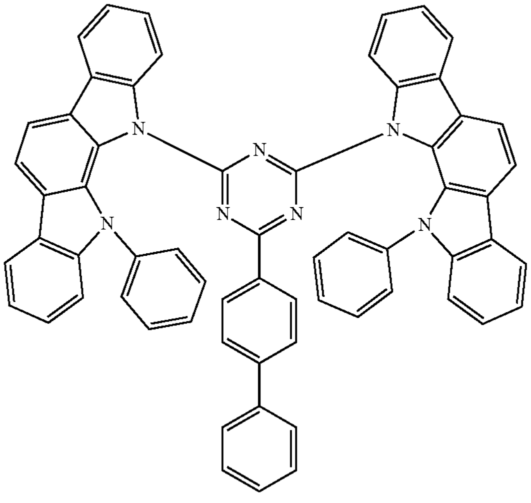

(PIC-TRZ)

-continued

DF6

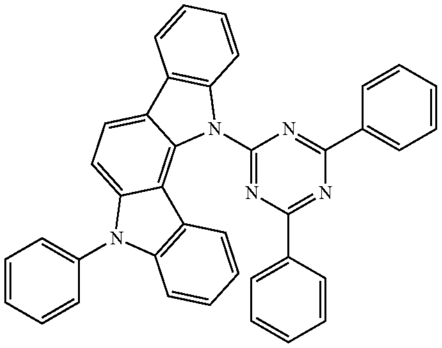

(PIC-TRZ2)

DF7

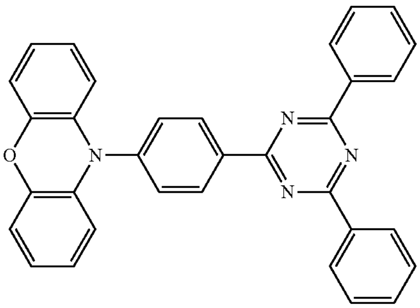

(PXZ-TRZ)

DF8

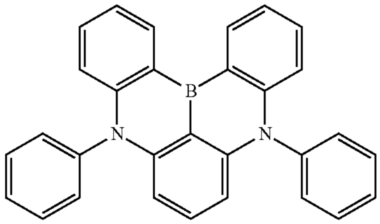

(DABNA-1)

DF9

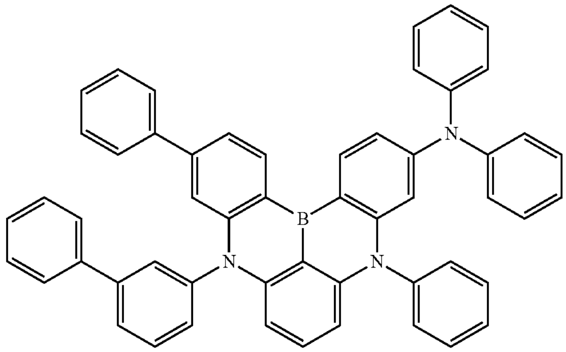

(DABNA-2)

[Quantum Dot]

The emission layer may include a quantum dot.

In the specification, a quantum dot may be a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include Group II elements. Examples of the Group III-V semiconductor compound further including Group II elements may include InZnP, InGaZnP, InAlZnP, and the like.

Examples of the Group III-VI semiconductor compound may include a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof.

Examples of the Group I-III-VI semiconductor compound may include a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

The Group IV element or compound may include a single element material, such as Si or Ge; a binary compound, such as SiC or SiGe; or any combination thereof.

Each element included in a multi-element compound such as the binary compound, the ternary compound, and the quaternary compound, may exist in a particle at a uniform concentration or at a non-uniform concentration.

In an embodiment, the quantum dot may have a single structure or a core-shell structure. In the case of the quantum dot having a single structure, the concentration of each element included in the corresponding quantum dot may be uniform. In an embodiment, the material contained in the core and the material contained in the shell may be different from each other.

The shell of the quantum dot may be a protective layer that prevents chemical degeneration of the core to maintain semiconductor characteristics and/or may be a charging layer to impart electrophoretic characteristics to the quantum dot. The shell may be a single layer or a multi-layer. The element presented in the interface between the core and the shell of the quantum dot may have a concentration gradient that decreases toward the core of the quantum dot.

Examples of the shell of the quantum dot may include an oxide of metal, an oxide of a metalloid, an oxide of a non-metal, a semiconductor compound, or any combination thereof.

Examples of the oxide of metal, metalloid, or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, and a wide viewing angle may be improved.

The quantum dot may be a spherical particle, a pyramidal particle, a multi-arm particle, a cubic nanoparticle, a nanotube particle, a nanowire particle, a nanofiber particle, or a nanoplate particle.

Since the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In an embodiment, the size of the quantum dot may be selected to emit red, green, and/or blue light. The size of the quantum dot may be configured to emit white light by combining light of various colors.

[Electron Transport Region in Interlayer 130]

The electron transport region includes the first electron transport layer 136 and the second electron transport layer 137.

In an embodiment, the electron transport region may further include a hole blocking layer, an electron control layer, an electron injection layer, or any combination thereof.

In an embodiment, the electron transport region may consist of the first electron transport layer 136 and the second electron transport layer 137, and the first electron transport layer 136 may directly contact the second electron transport layer 137.

In an embodiment, the light-emitting device 10 may include a structure in which the first electron transport layer 136, the second electron transport layer 137, and the second electrode 150 are sequentially stacked on the emission layer 135.

The electron transport region (for example, a buffer layer, a hole blocking layer, an electron control layer, or an electron transport layer in the electron transport region) may include an electron-transporting compound, and the electron-transporting compound may be a metal-free compound including at least one π electron-deficient nitrogen-containing $C_1$-$C_{60}$ cyclic group.

In an embodiment, the first electron transport layer 136 may include a first electron-transporting material, and the first electron-transporting material is the same as described in connection with an electron-transporting material described below.

In an embodiment, the electron-transporting material may include a compound represented by Formula 601 below:

$$[Ar_{601}]_{xe11}\text{-}[(L_{601})_{xe1}\text{-}R_{601}]_{xe21}$$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $R_{10a}$ may be understood by referring to the description of $R_{10a}$ provided herein, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

[Formula 601-1]

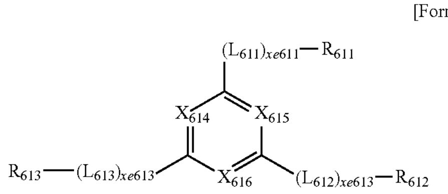

In Formula 601-1, $X_{614}$ may be N or C($R_{614}$), $X_{615}$ may be N or C($R_{615}$), $X_{616}$ may be N or C($R_{616}$), wherein at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{611}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

Examples of the electron-transporting compound may include one of Compounds ET1 to ET47, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof.

ET1

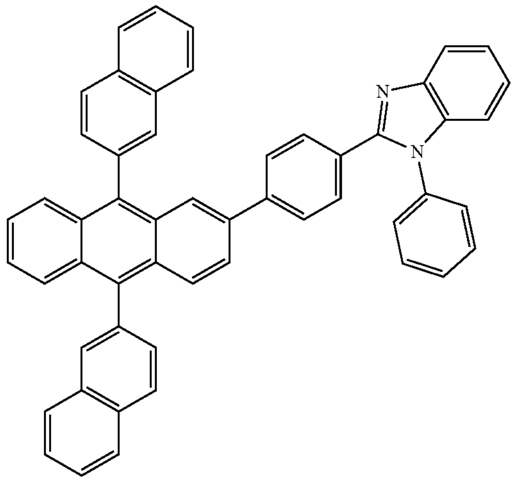

ET2

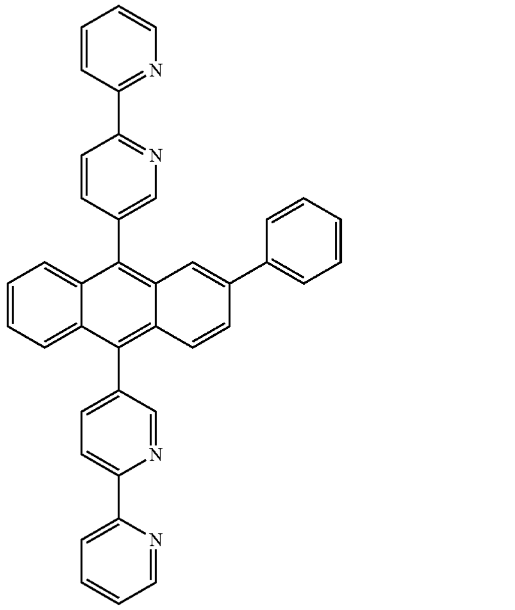

-continued
ET3
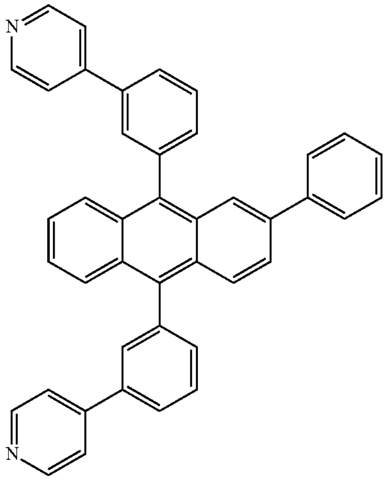
ET4
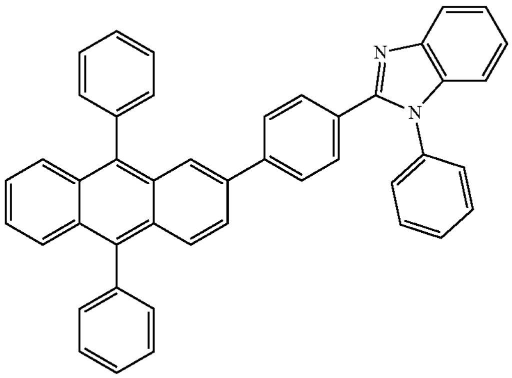
ET5
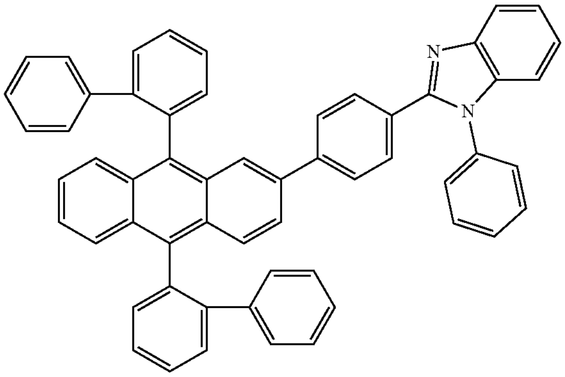
-continued
ET6
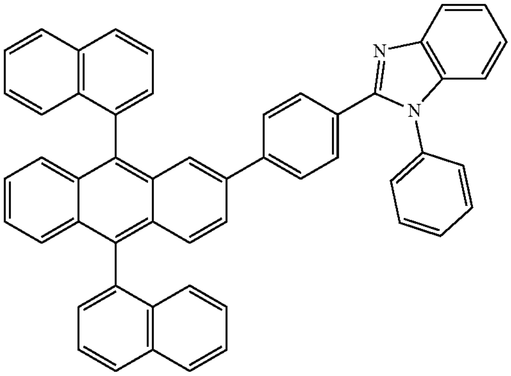
ET7
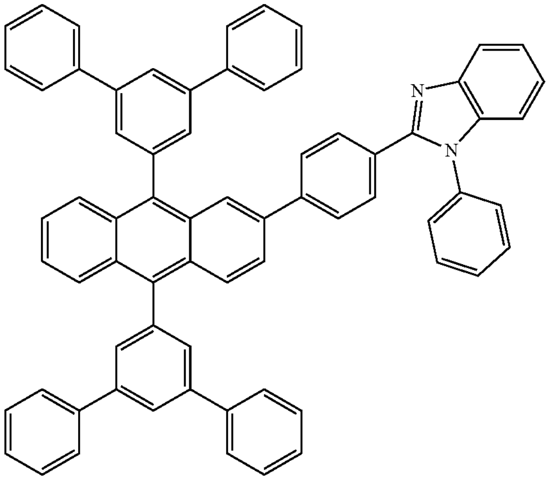
ET8
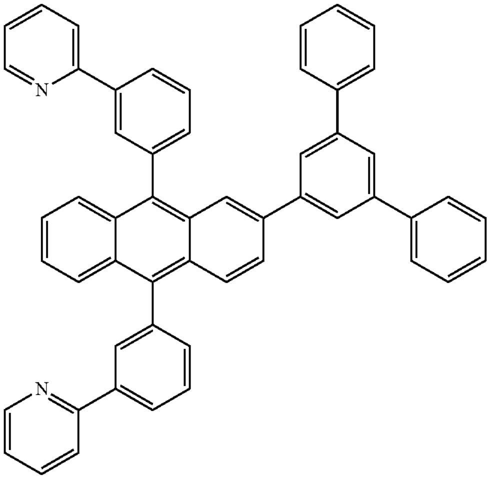

-continued
ET9
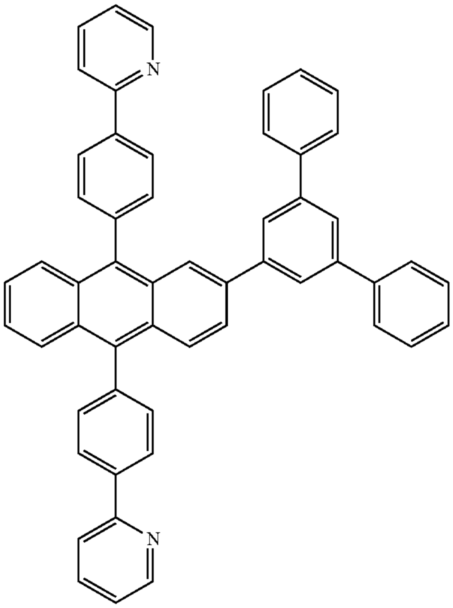
ET10
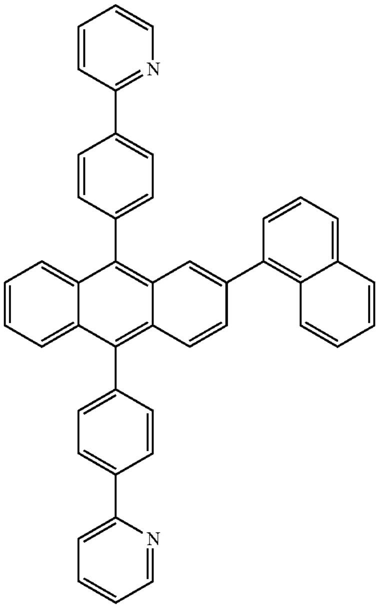
-continued
ET11
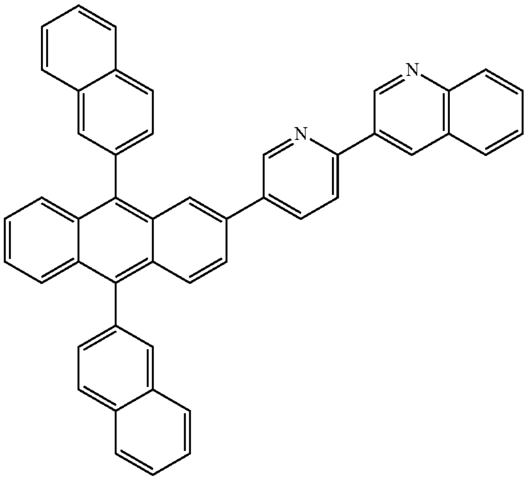
ET12
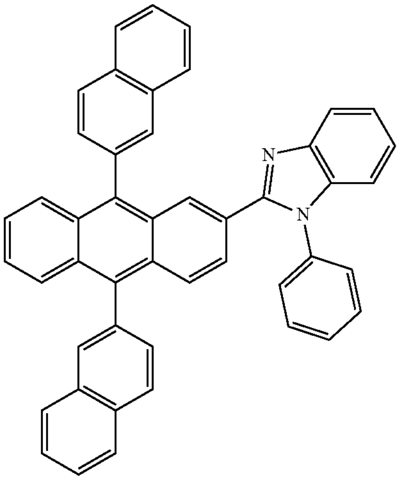
ET13
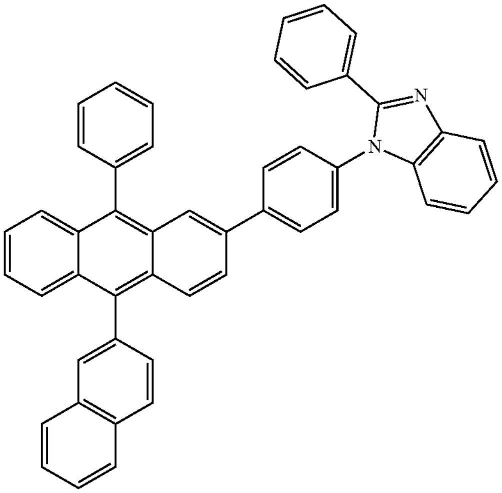

-continued
ET14
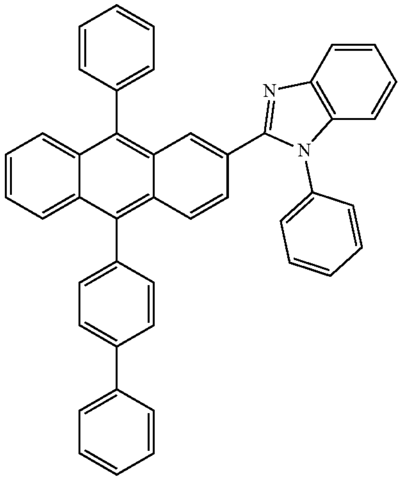
ET15
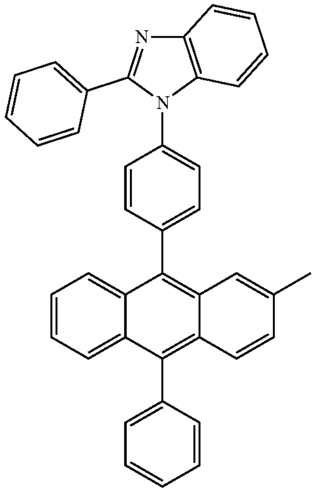
ET16
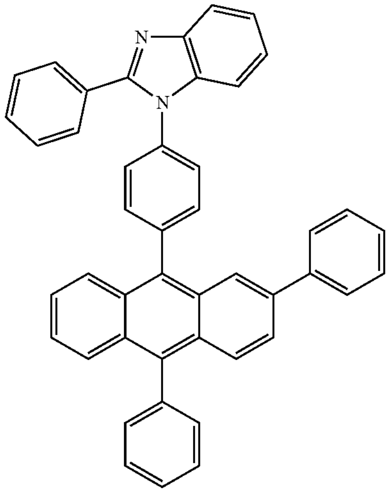
-continued
ET17
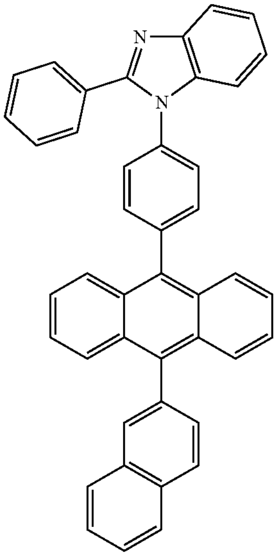
ET18
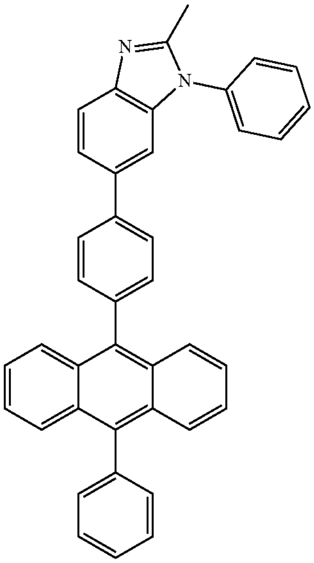
ET19
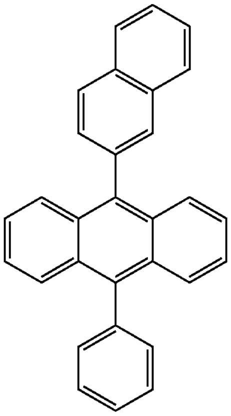

-continued
ET20
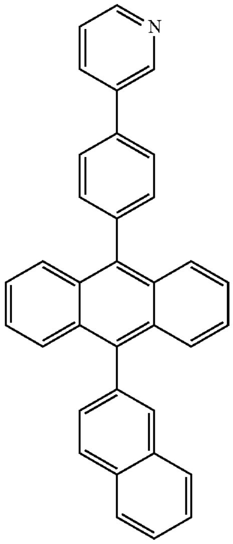
ET21
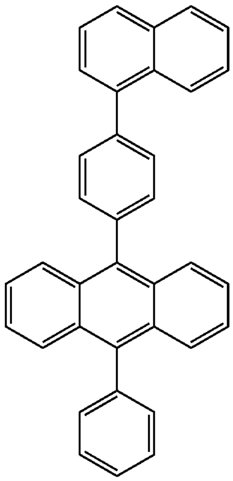
ET22
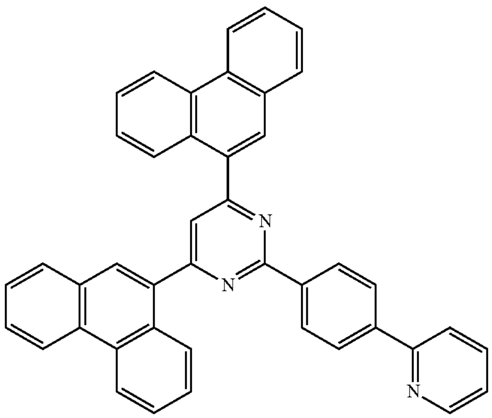
-continued
ET23
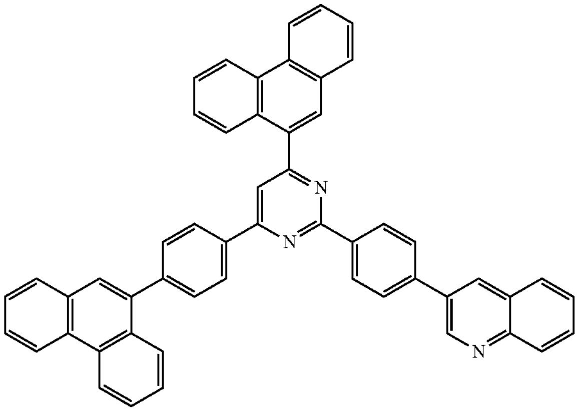
ET24
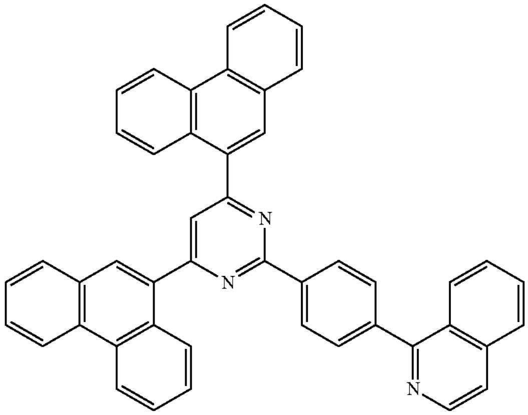
ET25
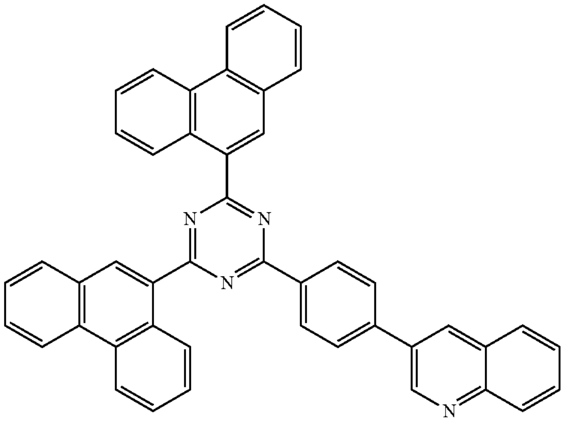

-continued
ET26
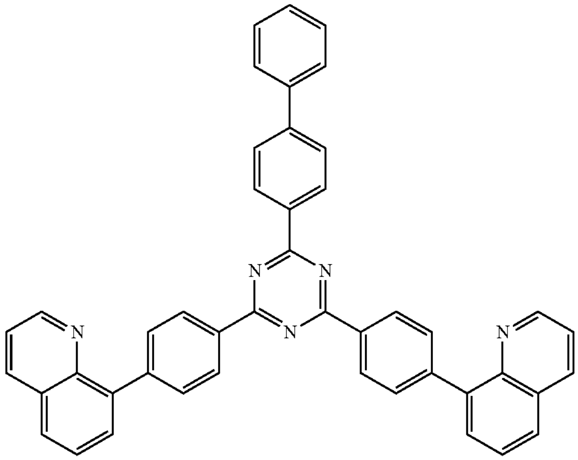
ET27
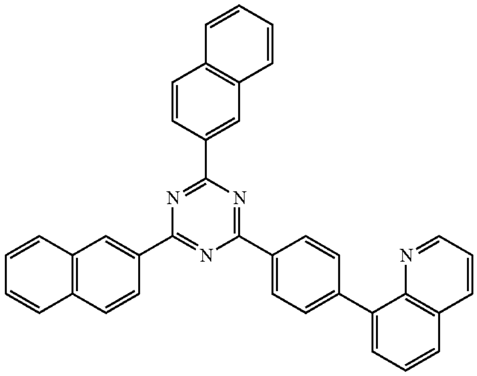
ET28
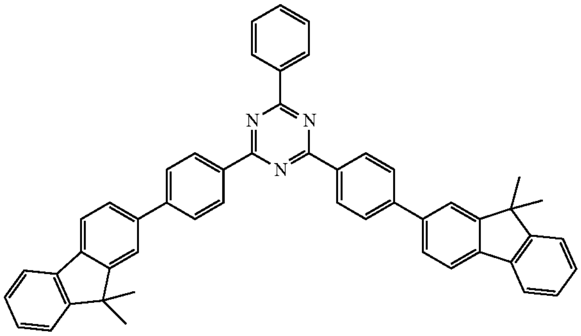
-continued
ET29
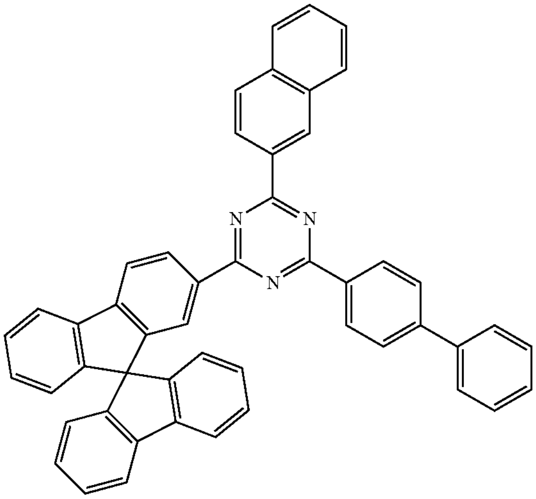
ET30
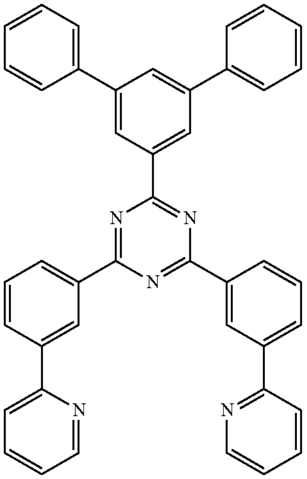
ET31
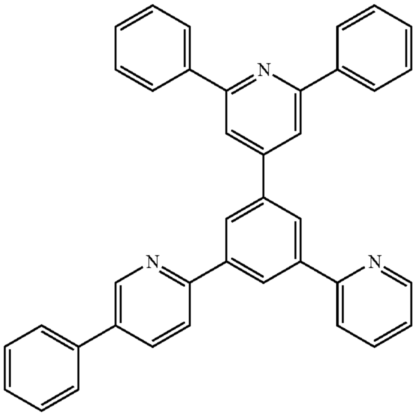

-continued
ET32
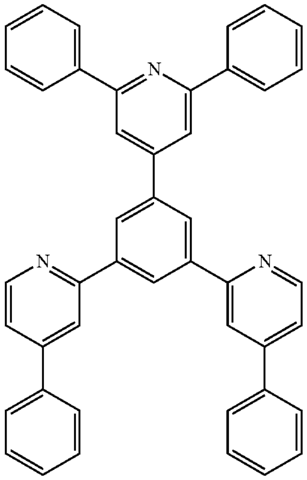
ET33
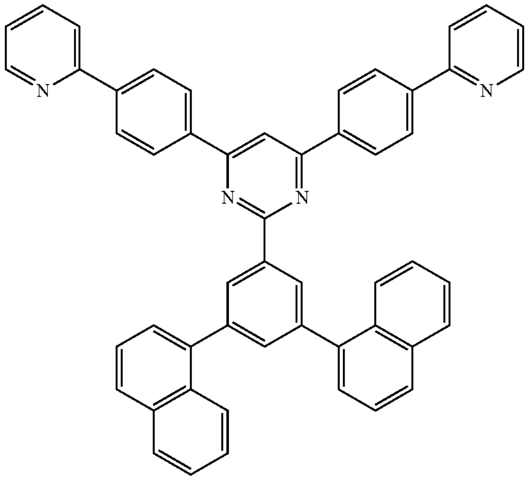
ET34
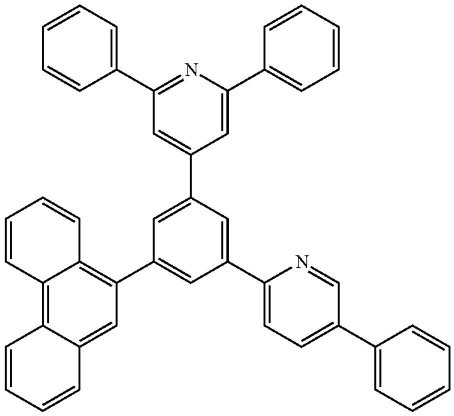
-continued
ET35
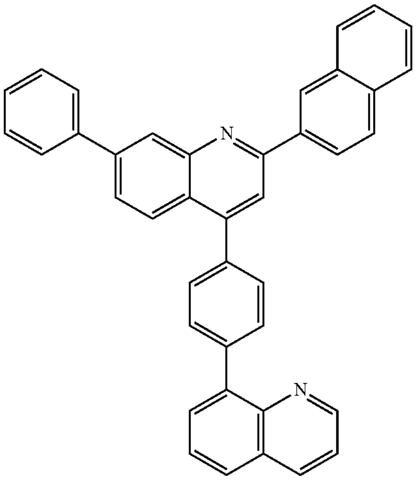
ET36
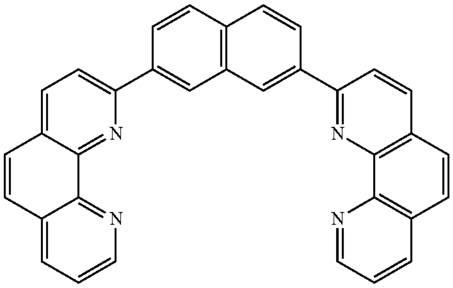
ET37
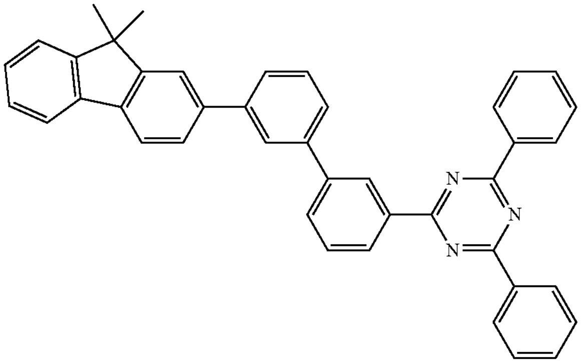
ET38
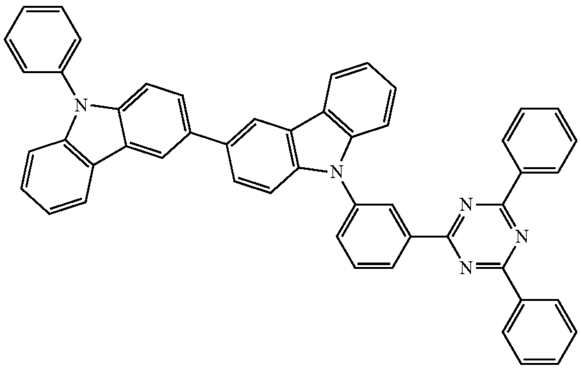

-continued
ET39
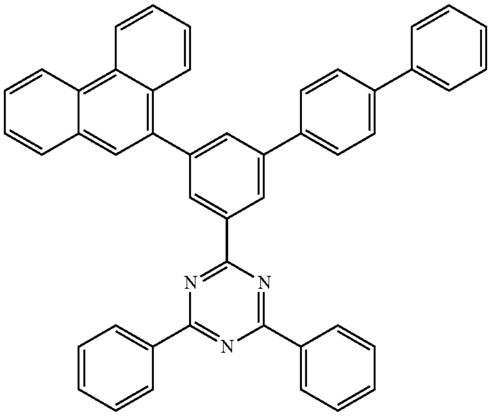
ET40
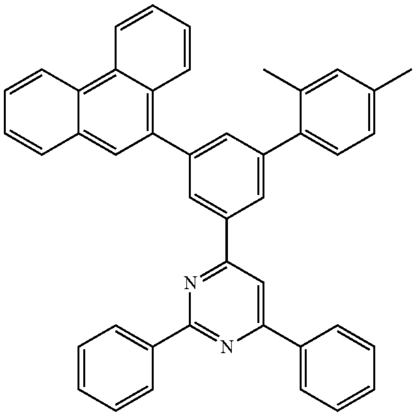
ET41
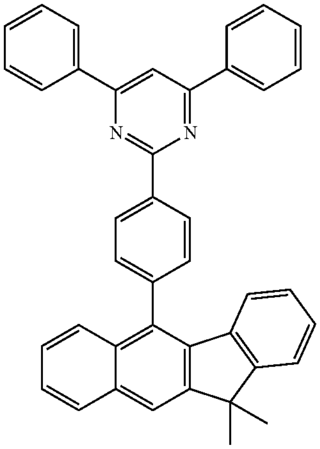
-continued
ET42
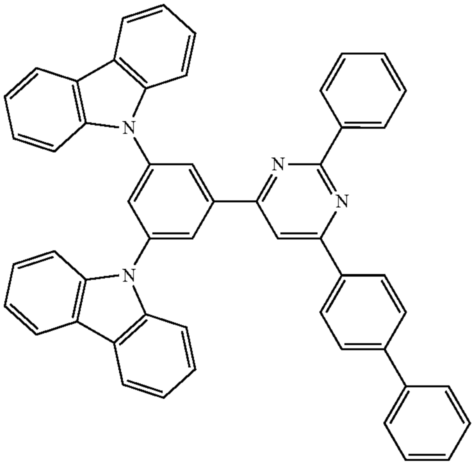
ET43
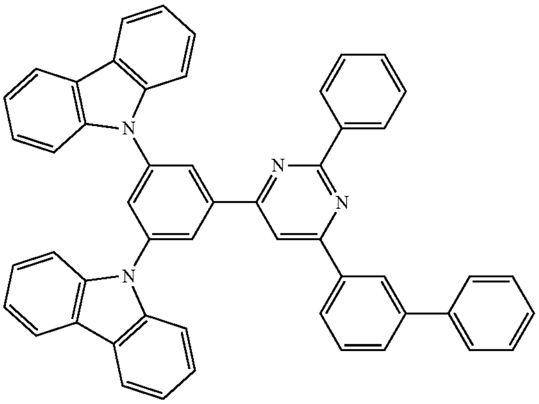
ET44
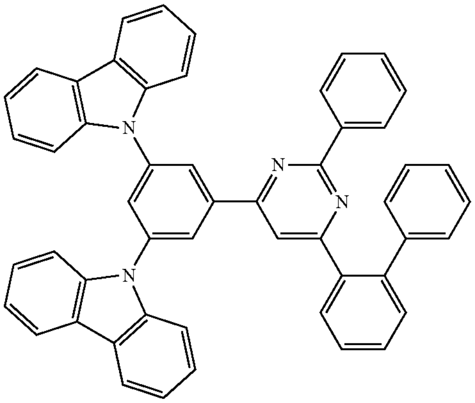
ET45
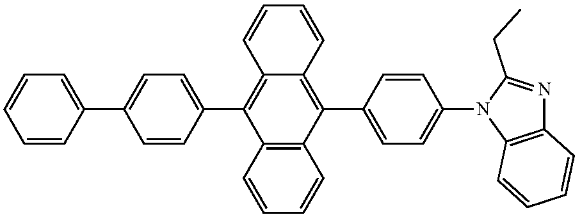

-continued

ET46

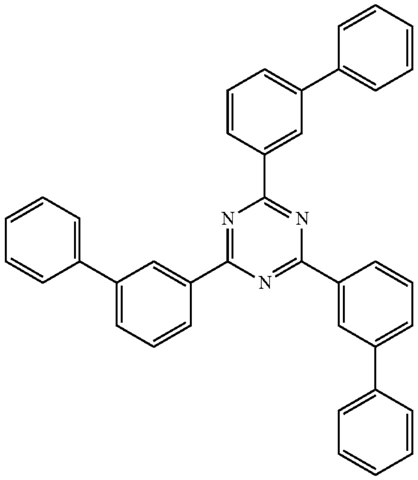

ET47

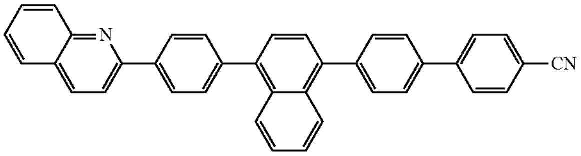

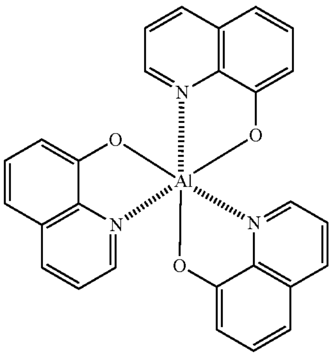

Alq3

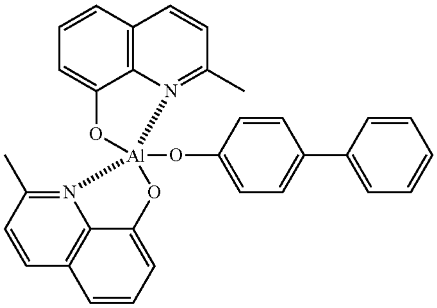

BAlq

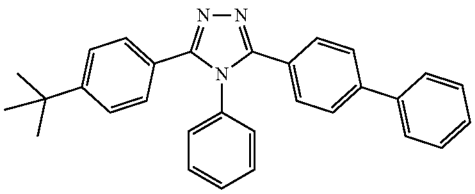

TAZ

-continued

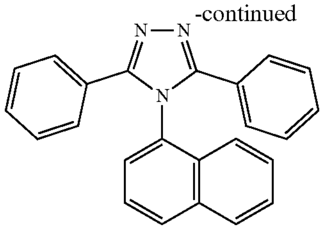

NTAZ

In an embodiment, the first electron transport layer 136 may not include a metal.

The second electron transport layer 137 may include a second electron transport material and a metal dopant.

In an embodiment, the second electron-transporting material may include a phenanthroline-based compound, a phosphine oxide-based compound, or any combination thereof as described above. In an embodiment, the second electron transport material may be the same as described in connection with the electron-transporting material.

A thickness of the electron transport region may be in a range of about 100 Å to about 5,000 Å. For example, the thickness of the electron transport region may be in a range of about 160 Å to about 4,000 Å. When the electron transport region includes a first electron transport layer, a second electron transport layer, a buffer layer, a hole blocking layer, an electron control layer, or any combination thereof, thicknesses of the buffer layer, the hole blocking layer, and the electron control layer may each independently be in a range of about 20 Å to about 1,000 Å, and thicknesses of the first electron transport layer and the second electron transport layer may each independently be in a range of about 100 Å to about 1,000 Å. For example, the thicknesses of the buffer layer, the hole blocking layer, and the electron control layer may each independently be in a range of about 30 Å to about 300 Å. For example, the thicknesses of the first electron transport layer and the second electron transport layer may each independently be in a range of about 150 Å to about 500 Å. When the thicknesses of the buffer layer, the hole blocking layer, the electron control layer, the first electron transport layer, and/or the second electron transport layer are within these ranges, satisfactory electron transporting characteristics may be obtained without a substantial increase in driving voltage.

The electron transport region (for example, the second electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

ET-D2

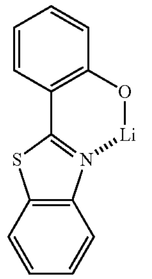

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a multi-layered structure including layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, or alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal, and a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, satisfactory electron injection characteristics may be obtained without a substantial increase in driving voltage.

[Second Electrode 150]

The second electrode 150 may be disposed on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

An amount of silver (Ag) in the second electrode 150 may be equal to or greater than about 90 wt %.

In an embodiment, an amount of silver in the second electrode 150 may be in a range of about 90 wt % to about 100 wt %.

In an embodiment, an amount of silver (Ag) in the second electrode 150 may be in a range of about 95 wt % to about 100 wt %.

In an embodiment, the second electrode 150 may further include lithium (Li), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof.

In an embodiment, the second electrode 150 may further include magnesium (Mg), and an amount of the magnesium may be 10 wt % or less. In an embodiment, an amount of magnesium in the second electrode 150 may be 5 wt % or less.

When silver (Ag) and magnesium (Mg) are used as electrode materials of the light-emitting device, magnesium is generally included in an amount of greater than 10 wt % in order to prevent the agglomeration characteristics of silver.

In the light-emitting device according to an embodiment, as materials for the second electrode 150, an amount of silver is large and an amount of magnesium having characteristics of absorbing light is small, the second electron transport layer including the second electron-transporting material and the metal dopant is included, and thus agglomeration of silver of the second electrode may be prevented such that efficiency and lifespan of the light-emitting device may be improved.

The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. In embodiment, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110 (which may be a semi-transmissive electrode or a transmissive electrode) and through the first capping layer. Light generated in an emission layer of the interlayer 130 of the light-emitting device 10 may be extracted toward the outside through the second electrode 150 (which may be a semi-transmissive electrode or a transmissive electrode) and through the second capping layer.

Figure 3:
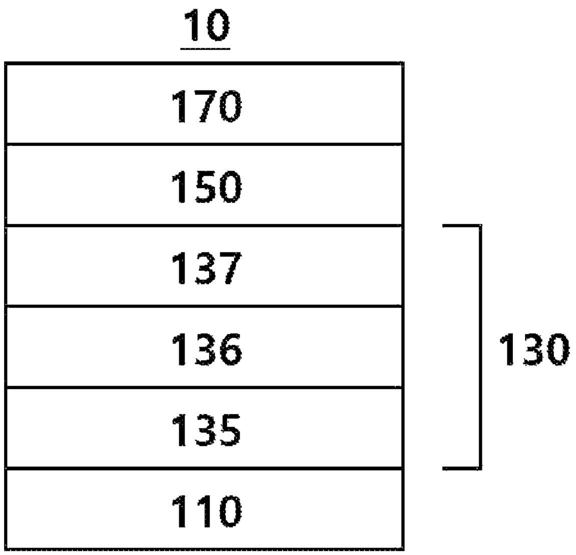
FIG. 3 is a schematic cross-sectional view of a structure of a light-emitting device according to an embodiment.

Referring to FIG. 3, the light-emitting device 10 according to an embodiment may further include a second capping layer 170 located outside the second electrode 150.

The first capping layer and the second capping layer may each increase external emission efficiency according to the principle of constructive interference. Accordingly, the light extraction efficiency of the light-emitting device 10 may be increased, so that the emission efficiency of the light-emitting device 10 may be improved.

Each of the first capping layer and the second capping layer may include a material having a refractive index (at a wavelength of about 589 nm) equal to or greater than about 1.6.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may each independently be optionally substituted with a substituent containing 0, N, S, Se, Si, F, Cl, Br, I, or any combination thereof.

In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

CP1

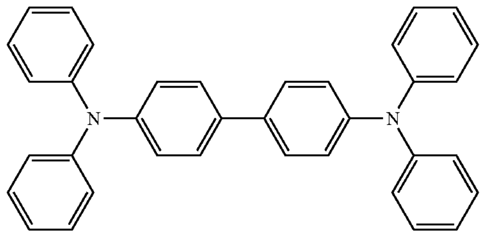

CP2

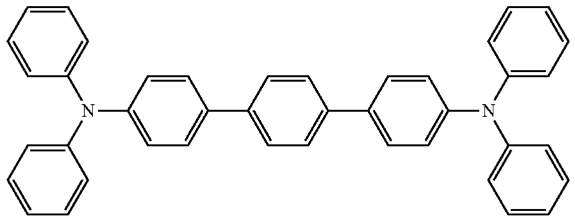

CP3

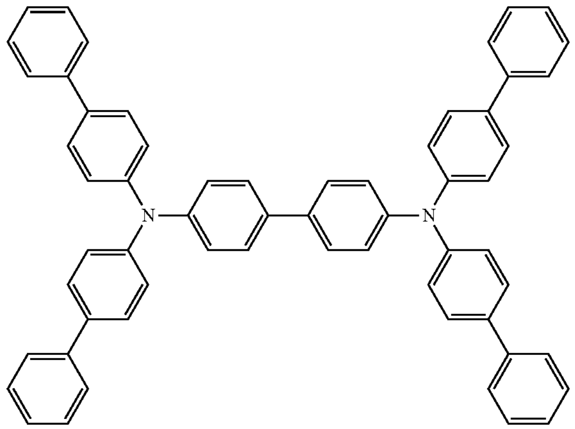

-continued

CP4

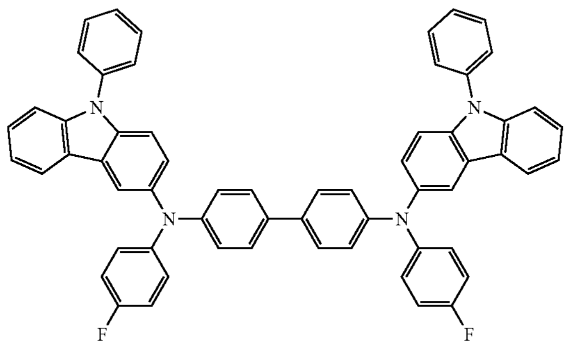

CP5

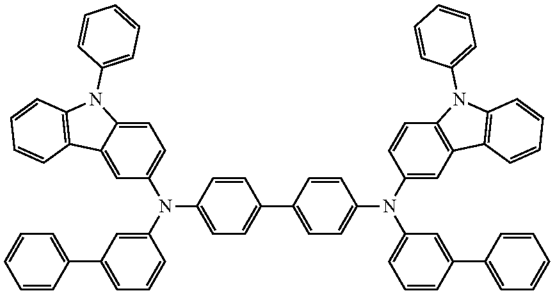

CP6

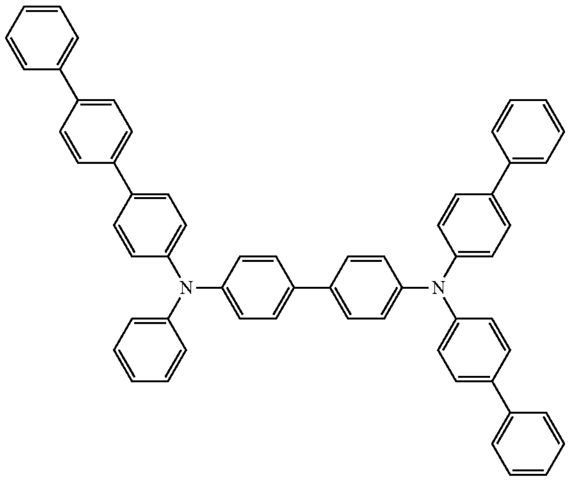

β-NPB

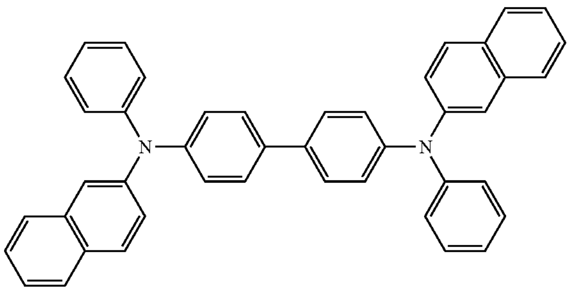

[Film]

A compound represented by Formula 1 may be included in various films. Thus, according to another aspect, provided is a film including the compound represented by Formula 1. The film may be, for example, an optical member (or a light control member) (for example, a color filter, a color conversion member, a capping layer, a light extraction efficiency improvement layer, a selective light absorption layer, a polarizing layer, a quantum dot-containing layer, etc.), a light-shielding member (for example, a light reflecting layer, a light absorbing layer, etc.), a protective member (for example, an insulating layer, a dielectric layer, etc.), or the like.

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In embodiments, the light emitted from the light-emitting device may be blue light or white light.

The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining layer may be located among the subpixels to define each of the subpixels.

The color filter may further include color filter areas and light-shielding patterns located among the color filter areas, and the color conversion layer may include color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described in the specification. The first area, the second area, and/or the third area may each further include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may each have different maximum emission wavelengths. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, etc.

The active layer may include crystalline silicon, amorphous silicon, organic semiconductor, oxide semiconductor, or the like.

The electronic apparatus may further include a sealing portion for sealing the light-emitting device. The sealing portion and/or the color conversion layer may be located between the color filter and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including at least one of an organic layer and an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various displays, such as light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 6:
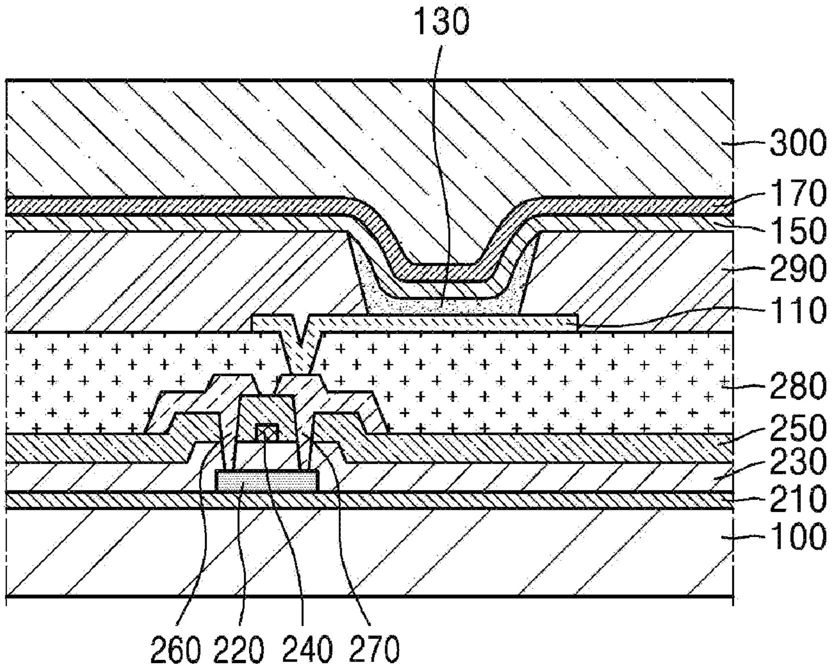
FIG. 6 is a schematic cross-sectional view of a structure of an electronic apparatus according to an embodiment.
Figure 7:
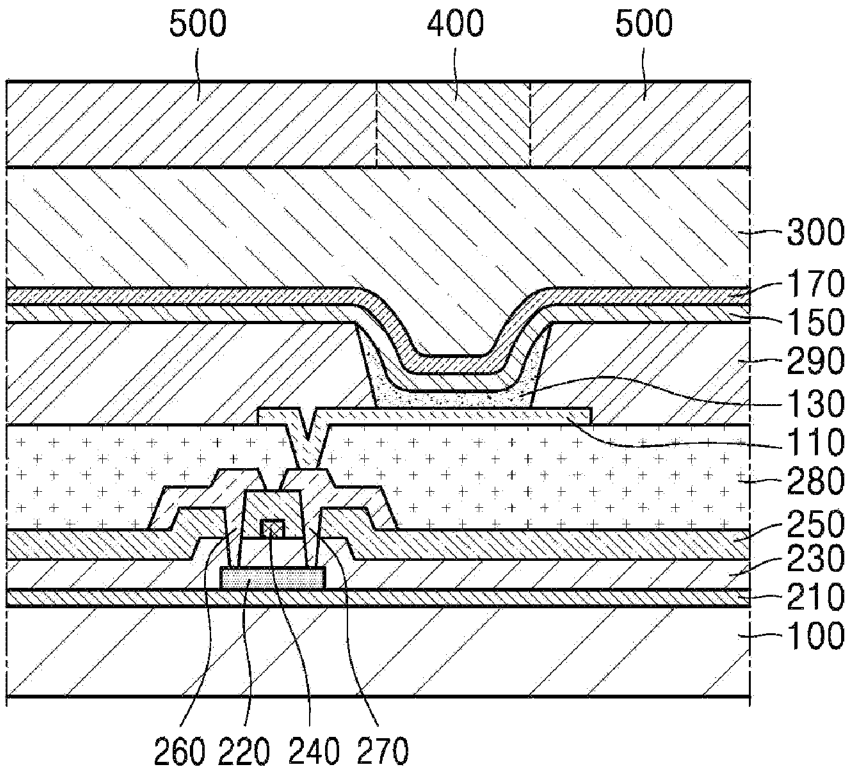
FIG. 7 is a schematic cross-sectional view of a structure of an electronic apparatus according to another embodiment.

[Description of FIGS. 6 and 7]

FIG. 6 is a schematic cross-sectional view of an electronic apparatus according to an embodiment.

The electronic apparatus of FIG. 6 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be in contact with the exposed portions of the source region and the drain region of the active layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and may expose a portion of the drain electrode 270, and the first electrode 110 may be electrically connected to the exposed portion of the drain electrode 270.

A pixel-defining layer 290 containing an insulating material may be located on the first electrode 110. The pixel-defining layer 290 may expose a region of the first electrode 110, and an interlayer 130 may be formed in the exposed region of the first electrode 110. The pixel-defining layer 290 may be a polyimide or polyacrylic organic film. Although not shown in FIG. 6, at least some layers of the interlayer 130 may extend beyond the upper portion of the pixel-defining layer 290 to be provided in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include an inorganic film including silicon nitride (SiNx), silicon oxide (SiOx), indium tin oxide, indium zinc oxide, or any combination thereof, an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof, or a combination of the inorganic film and the organic film.

FIG. 7 is a schematic cross-sectional view of an electronic apparatus according to an embodiment.

The electronic apparatus of FIG. 7 may be the same as the electronic apparatus of FIG. 6, except that a light-shielding pattern 500 and a functional region 400 are additionally located on the encapsulation portion 300. The functional region 400 may be a color filter area, a color conversion area, or a combination of the color filter area and the color conversion area. In an embodiment, the light-emitting device included in the electronic apparatus of FIG. 7 may be a tandem light-emitting device.

[Manufacture Method]

Respective layers included in the hole transport region, the emission layer, and respective layers included in the electron transport region may be formed in a specified region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and a structure of a layer to be formed.

Definitions of Terms

The term "$C_3$-$C_{60}$ carbocyclic group" as used herein may be a cyclic group consisting only of carbon as a ring-forming atom and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, a $C_1$-$C_{60}$ heterocyclic group may have 3 to 61 ring-forming atoms.

The "cyclic group" as used herein may include the $C_3$-$C_{60}$ carbocyclic group and the $C_1$-$C_{60}$ heterocyclic group.

The term "n electron-rich $C_3$-$C_{60}$ cyclic group" as used herein may be a cyclic group that has three to sixty carbon atoms and may not include *—N═*' as a ring-forming moiety, and the term "n electron-deficient nitrogen-containing $C_1$-$C_{60}$ cyclic group" as used herein may be a heterocyclic group that has one to sixty carbon atoms and may include *—N═*' as a ring-forming moiety.

In an embodiment, the $C_3$-$C_{60}$ carbocyclic group may be a T1 group or a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which two or more T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which two or more T1 groups are condensed with each other, a T3 group, a condensed cyclic group in which two or more T3 groups are condensed with each other, or a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a condensed cyclic group in which two or more T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed to any cyclic group, a monovalent group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$OA_{101}$ (wherein $A_{101}$ is a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may include a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having six to sixty carbon atoms, and the term "$C_6$-$C_{60}$ arylene group" as used herein may be a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be represented by $-OA_{102}$ (wherein $A_{102}$ is a $C_6$-$C_{60}$ aryl group), and the term "$C_6$-$C_{60}$ arylthio group" as used herein may be represented by $-SA_{103}$ (wherein $A_{103}$ is a $C_6$-$C_{60}$ aryl group).

The term "$C_7$-$C_{60}$ aryl alkyl group" as used herein may be represented by $-(A_{104})(A_{105})$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by $-(A_{106})(A_{107})$ (where $A_{106}$ may be a $C_1$-$C_{59}$ alkylene group, and $A_{107}$ may be a $C_1$-$C_{59}$ heteroaryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

The term "hetero atom" as used herein may be any atom other than a carbon atom or a hydrogen atom. Examples of the heteroatom may include O, S, N, P, Si, B, Ge, Se, or any combination thereof.

The term "the third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a $C_6$-$C_{60}$ aryl group (i.e., a phenyl group) as a substituent.

The term "terphenyl group" as used herein may be "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

In the description, * and *' as used herein, unless defined otherwise, each represent a binding site to a neighboring atom in a corresponding formula or moiety.

Hereinafter, a compound according to embodiments and a light-emitting device according to embodiments will be described in detail with reference to Examples. The wording "B was used instead of A" used in describing Examples means that an identical molar equivalent of B was used in place of A.

EXAMPLES

Example 1

An ITO glass substrate (50×50×0.5 mm, 15Ω/□), which is an organic light-emitting device (OLED) glass (manufactured by Samsung-Corning) substrate, was subjected to ultrasonic cleaning sequentially using distilled water, followed by UV ozone cleaning for 30 minutes.

A glass substrate with a transparent electrode line after cleaning was mounted on a substrate holder of a vacuum deposition apparatus, and Compound HT1 was deposited on the ITO electrode (anode) to form a hole injection layer having a thickness of 120 nm.

HT2 was deposited on the hole injection layer to form a hole transport layer having a thickness of 60 nm.

BH1 (host) and BD1 (dopant) were co-deposited at a weight ratio of 98:2 on the hole transport layer to form an emission layer having a thickness of 20 nm.

Compound ET1 (first electron-transporting material) was deposited on the emission layer to form a first electron transport layer having a thickness of 5 nm.

Compound ET3 (second electron-transporting material) and Li (metal dopant) were co-deposited at a weight ratio of 97:3 on the first electron transport layer to form a second electron transport layer having a thickness of 25 nm.

Ag:Mg (weight ratio of 95:5) was deposited on the second electron transport layer to form a cathode having a thickness of 10 nm, thereby completing manufacture of a light-emitting device.

HT1

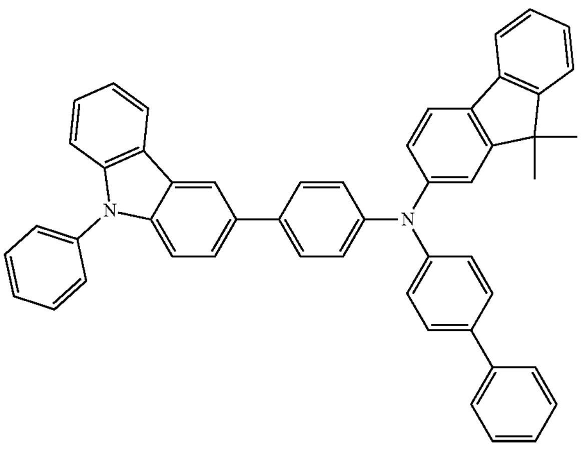

-continued
HT2
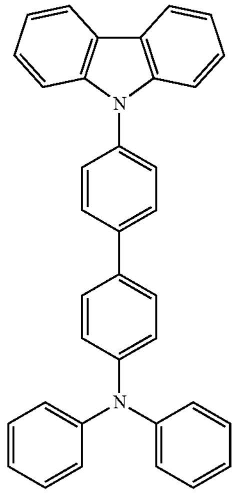
BH1
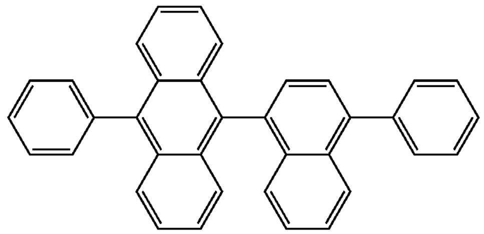
BD1
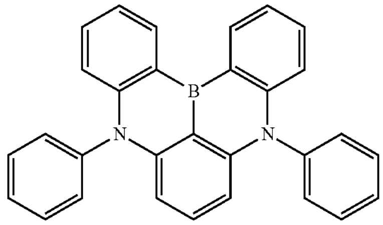
BD2
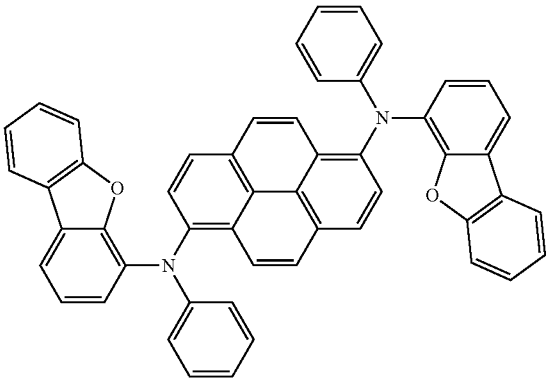
-continued
CBP
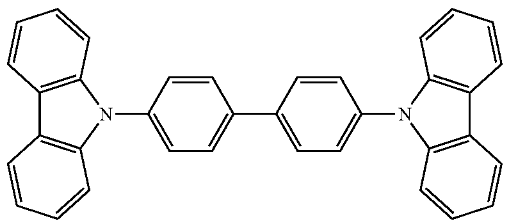
Ir(pq)$_2$(acac)
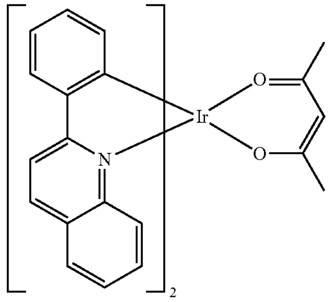
Ir(ppy)$_3$
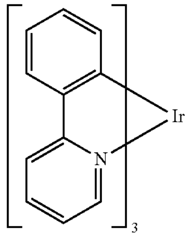
ET1
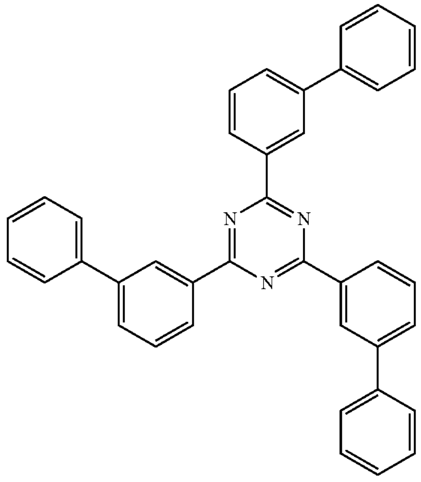

-continued

ET2

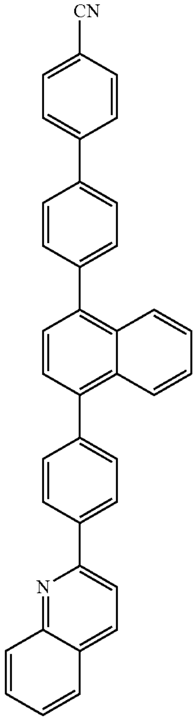

ET3

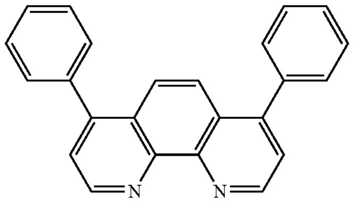

ET4

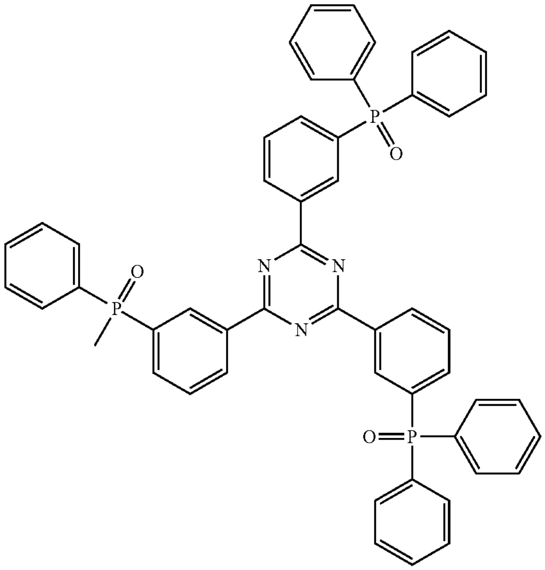

-continued

ET5

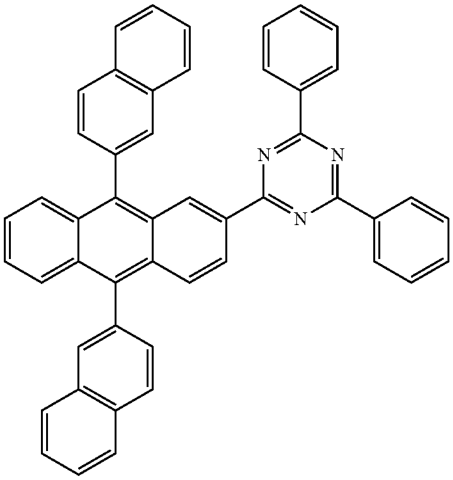

ET6

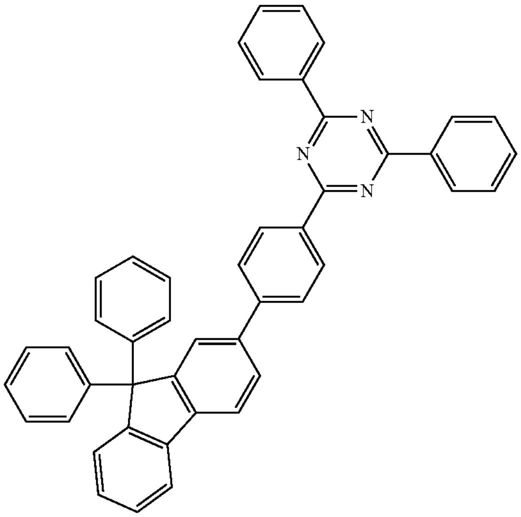

Examples 2 to 16 and Comparative Examples 1 to 13

Light-emitting devices were manufactured in the same manner as in Example 1, except that materials for the light-emitting devices as shown in Table 1 were used.

Evaluation Example 1

Driving voltage, luminescence efficiency, and lifespan ($T_{95}$) of the light-emitting devices manufactured according to Examples 1 to 16 and Comparative Examples 1 to 13 were measured using a Keithley SMU 236 and luminance meter PR650, and the results are shown in Tables 1 to 3. The lifespan ($T_{95}$) is a period of time that was taken until the initial luminance is reduced to 95%.

The light-emitting devices of Examples 1 to 8 and Comparative Examples 1 to 5 were measured at 1,000 nit, and the driving voltage of each of the Examples and Comparative Examples was expressed as a difference from the driving voltage of Comparative Example 5. The emission efficiency and lifespan of each of the Examples 1 to 8 and Comparative Examples 1 to 5 were expressed as a comparative value with the emission efficiency and lifespan of Comparative Example 1, respectively.

The light-emitting devices of Examples 9 to 12 and Comparative Examples 6 to 9 were measured at 12,000 nit, and the driving voltage of each of the Examples 9 to 12 and Comparative Examples 6 to 9 was expressed as a difference from the driving voltage of Comparative Example 6. The emission efficiency and lifespan of each of the Examples 9 to 12 and Comparative Examples 6 to 9 were expressed as a comparative value with the emission efficiency and lifespan of Comparative Example 6, respectively.

The light-emitting devices of Examples 13 to 16 and Comparative Examples 10 to 13 were measured at 5,000 nit, and the driving voltage of each of the Examples 13 to 16 and Comparative Examples 10 to 13 was expressed as a difference from the driving voltage of Comparative Example 10.

With respect to materials for dopants in emission layers and first electron transport layers, which are used in Examples 1 to 16 and Comparative Examples 1 to 13, $T_1$ energy level values calculated through simulation results by using a density-functional theory (DFT) method of a Gaussian program (structure optimization using B3LYP, 6-31G*) are shown in Table 4.

TABLE 1

| No. | First electron transporting material | Second electron transporting material: Metal dopant (wt %) | Emission layer Host: Dopant | Second electrode (weight ratio) | Driving voltage difference (V) | Emission efficiency (relative value) | $T_{95}$ (relative value) |
|---|---|---|---|---|---|---|---|
| Example 1 | ET1 | ET3:Li (3 wt %) | BH1:BD1 | Ag:Mg (95:5) | −0.10 V | 115% | 120% |
| Example 2 | ET1 | ET4:Li (3 wt %) | BH1:BD1 | Ag:Mg (95:5) | −0.20 V | 110% | 115% |
| Example 3 | ET1 | ET3:Yb (3 wt %) | BH1:BD1 | Ag:Mg (95:5) | −0.15 V | 115% | 130% |
| Example 4 | ET1 | ET4:Yb (3 wt %) | BH1:BD1 | Ag:Mg (95:5) | −0.25 V | 109% | 120% |
| Example 5 | ET2 | ET3:Li (3 wt %) | BH1:BD2 | Ag:Mg (95:5) | −0.10 V | 105% | 135% |
| Example 6 | ET2 | ET4:Li (3 wt %) | BH1:BD2 | Ag:Mg (95:5) | −0.10 V | 108% | 130% |
| Example 7 | ET2 | ET3:Yb (3 wt %) | BH1:BD2 | Ag:Mg (95:5) | −0.15 V | 105% | 145% |
| Example 8 | ET2 | ET4:Yb (3 wt %) | BH1:BD2 | Ag:Mg (95:5) | −0.20 V | 107% | 145% |
| Comparative Example 1 | ET1 | ET3:Li (10 wt %) | BH1:BD1 | Ag:Mg (95:5) | −0.15 V | 100% | 100% |
| Comparative Example 2 | ET1 | ET3:Li (3 wt %) | BH1:BD1 | Mg:Ag (90:10) | +0.10 V | 85% | 90% |
| Comparative Example 3 | — | ET3:Li (3 wt %) | BH1:BD1 | Ag:Mg (95:5) | +0.20 V | 90% | 80% |
| Comparative Example 4 | ET1 | — | BH1:BD1 | Ag:Mg (95:5) | +0.20 V | 92% | 75% |
| Comparative Example 5 | ET5 | ET3:Li (3 wt %) | BH1:BD1 | Ag:Mg (95:5) | 0 | 90% | 85% |

TABLE 2

| No. | First electron transporting material | Second electron transporting material: Metal dopant (wt %) | Emission layer Host: Dopant | Second electrode (weight ratio) | Driving voltage difference (V) | Emission efficiency (relative value) | $T_{95}$ (relative value) |
|---|---|---|---|---|---|---|---|
| Example 9 | ET1 | ET3:Li (3 wt %) | CBP:Ir(ppy)$_3$ | Ag:Mg (95:5) | −0.15 V | 105% | 120% |
| Example 10 | ET1 | ET4:Li (3 wt %) | CBP:Ir(ppy)$_3$ | Ag:Mg (95:5) | −0.20 V | 107% | 110% |
| Example 11 | ET1 | ET3:Yb (3 wt %) | CBP:Ir(ppy)$_3$ | Ag:Mg (95:5) | −0.15 V | 105% | 130% |
| Example 12 | ET1 | ET4:Yb (3 wt %) | CBP:Ir(ppy)$_3$ | Ag:Mg (95:5) | −0.15 V | 108% | 130% |
| Comparative Example 6 | ET1 | ET3:Li (10 wt %) | CBP:Ir(ppy)$_3$ | Ag:Mg (95:5) | 0 | 100% | 100% |
| Comparative Example 7 | ET1 | ET3:Li (3 wt %) | CBP:Ir(ppy)$_3$ | Mg:Ag (90:10) | +0.15 V | 90% | 90% |
| Comparative Example 8 | — | ET3:Li (3 wt %) | CBP:Ir(ppy)$_3$ | Ag:Mg (95:5) | +0.15 V | 85% | 80% |
| Comparative Example 9 | ET1 | — | CBP:Ir(ppy)$_3$ | Ag:Mg (95:5) | +0.20 V | 95% | 70% |

| No. | First electron transporting material | Second electron transporting material: Metal dopant (wt %) | Emission layer Host: Dopant | Second electrode (weight ratio) | Driving voltage difference (V) | Emission efficiency (relative value) | $T_{95}$ (relative value) |
|---|---|---|---|---|---|---|---|
| Example 13 | ET1 | ET3:Li (3 wt %) | CBP:Ir(pq)$_2$ acac | Ag:Mg (95:5) | −0.25 V | 107% | 110% |
| Example 14 | ET1 | ET4:Li (3 wt %) | CBP:Ir(pq)$_2$ acac | Ag:Mg (95:5) | −0.30 V | 105% | 110% |
| Example 15 | ET1 | ET3:Yb (3 wt %) | CBP:Ir(pq)$_2$ acac | Ag:Mg (95:5) | −0.20 V | 110% | 120% |
| Example 16 | ET1 | ET4:Yb (3 wt %) | CBP:Ir(pq)$_2$ acac | Ag:Mg (95:5) | −0.30 V | 112% | 115% |
| Comparative Example 10 | ET1 | ET3:Li (10 wt %) | CBP:Ir(pq)$_2$ acac | Ag:Mg (95:5) | 0 | 100% | 100% |
| Comparative Example 11 | ET1 | ET3:Li (3 wt %) | CBP:Ir(pq)$_2$ acac | Mg:Ag (90:10) | +0.15 V | 90% | 95% |
| Comparative Example 12 | — | ET3:Li (3 wt %) | CBP:Ir(pq)$_2$ acac | Ag:Mg (95:5) | +0.20 V | 85% | 90% |
| Comparative Example 13 | ET1 | — | CBP:Ir(pq)$_2$ acac | Ag:Mg (95:5) | +0.15 V | 95% | 80% |

TABLE 4

| Compound | $T_1$ energy (eV) |
|---|---|
| ET1 | 2.8 |
| ET2 | 2.5 |
| ET5 | 1.7 |
| Ir(pq)$_2$(acac) | 2.0 |
| Ir(ppy)$_3$ | 2.4 |
| BD1 | 2.6 |
| BD2 | 2.0 |

Referring to Tables 1 to 4, the light-emitting devices according to an embodiment include the first electron transport layer and second electron transport layer as described above, and have lower driving voltage and better luminescence efficiency and lifespan than the light-emitting devices of Comparative Examples.

The light-emitting device according to an embodiment have low driving voltage and excellent efficiency and lifespan characteristics.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light-emitting device comprising:

a first electrode;

a second electrode facing the first electrode; and an interlayer disposed between the first electrode and the second electrode, wherein the interlayer comprises an emission layer and an electron transport region, the emission layer comprises a host and a dopant, the electron transport region is disposed between the emission layer and the second electrode and comprises a first electron transport layer and a second electron transport layer, the first electron transport layer comprises a first electron-transporting material, wherein the first electron-transporting material comprises a metal-free compound comprising at least one π electron-deficient nitrogen-containing ring, a lowest excitation triplet ($T_1$) energy level of the first electron-transporting material is greater than a $T_1$ energy level of the dopant of the emission layer, the second electron transport layer comprises a second electron-transporting material and a metal dopant, wherein the second electron-transporting material comprises a phenanthroline-based compound, a phosphine oxide-based compound, or a combination thereof, an amount of the metal dopant in the second electron transport layer is equal to or less than about 5 wt %, wherein the metal dopant comprises an alkali metal, an alkaline earth metal, a rare earth metal, or a combination thereof, and an amount of silver (Ag) in the second electrode is equal to or greater than about 90 wt %.

2. The light-emitting device of claim 1, wherein the first electron transport layer directly contacts the emission layer.

3. The light-emitting device of claim 1, wherein the second electron transport layer directly contacts the second electrode.

4. The light-emitting device of claim 1, wherein the electron transport region further comprises a hole blocking layer, an electron control layer, an electron injection layer, or a combination thereof.

5. The light-emitting device of claim 1, wherein the dopant comprises a phosphorescent dopant, a fluorescent dopant, a delayed fluorescence dopant, or a combination thereof.

6. The light-emitting device of claim 1, wherein the light-emitting device further comprises a hole transport region disposed between the first electrode and the emission layer, and the hole transport region comprises a hole injection layer, a hole transport layer, an electron blocking layer, or a combination thereof.

7. The light-emitting device of claim 1, wherein the first electron transport layer does not comprise a metal.

8. The light-emitting device of claim 1, wherein the second electron-transporting material comprises a compound represented by Formula 1, a compound represented by Formula 2, or a combination thereof:

[Formula 1]

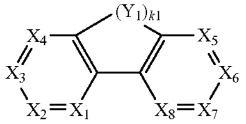

[Formula 2]

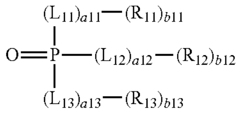

wherein in Formulae 1 and 2, $Y_1$ is *—O—*', *—S—*', *—N[$(L_9)_{a9}$-$(R_9)_{b9}$]—*', *—C[$(L_9)_{a9}$-$(R_9)_{b9}$][$(L_{10})_{a10}$-$(R_{10})_{b10}$]—*', *—C[$(L_9)_{a9}$-$(R_9)_{b9}$]═C[$(L_{10})_{a10}$-$(R_{10})_{b10}$]—*', *—C[$(L_9)_{a9}$-$(R_9)_{b9}$]═N—*', or *—N═C[$(L_{10})_{a10}$-$(R_{10})_{b10}$]—*', k1 is 0, 1, or 2, when k1 is 0, $Y_1$ is not present, $X_1$ is N or C[$(L_1)_{a1}$-$(R_1)_{b1}$], $X_2$ is N or C[$(L_2)_{a2}$-$(R_2)_{b2}$], $X_3$ is N or C[$(L_3)_{a3}$-$(R_3)_{b3}$], $X_4$ is N or C[$(L_4)_{a4}$-$(R_4)_{b4}$], $X_5$ is N or C[$(L_5)_{a5}$-$(R_5)_{b5}$], $X_6$ is N or C[$(L_6)_{a6}$-$(R_6)_{b6}$], $X_7$ is N or C[$(L_7)_{a7}$-$(R_7)_{b7}$], $X_8$ is N or C[$(L_8)_{a8}$-$(R_8)_{b8}$], $L_1$ to $L_{13}$ may each independently be a single bond, a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_2$-$C_{20}$ alkynylene group unsubstituted or substituted with at least one $R_{10a}$, a $C_3$-$C_{10}$ cycloalkylene group unsubstituted or substituted with at least one $R_{10a}$, a $C_1$-$C_{10}$ heterocycloalkylene group unsubstituted or substituted with at least one $R_{10a}$, a $C_3$-$C_{10}$ cycloalkylene group unsubstituted or substituted with at least one $R_{10a}$, a $C_1$-$C_{10}$ heterocycloalkylene group unsubstituted or substituted with at least one $R_{10a}$, a $C_6$-$C_{60}$ arylene group unsubstituted or substituted with at least one $R_{10a}$, a $C_1$-$C_{60}$ heteroarylene group unsubstituted or substituted with at least one $R_{10a}$, a divalent non-aromatic condensed polycyclic group unsubstituted or substituted with at least one $R_{10a}$, or a divalent non-aromatic condensed heteropolycyclic group unsubstituted or substituted with at least one $R_{10a}$, a1 to a13 are each independently 0, 1, 2, 3, 4, or 5, $R_1$ to $R_{13}$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), b1 to b13 are each independently 1, 2, 3, 4, 5, 6, 7, or 8,

* and *' each indicate a binding site to a neighboring atom, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-Coo aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

9. The light-emitting device of claim 1, wherein the second electron-transporting material comprises at least one of Compounds 1 to 97:

1

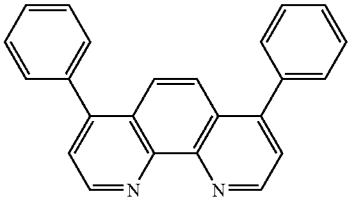

-continued
2
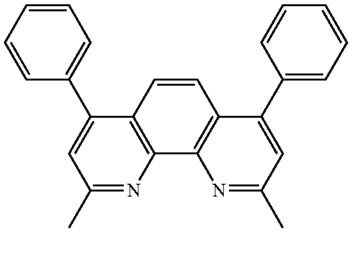
3
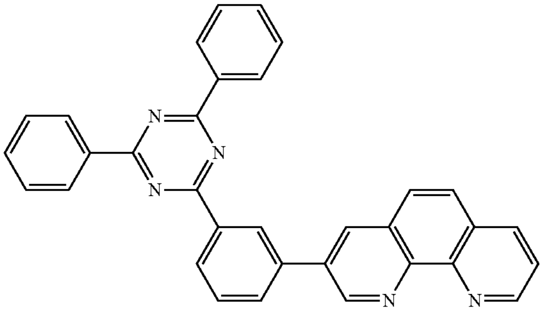
4
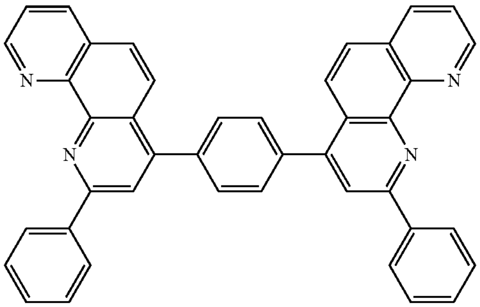
5
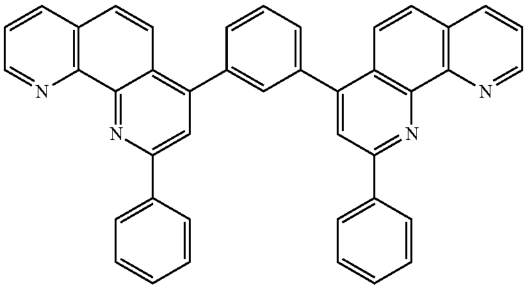
6
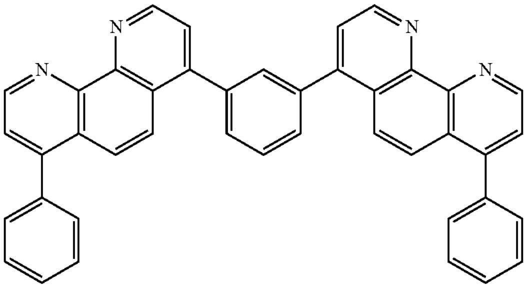
-continued
7
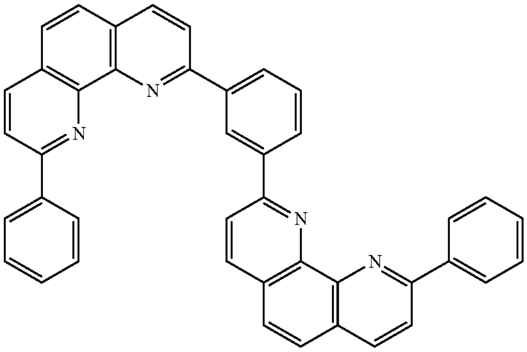
8
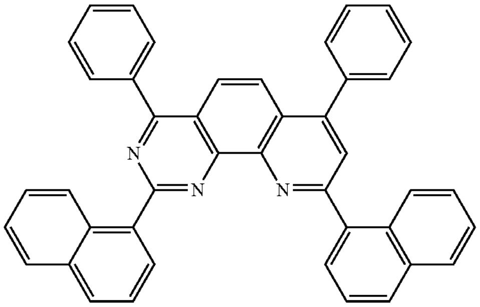
9
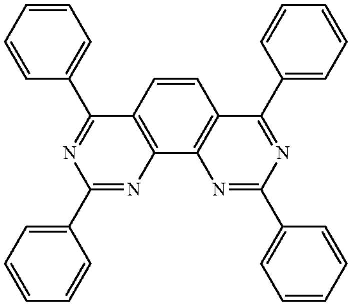
10
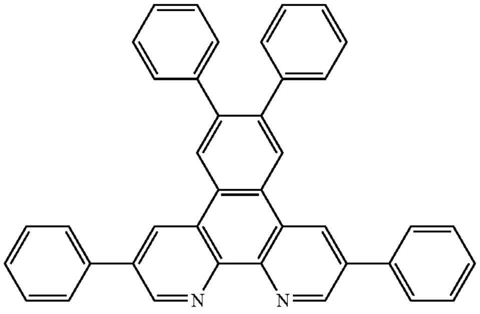
11
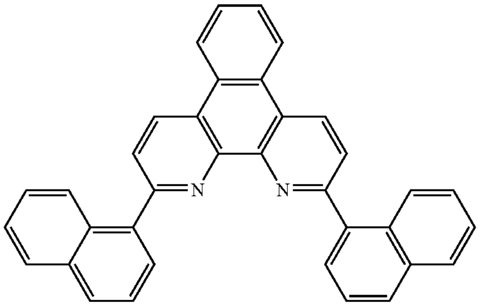

-continued
12
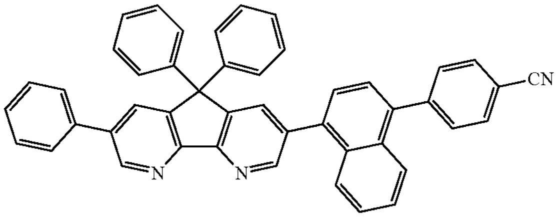
13
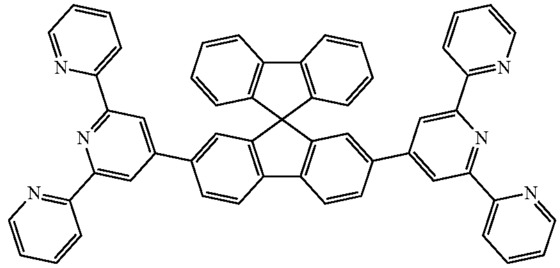
14
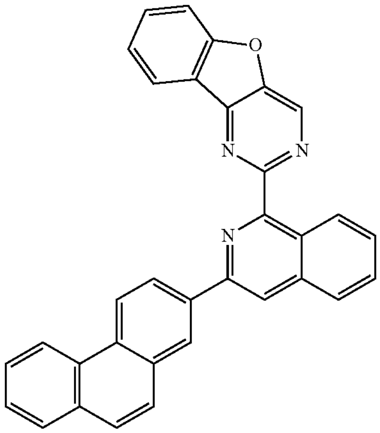
15
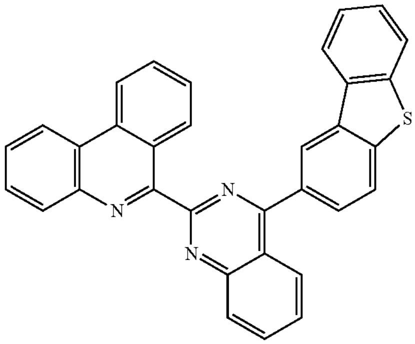
-continued
16
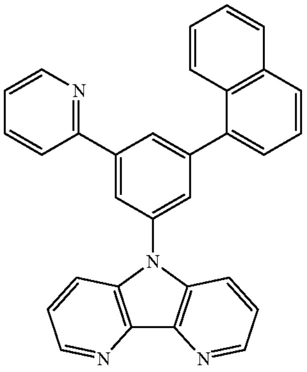
17
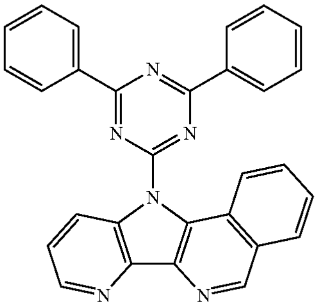
18
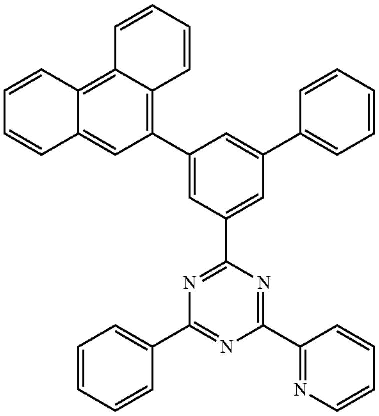
19
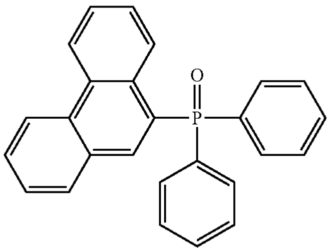

-continued
20
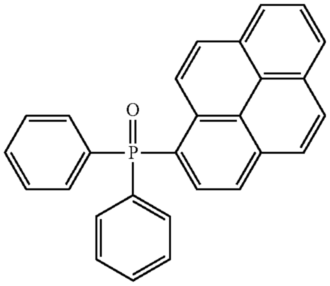
21
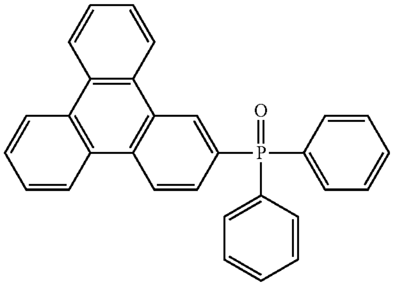
22
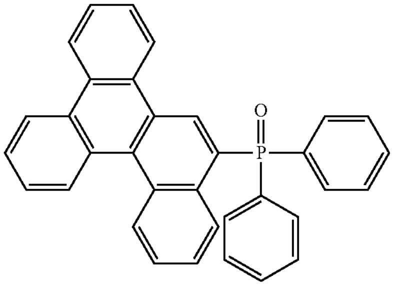
23
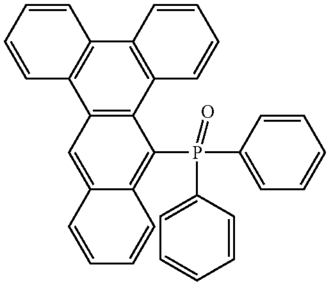
24
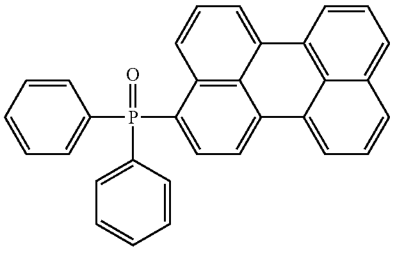
25
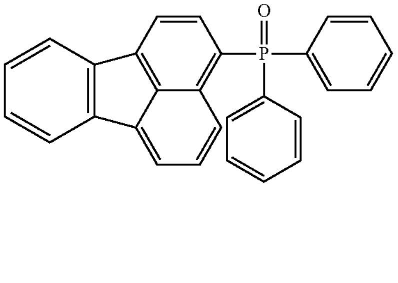
-continued
26
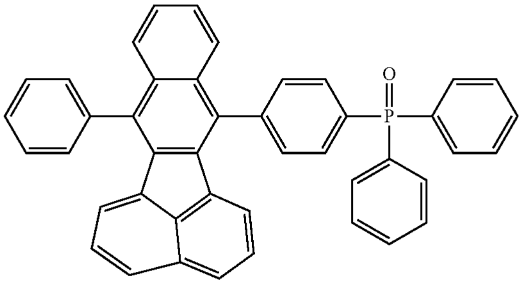
27
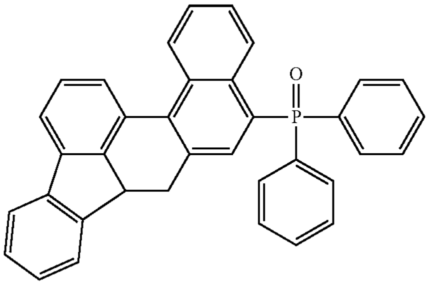
28
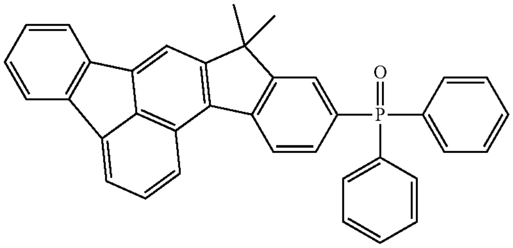
29
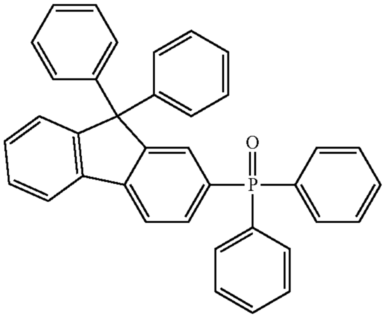
30
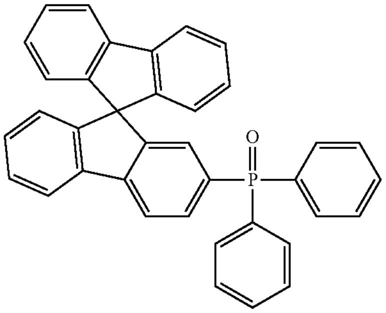

-continued
31
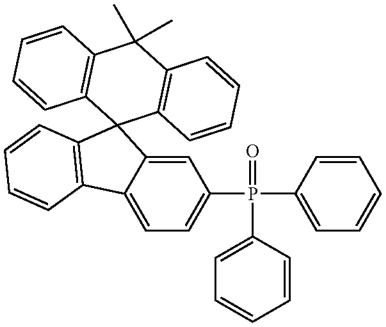
32
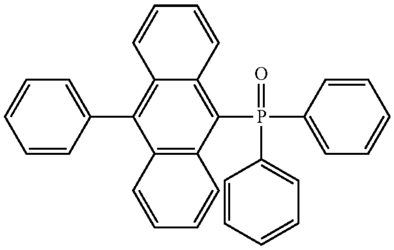
33
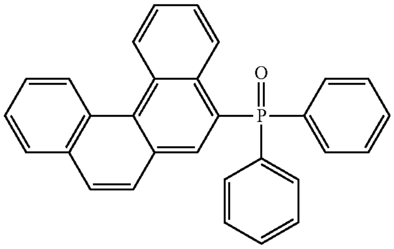
34
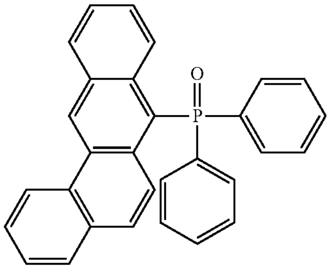
35
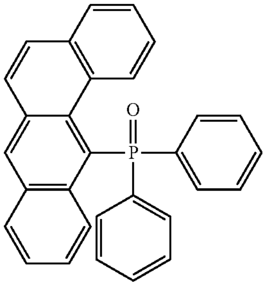
-continued
36
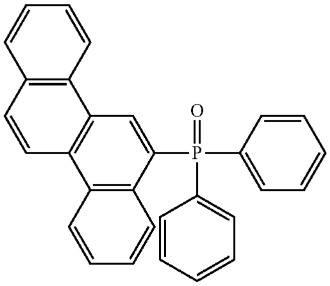
37
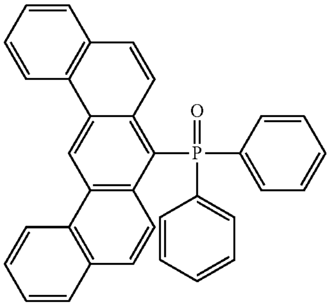
38
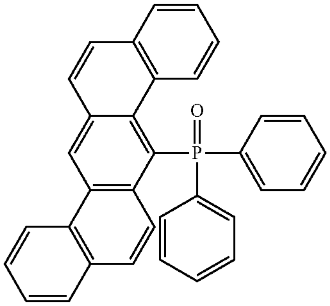
39
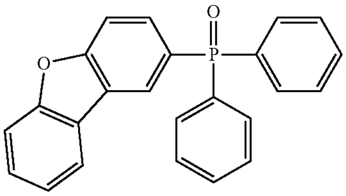
40
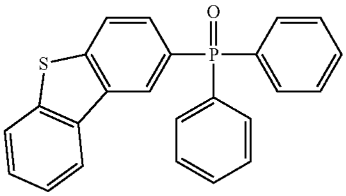
41
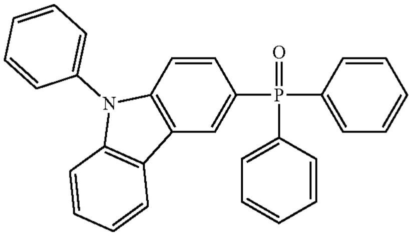

-continued
42
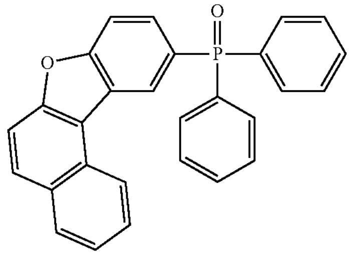
43
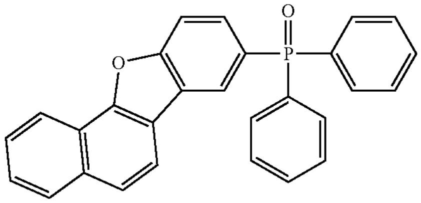
44
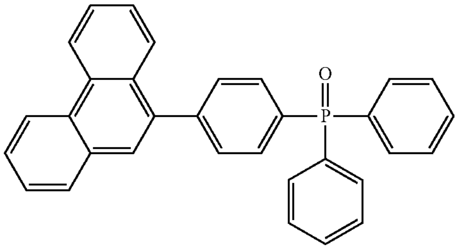
45
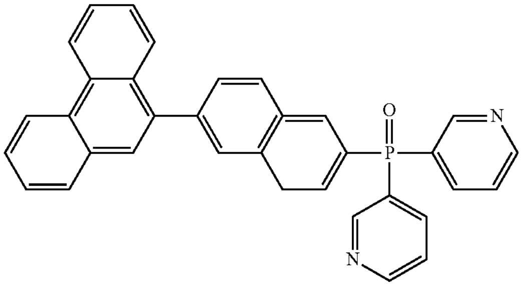
46
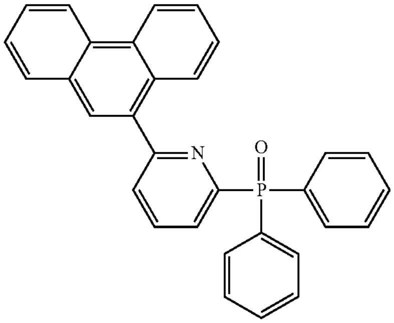
-continued
47
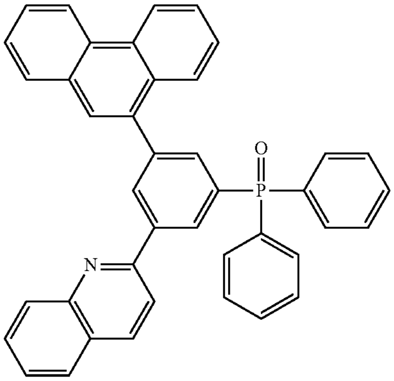
48
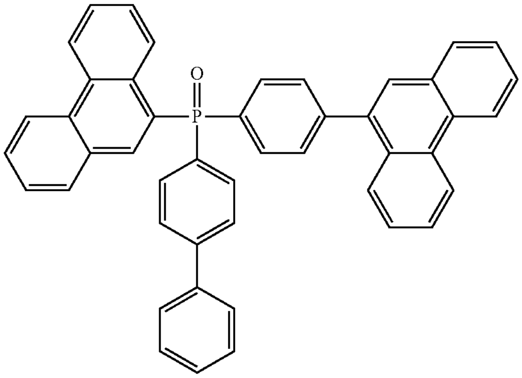
49
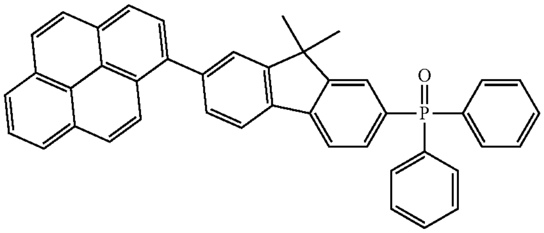
50
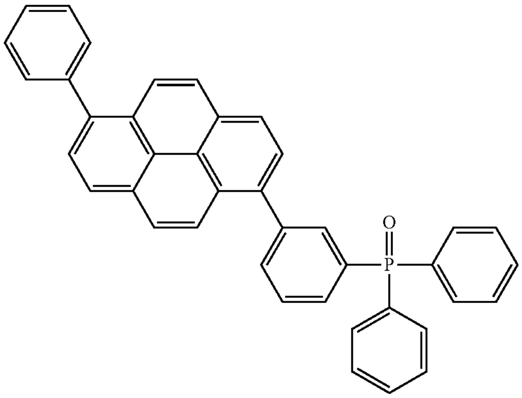

-continued
51
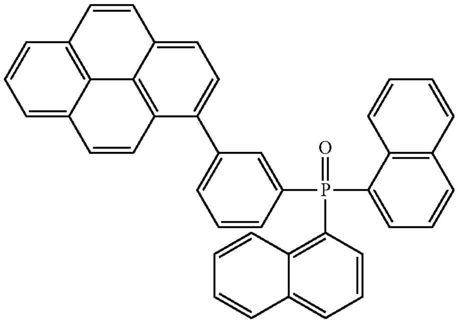
52
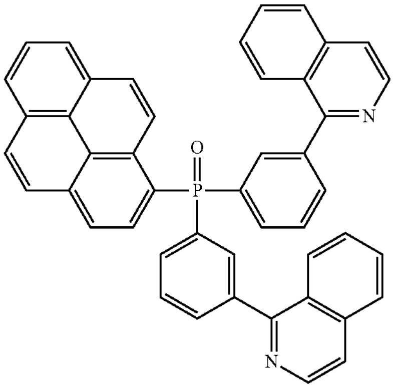
53
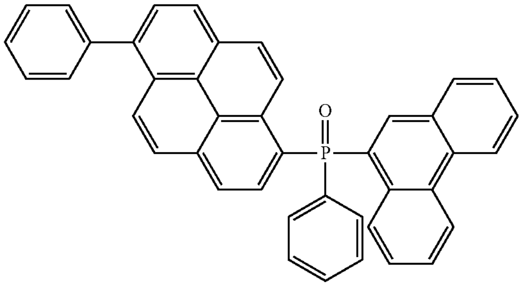
54
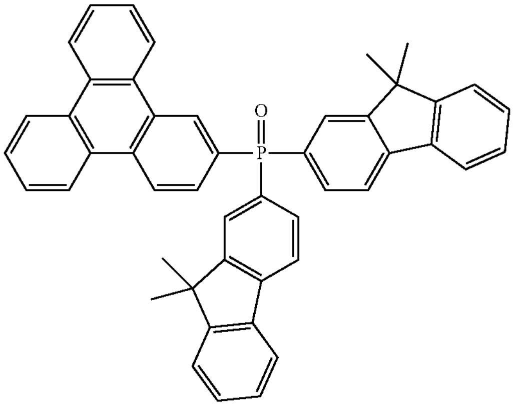
-continued
55
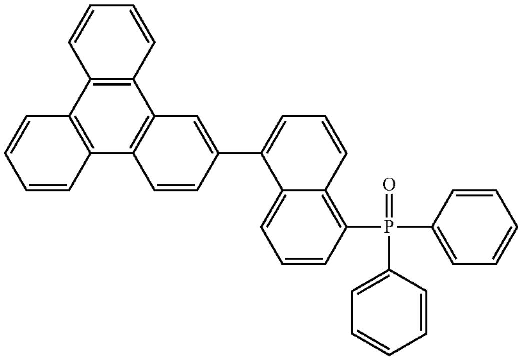
56
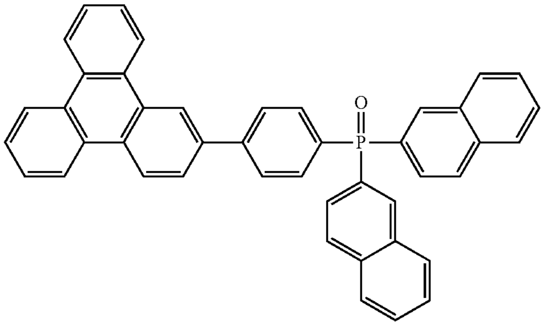
57
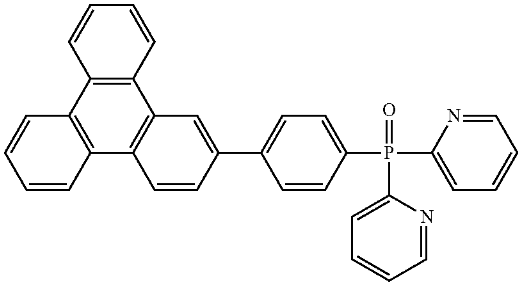
58
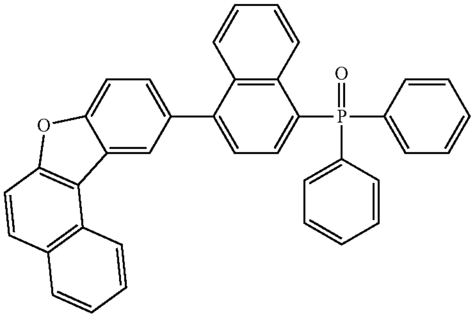
59
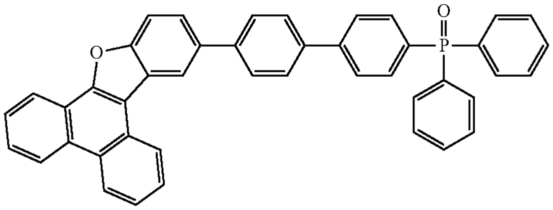

60
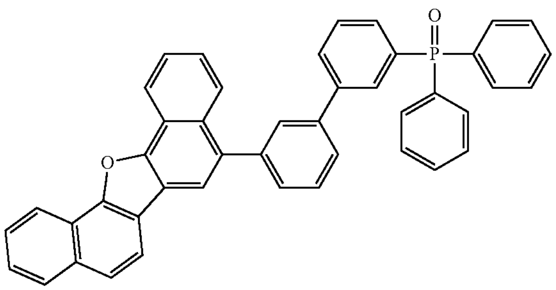
61
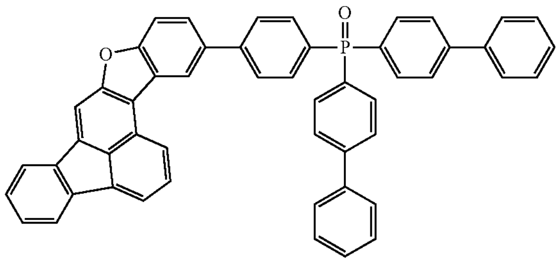
62
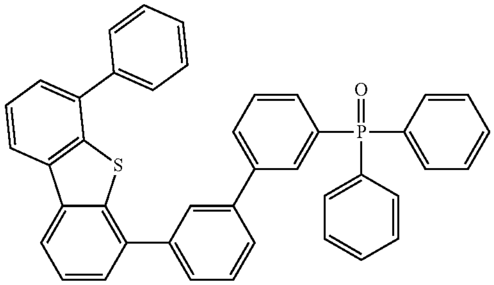
63
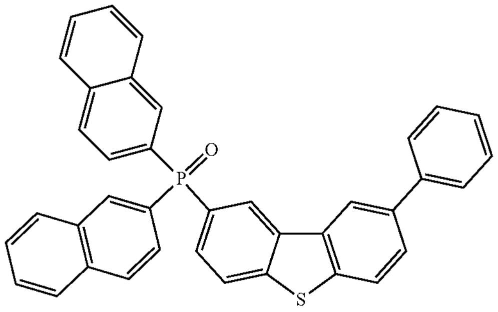
64
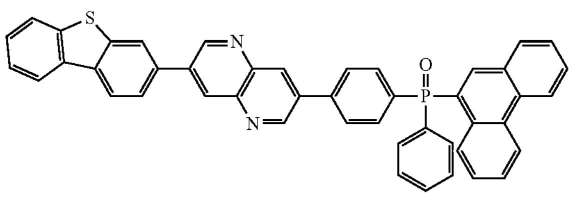
65
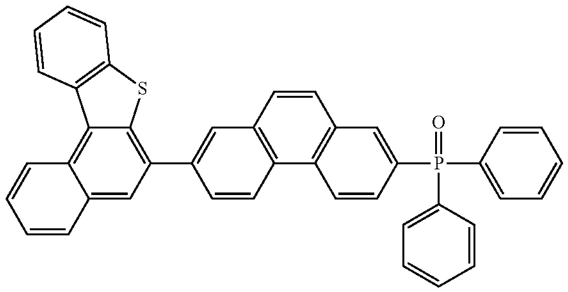
66
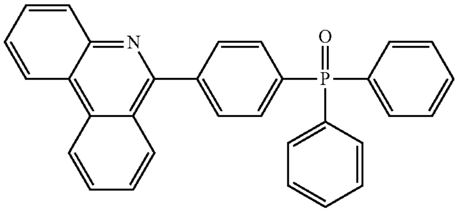
67
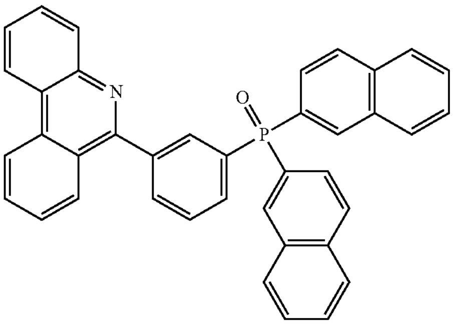
68
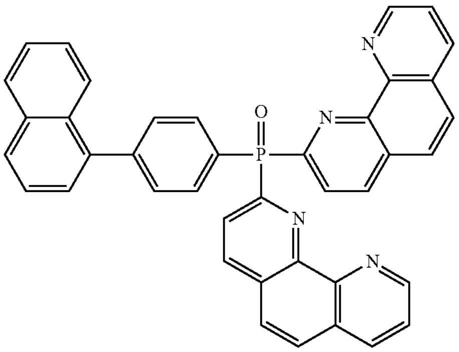
69
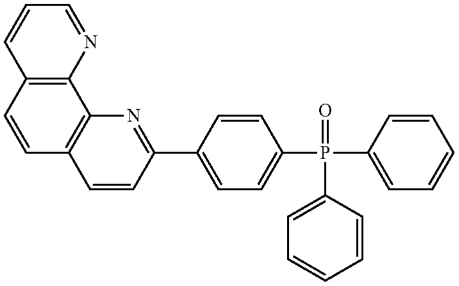

-continued
70
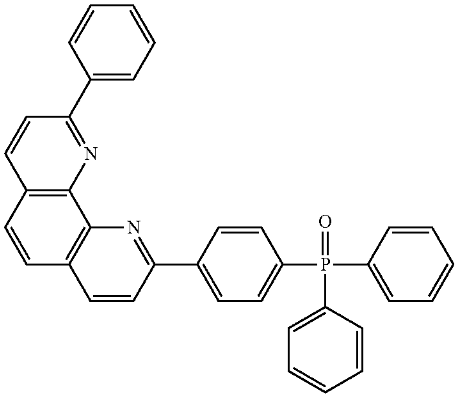
71
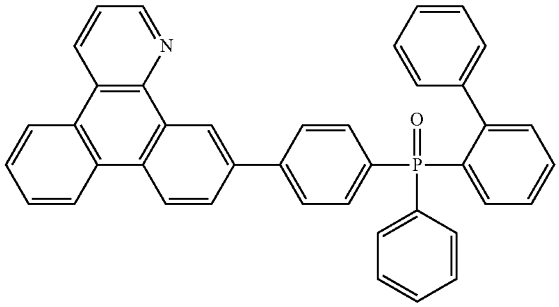
72
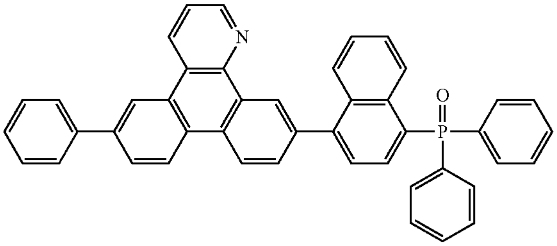
73
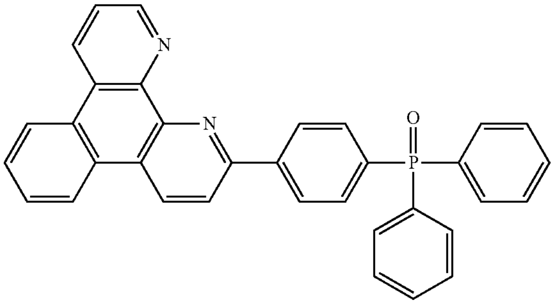
74
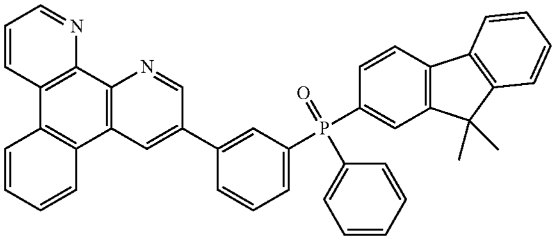
-continued
75
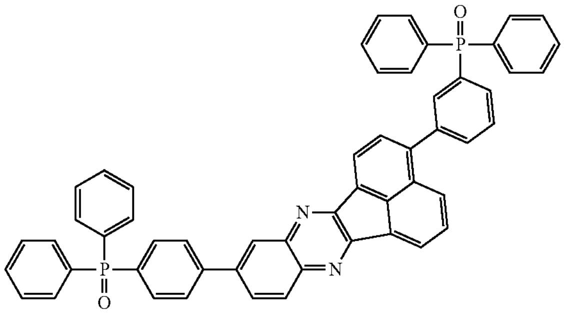
76
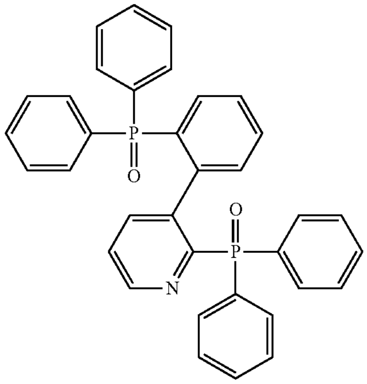
77
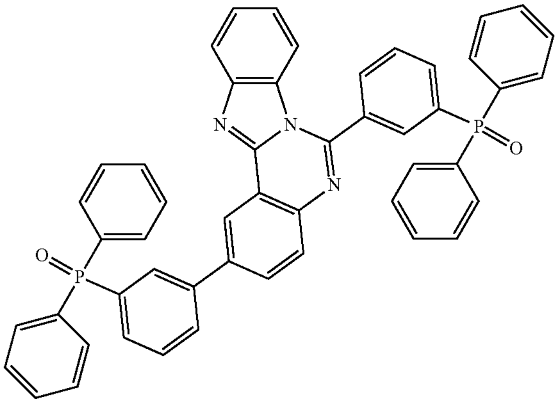
78
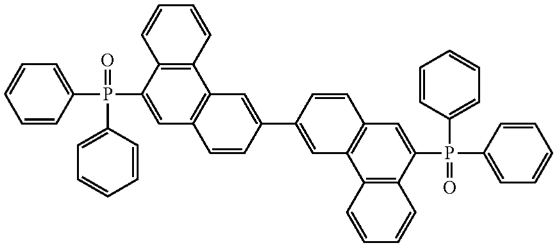

-continued
79
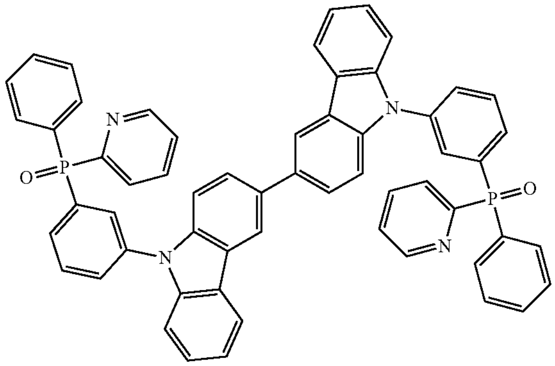
80
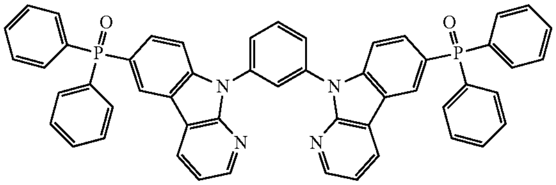
81
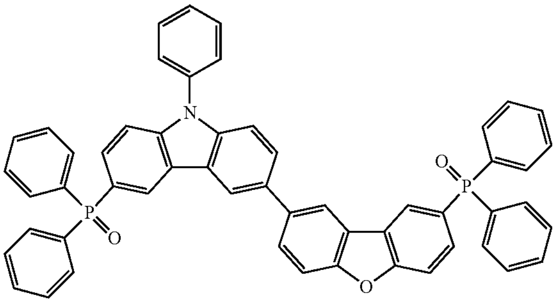
82
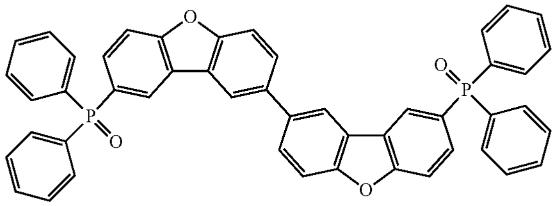
83
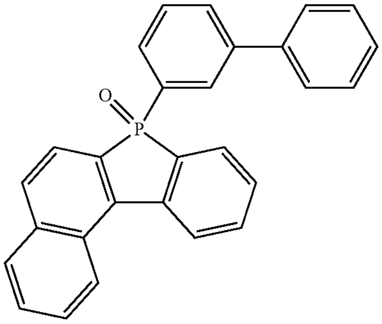
-continued
84
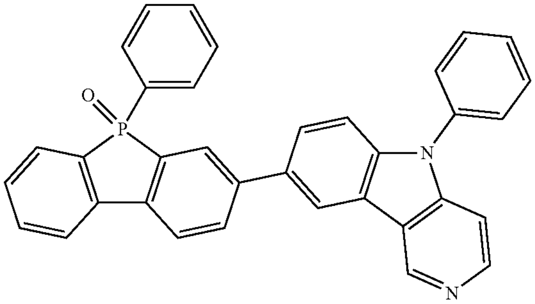
85
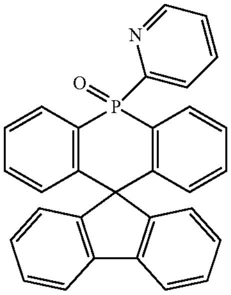
86
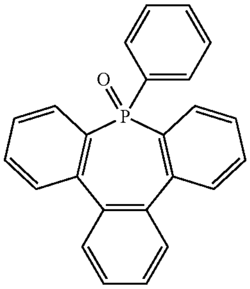
87
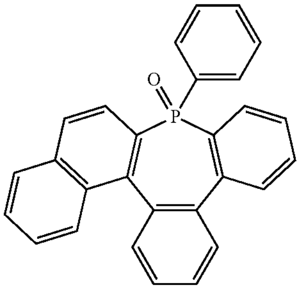
88
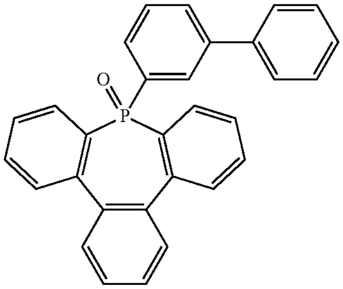

-continued
89
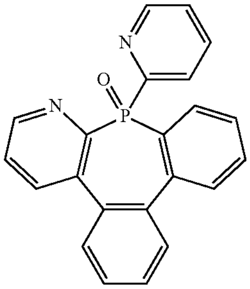
90
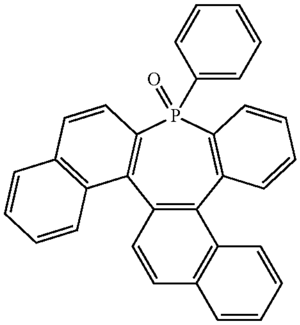
91
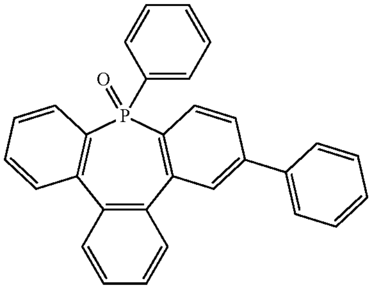
92
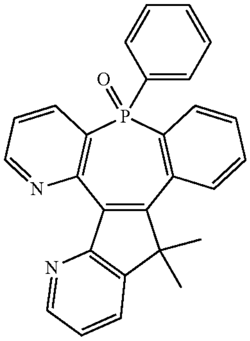
93
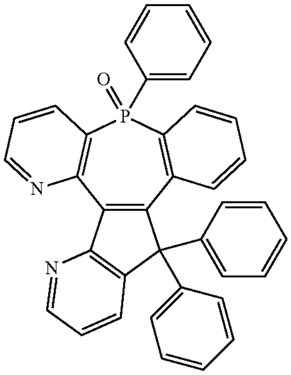
-continued
94
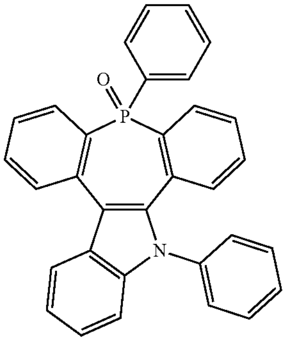
95
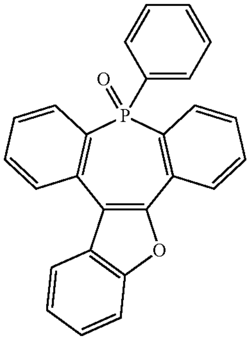
96
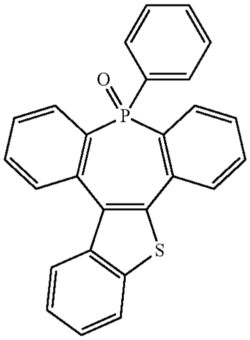
97
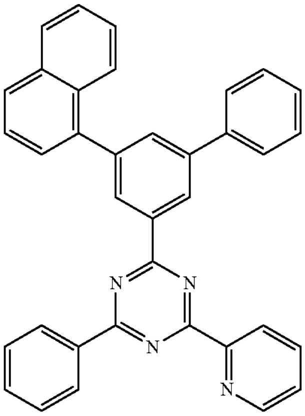
.
10. The light-emitting device of claim 1, wherein the metal dopant comprises Li, Yb, or a combination thereof.
11. The light-emitting device of claim 1, wherein
the second electrode further comprises magnesium (Mg), and
an amount of the magnesium is equal to or less than about 10 wt %.

12. The light-emitting device of claim 1, further comprising:

a first capping layer disposed outside the first electrode;

a second capping layer disposed outside the second electrode; or the first capping layer and the second capping layer.

13. A light-emitting device comprising:

a first electrode;

a second electrode facing the first electrode; and an interlayer disposed between the first electrode and the second electrode, wherein the interlayer comprises an emission layer and an electron transport region, the emission layer comprises a host and a dopant, the electron transport region is disposed between the emission layer and the second electrode and comprises a first electron transport layer and a second electron transport layer, the first electron transport layer comprises a first electron-transporting material, a lowest excitation triplet ($T_1$) energy level of the first electron-transporting material is greater than a $T_1$ energy level of the dopant of the emission layer, the second electron transport layer comprises a second electron-transporting material and a metal dopant, an amount of the metal dopant in the second electron transport layer is equal to or less than about 5 wt %, an amount of silver (Ag) in the second electrode is equal to or greater than about 90 wt % the light-emitting device further comprises a first pixel, a second pixel, and a third pixel, the emission layer comprises a first emission layer of the first pixel, a second emission layer of the second pixel, and a third emission layer of the third pixel, the first emission layer comprises a first host and a first dopant, the second emission layer comprises a second host and a second dopant, the third emission layer comprises a third host and a third dopant, and the first dopant, the second dopant, and the third dopant satisfy at least one of Inequalities 2-1 to 2-3:

$$T_1(ET1)>T_1(D1) \quad \text{[Inequality 2-1]}$$

$$T_1(ET1)>T_1(D2) \quad \text{[Inequality 2-2]}$$

$$T_1(ET1)>T_1(D3) \quad \text{[Inequality 2-3]}$$

wherein in Inequalities 2-1 to 2-3, $T_1$(ET1) is a $T_1$ energy level of the first electron-transporting material, $T_1$(D1) is a $T_1$ energy level of the first dopant, $T_1$(D2) is a $T_1$ energy level of the second dopant, and $T_1$(D3) is a $T_1$ energy level of the third dopant.

14. The light-emitting device of claim 13, wherein the first emission layer emits red light having a maximum emission wavelength in a range of about 580 nm to about 750 nm, the second emission layer emits green light having a maximum emission wavelength in a range of about 490 nm to about 580 nm, and the third emission layer emits blue light having a maximum emission wavelength in a range of about 410 nm to about 490 nm.

15. The light-emitting device of claim 13, wherein a thickness of the first emission layer, a thickness of the second emission layer, and a thickness of the third emission layer are different from one another.

16. The light-emitting device of claim 13, further comprising a hole transport region disposed between the first electrode and the emission layer, wherein the hole transport region comprises:

a first hole transport layer of the first pixel;

a second hole transport layer of the second pixel; and a third hole transport layer of the third pixel, and a thickness of the first hole transport layer, a thickness of the second hole transport layer, and a thickness of the third hole transport layer are different from one another.

17. An electronic apparatus comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to the source electrode or the drain electrode.

* * * * *